(12) United States Patent
Kumar et al.

(10) Patent No.: US 8,481,357 B2
(45) Date of Patent: Jul. 9, 2013

(54) THIN FILM SOLAR CELL WITH CERAMIC HANDLING LAYER

(75) Inventors: Ananda H. Kumar, Fremont, CA (US); Tirunelveli S. Ravi, San Jose, CA (US); Vidyut Gopal, Sunnyvale, CA (US)

(73) Assignee: Crystal Solar Incorporated, Santa Clara, CA (US)

( * ) Notice: Subject to any disclaimer, the term of this patent is extended or adjusted under 35 U.S.C. 154(b) by 330 days.

(21) Appl. No.: 12/766,765

(22) Filed: Apr. 23, 2010

(65) Prior Publication Data

US 2011/0186117 A1    Aug. 4, 2011

Related U.S. Application Data

(63) Continuation-in-part of application No. 12/399,248, filed on Mar. 6, 2009, now Pat. No. 8,030,119.

(60) Provisional application No. 61/068,629, filed on Mar. 8, 2008.

(51) Int. Cl.
*H01L 21/00* (2006.01)

(52) U.S. Cl.
USPC ........ 438/73; 438/74; 438/464; 257/E21.092; 136/244; 136/256

(58) Field of Classification Search
USPC .......... 438/57, 73, 74, 458, 464; 257/E1.013, 257/E21.091, E21.601, E31.013, E21.09, 257/E21.056; 136/244, 256
See application file for complete search history.

(56) References Cited

U.S. PATENT DOCUMENTS

| | | | |
|---|---|---|---|
| 3,653,970 A | 4/1972 | Iles | |
| 4,301,324 A | 11/1981 | Kumar et al. | |

(Continued)

FOREIGN PATENT DOCUMENTS

| | | |
|---|---|---|
| JP | 62-224089 A | 10/1987 |
| JP | 06-310740 A | 11/1994 |

(Continued)

OTHER PUBLICATIONS

Riepe, S., et al.; "Silicon Material Technology and Evaluation Center (SIMTEC) at Fraunhoffer ISE—Achievements and Visions," presented at the 23$^{rd}$ European Photovoltaic Solar Energy Conference and Exhibition, Sep. 1-5, 2008, Valencia, Spain; 6 pages.

(Continued)

*Primary Examiner* — Tuan N. Quach
(74) *Attorney, Agent, or Firm* — David H. Jaffer; Pillsbury Winthrop Shaw Pittman LLP

(57) ABSTRACT

A method for fabricating a photovoltaic (PV) cell panel wherein all PV cells are formed simultaneously on a two-dimensional array of monocrystalline silicon mother wafers affixed to a susceptor is disclosed. Porous silicon separation layers are anodized in the surfaces of the mother wafers. The porous film is then smoothed to form a suitable surface for epitaxial film growth. An epitaxial reactor is used to grow n- and p-type films forming the PV cell structures. A glass/ceramic handling layer is then formed on the PV cell structures. The PV cell structures with handling layers are then exfoliated from the mother wafer. The array of mother wafers may be reused multiple times, thereby reducing materials costs for the completed solar panels. The glass/ceramic handling layers provide structural integrity to the thin epitaxial solar cells during the separation process and subsequent handling.

57 Claims, 30 Drawing Sheets

U.S. PATENT DOCUMENTS

| | | | |
|---|---|---|---|
| 4,445,965 A | | 5/1984 | Milnes |
| 4,816,420 A | | 3/1989 | Bozler et al. |
| 4,832,755 A | * | 5/1989 | Barton et al. ............... 136/251 |
| 4,927,770 A | | 5/1990 | Swanson |
| 5,053,083 A | | 10/1991 | Sinton |
| 5,262,595 A | | 11/1993 | Yano et al. |
| 5,811,348 A | | 9/1998 | Matsushita et al. |
| 5,834,840 A | | 11/1998 | Robbins et al. |
| 6,190,937 B1 | | 2/2001 | Nakagawa et al. |
| 6,258,666 B1 | | 7/2001 | Mizutani et al. |
| 6,262,595 B1 | * | 7/2001 | Huang et al. .................. 326/41 |
| 6,331,208 B1 | | 12/2001 | Nishida et al. |
| 6,452,091 B1 | | 9/2002 | Nakagawa et al. |
| 6,559,479 B1 | | 5/2003 | Ludemann |
| 6,802,926 B2 | | 10/2004 | Mizutani et al. |
| 7,070,420 B1 | * | 7/2006 | Wakefield et al. ............. 439/66 |
| 7,093,463 B1 | * | 8/2006 | Wolf et al. ..................... 65/21.2 |
| 7,339,110 B1 | | 3/2008 | Mulligan et al. |
| 2003/0057525 A1 | * | 3/2003 | Fock et al. .................... 257/629 |
| 2003/0117605 A1 | * | 6/2003 | Wu ................................. 355/67 |
| 2004/0112426 A1 | | 6/2004 | Hagino |
| 2005/0121068 A1 | | 6/2005 | Sager et al. |
| 2005/0130823 A1 | * | 6/2005 | Budd ............................... 501/5 |
| 2005/0205930 A1 | * | 9/2005 | Williams ...................... 257/347 |
| 2005/0266252 A1 | * | 12/2005 | Rita .............................. 428/432 |
| 2006/0043399 A1 | * | 3/2006 | Miyagaki et al. ............... 257/98 |
| 2006/0185582 A1 | * | 8/2006 | Atwater et al. ................ 117/89 |
| 2006/0196535 A1 | | 9/2006 | Swanson et al. |
| 2006/0255341 A1 | * | 11/2006 | Pinnington et al. ............. 257/79 |
| 2007/0062575 A1 | * | 3/2007 | Inomata ........................ 136/256 |
| 2007/0077363 A1 | | 4/2007 | Kitamura et al. |
| 2007/0199591 A1 | | 8/2007 | Harder et al. |
| 2008/0057678 A1 | | 3/2008 | Gadkaree et al. |
| 2008/0160661 A1 | | 7/2008 | Henley |
| 2008/0173347 A1 | | 7/2008 | Korevaar et al. |
| 2008/0179547 A1 | | 7/2008 | Henley |
| 2008/0264477 A1 | | 10/2008 | Moslehi |
| 2008/0314439 A1 | * | 12/2008 | Misra ........................... 136/249 |
| 2008/0315440 A1 | | 12/2008 | Dekker et al. |
| 2009/0217976 A1 | | 9/2009 | Cart et al. |
| 2009/0227063 A1 | | 9/2009 | Ravi et al. |
| 2009/0308449 A1 | | 12/2009 | Kim et al. |
| 2010/0089449 A1 | | 4/2010 | Ahn et al. |
| 2010/0178766 A1 | | 7/2010 | Andry et al. |

FOREIGN PATENT DOCUMENTS

| | | |
|---|---|---|
| JP | 07-302889 | 11/1995 |
| JP | 08-213645 | 8/1996 |
| JP | 08-330611 A | 12/1996 |
| JP | 10-261810 A | 9/1998 |
| JP | 2001-158680 A | 6/2004 |
| JP | 2004-335867 A | 11/2004 |
| JP | 2005-038964 A | 2/2005 |
| KR | 10-2002-0073816 A | 9/2002 |
| WO | WO2007-120197 A2 | 10/2007 |
| WO | WO2009-071561 A2 | 6/2009 |

OTHER PUBLICATIONS

Reber, S., et al., "Progress in High-Temperature Silicon Epitaxy Using the RTCVD160 Processor," 19$^{th}$ European Photovoltaic Solar Energy Conference, Jun. 7-11, 2004, Paris, France; pp. 471-474.

Hurrle, A., "High-Throughput Continuous CVD Reactor for Silicon Deposition," 19$^{th}$ European Photovoltaic Solar Energy Conference, Jun. 7-11, 2004, Paris, France; pp. 459-462.

Brendel, et al, "Crystalline Thin-Film Silicon Solar Cells from Layer-Transfer Processes: A Review," Proc. 10$^{th}$ Workshop on Crystalline Silicon Solar Cell Materials and processes, Aug. 13-16, 2000, Copper Mountain, USA, ed. by B.L. Sopori, (NREL, Golden, 2000), pp. 117-125.

Weber, K.J. et al., Silicon as a Photovoltaic Material, Materials Forum, vol. 27 (2004) pp. 9-14.

Unagami, T., "Formation Mechanism of Porous Silicon Layer by Anodization in HF Solution," J. Electrochem. Soc.: Solid-State Science and Technology, vol. 127, Issue 2, Feb. 1980; pp. 476-483.

Brendel, Rolf, et al.; "15.4%-effiencient and 25 µm-thin crystalline Si solar cell from layer transfer using porous silicon," Phys. Stat. Sol. (a) 197, No. 2, (2003); pp. 497-501.

Green, M.A., "Crystalline Solar Cells," Chapter 4 (pp. 139-187) of Clean Electricity from Photovoltaics Series on Photoconversion of Solar Energy—vol. 1 (2001) Imperial College Press, Eds. Mary D. Archer & Robert Hill, Available on-line at http://www.worldscibooks.com/etextbook/p139/p139_chap4.pdf.

Brendel, R., et al., EMRS 2007 Strasbourg, Conference presentation D-9-1. Available on-line at http://www.isfh.de/institut_solarforschung/files/thin_film_si_wafer_cell.pdf.

Gazuz, V., et al.; "Thin 60 µm-Thick Crystalline Silicon Solar Cell on Ceramic Substrate by Al-Bonding," Bavarian Center for Applied Energy Research (ZAE Bayern), Am Weichselgarten 7, D-91058 Erlangen, Germany, IEEE 2006, pp. 976-979.

Snoeckx, K., et al.; "The Potential of Thin-film Crystalline Silicon Solar Cells," Semiconductor International, Jun. 1, 2007, available at HighBeam Research at http://www.highbeam.com.

Kumar, A.H., et al.; "State-of-the-Art, Glass-Ceramic/Copper, Multilayer Substrate for High Performance Computers," The International Journal for Hybrid Microelectronics, vol. 14, No. 4, Dec. 1991, pp. 137-150.

Park, K.H., et al.; "The correlation between the crystalline phases and optical reflectance in glass-ceramics for IR reflector," Journal of Ceramic Processing Research, vol. 3, No. 3, pp. 153-158 (2002).

Ford D.H., et al.; "High Current, Thin Silicon-on-Ceramic Solar Cell," IEEE Transactions on Electron Devices, vol. 46, No. 10, Oct. 1999, 3 pages.

International Search Report and Written Opinion issued for PCT/US2010/048058 on Oct. 22, 2010.

International Search Report and Written Opinion issued for PCT/US2011/33792 issued Oct. 6, 2011.

Kraiem, J., et al., "ELIT Process: Epitaxial Layers for Interdigitated Back Contacts Solar Cells Transferred, Photovoltaic Energy Conversion," Conference Record of the 2006 IEEE 4$^{th}$ World Conference, (2006), pp. 1126-1129.

Beaucarne, G., et al. "Thin, Thinner, Thinnest: An Evolutionary Vision of Crystalline SI Technology," presented at the 21$^{st}$ European Photovoltaic Solar Energy Conference, Dresden (2006).

Kershaver et al., "Back-contact Solar Cells: A Review," Progress in Photovoltaics: Research and Applications; 2006, vol. 14, pp. 107-123.

Smith, David D., et al., "Review of Back Contact Silicon Solar Cells for Low Cost Application," presented at the 16$^{th}$ European Photovoltaic Solar Energy Conference, Glasgow, United Kingdom, May 2000; 4 pages.

* cited by examiner

FIG. 19 SECTION B-B

THIN FILM SOLAR CELL WITH CERAMIC HANDLING LAYER

CROSS-REFERENCE TO RELATED APPLICATIONS

This application is a continuation-in-part of U.S. patent application Ser. No. 12/399,248 filed Mar. 6, 2009, U.S. Pat. No. 8,030,119, which claims the benefit of U.S. Provisional Patent Application Ser. No. 61/068,629, filed Mar. 8, 2008. The foregoing disclosures are incorporated herein by reference.

FIELD OF THE INVENTION

This invention relates generally to solar cells, and more particularly to solar cells with ceramic handling layers, and methods and systems for fabricating said solar cells with ceramic handling layers.

BACKGROUND OF THE INVENTION

Silicon is the basic ingredient of many solar cell technologies ranging from thin film amorphous silicon solar cells to single-crystal silicon wafer-based solar cells. High efficiency solar cells start with electronic grade polysilicon grown by chemical vapor deposition. The polysilicon is melted and ingots are pulled from the melt in the Czochralski process and often zone refined to produce silicon ingots or ribbons of different degrees of crystal perfection. The silicon ingot is then sliced into thin wafers by sawing or laser cutting, and solar cells are formed on the wafers by traditional semiconductor techniques and interconnected and packaged to last at least 25 years. Such silicon wafers are relatively expensive and thus severely impact the costs of solar cells in formed and packaged in the standard wafers.

Throughout the past quarter century, there have been significant innovations in all aspects of solar cell manufacture and accompanying reduction in cost. For example, from 1990 to 2006, wafers have decreased in thickness from 400 μm to 200 μm. The cost of crystalline silicon still constitutes a significant part of the overall cost, as measured by many of the metrics used to characterize the cost of crystalline solar technology.

A flow chart of a conventional process for manufacturing solar panels is illustrated in FIG. 1. In step 102, stock single-crystal silicon wafers are used as substrates which are cut into shapes that are approximately square, often with rounded corners due to the size and shape of the original wafer (200 mm diameter typically). In step 104, a photovoltaic (PV) cell structure, which is basically a diode, is fabricated on the top surface of the wafers. The fabrication process uses epitaxial or diffusion furnace methods to form the required thin silicon layers doped n-type and p-type and sometimes intrinsic (i-type). The PV cells are then assembled into an X-Y array on a substrate 106 and contacts to the n-type and p-type layers are added, often by soldering tinned copper ribbons to bus bars grown on the PV wafers. It has been difficult or impossible to attain very thin solar cells using the prior art process in which individual PC cells are formed prior to assembly into the final X-Y array needed for a completed solar panel.

The best expectation for further reductions in silicon thickness, and thereby the cost of monocrystalline silicon solar cells, is offered by techniques in which a crystal monocrystalline silicon substrate, often referred to as the base, source or mother wafer, is first treated to form a separation layer, a thin epitaxial silicon layer is then deposited on the treated surface, and finally the deposited epitaxial layer is separated from the source substrate to be used as thin (2-100 μm) single crystal silicon solar cells. The silicon substrate is thereafter sequentially re-used to form several additional such epitaxial layers, each producing its own solar cell. There are several known standard techniques for growing the separation layer, such as forming a composite porous silicon layer by anodically etching a discontinuous oxide masking layer, or by high energy implantation of oxygen or hydrogen to form the separation layer within mother wafer.

The epitaxial silicon layer that is formed has to be separated intact from the mother wafer with little damage in order to thereafter fabricate the eventual solar cell module. The separation may be preceded by formation of the p-n junctions and of part or all of the interconnections while the epitaxial layer is still attached to the mother wafer. We believe that this separation process is preferably done by "peeling" in the case where the separation layer is highly porous silicon. Peeling implies parting of an interface starting from one edge and continuing until complete separation occurs.

One basic process in the prior art for manufacturing epitaxial single crystal silicon solar modules includes the following steps: (1) forming a separation layer on a relatively thick, single crystal silicon substrate; (2) growing a single crystal epitaxial layer; 3) separating the epitaxial layer and fabricating the solar cells on the epitaxial layer and the basic cell interconnections on the solar cells; and (4) assembling and packaging several such cells to form a solar panel. Despite the great potential of this prior art method for producing relatively inexpensive, highly efficient solar cells, the method has eluded commercial success for at least three main reasons: (1) some of the unit processes are deficient and difficult to reproduce especially for thin epitaxial wafers; (2) manufacturing strategy generally starts and ends with making individual wafer-size solar cells and, thereafter, assembling them into solar panels; and (3) thin cells break easily, and their economical processing awaits the development of new tools and equipment.

SUMMARY OF THE INVENTION

The present invention turns the prior art strategy on its head, starting with the solar panel and rethinking the unit manufacturing steps in panel size, starting from the surface treatment of the source wafers through to module encapsulation, completely eliminating the need for handling individual thin epitaxial silicon cells. According to one aspect of the invention, the manufacturing sequence is reversed from the conventional prior art sequence. In this aspect of the invention, multiple source wafer tiles are bonded to a support prior to the formation of individual cells, thereby enabling the use of large-scale processing for solar cell fabrication, instead of the wafer-by-wafer approach previously used. This rethinking involves key innovations that make these unit processes robust and reliable. This approach has been enabled by some key innovations described in this invention. This essentially fulfills the vision for the 2020 module, where "Cell and module manufacturing is based on process steps applied to whole panels instead of individual cells" articulated by G. Beaucarne et al. at the 21$^{st}$ European PVEC Conference in 2006. More importantly, panel size semiconductor processing enables a significant reduction in the cost of solar energy production.

One aspect of the invention includes mounting multiple wafers on a support plate, often called a susceptor, and processing the wafers in common. Examples of the processing include forming a separation layer, depositing silicon to form the solar cell structure, forming contacts, and separating the solar cells as a unit from the wafers.

Another aspect of the invention includes forming a separation layer in the multiple wafers by anodizing preferably monocrystalline wafers to form a porous silicon layer. Although the anodization may be done on an assembled array of solar cell tiles, it may also be done on individual wafers.

The support plate for anodization may be generally planar or may have windows formed there through for exposing the back side of the wafers supported on the ribs surrounding the windows. Thereby, liquid electrolyte may be used as a back-side contact.

The anodization may be performed in a serial arrangement of multiple wafer supports removably disposed and arranged between the anode and cathode in tank containing electrolytic etching solution. The supports are sealed to the tank walls.

The anodization forms a porous silicon layer. If desired, the porosity may be graded by varying the anodization conditions during the anodization.

The porous silicon layer may be smoothed to provide a better epitaxial base, for example, by a high temperature anneal in hydrogen, for example, a temperature of at least 1000 C.

Silicon layers, preferably epitaxial, may be deposited by chemical vapor deposition on the porous silicon layer. Dopant precursors may be included in the deposition to produce a layered semiconductor structure including p-n junctions. The epitaxial deposition may be performed in a radiantly heated reactor with wafers mounted inside of a sleeve formed on two sides by wafer supports each mounting an array of solar cells.

Contacts may be fully or partially added to the silicon structures still attached to the wafer supports. Additional layers may be applied to facilitate further processing.

The fully or partially processed solar cells may be delaminated from the mother wafers across the separation (porous) layer by a progressive peeling action including clamps and a linear array of vertical actuators associated with the clamps. Examples of the clamps are segmented electrostatic clamps or a segmented vacuum clamp.

According to further aspects of the invention, a method of fabricating a solar cell comprises: forming a stack of thin continuous epitaxial solar cell layers on a silicon wafer; forming a handling layer on the stack, wherein the handling layer includes electrical contacts to the stack; and separating the stack from the silicon wafer, wherein the stack remains attached to the handling layer. The handling layer may be a glass/ceramic material, such as a glass, glass-bonded ceramic or glass-ceramic, with a CTE which is greater than or equal to the CTE of the stack over the temperature range from ambient temperatures to processing temperatures experienced during formation of the handling layer. Further, before forming the handling layer on the stack a boundary layer may be formed on the stack—the boundary layer being silicon oxide, silicon nitride or alumina, which may act as diffusion barriers and/or passivation layers.

According to yet further aspects of the invention a solar cell comprises: a stack of thin single crystal solar cell layers; a handling layer; and a boundary layer between the stack and the handling layer, the boundary layer being attached to both the stack and the handling layer, the boundary layer being greater than 10 nanometers thick and parallel to the layers in the stack. The handling layer may be waffle-shaped with an array of either square or circular apertures.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION

Figure 1:
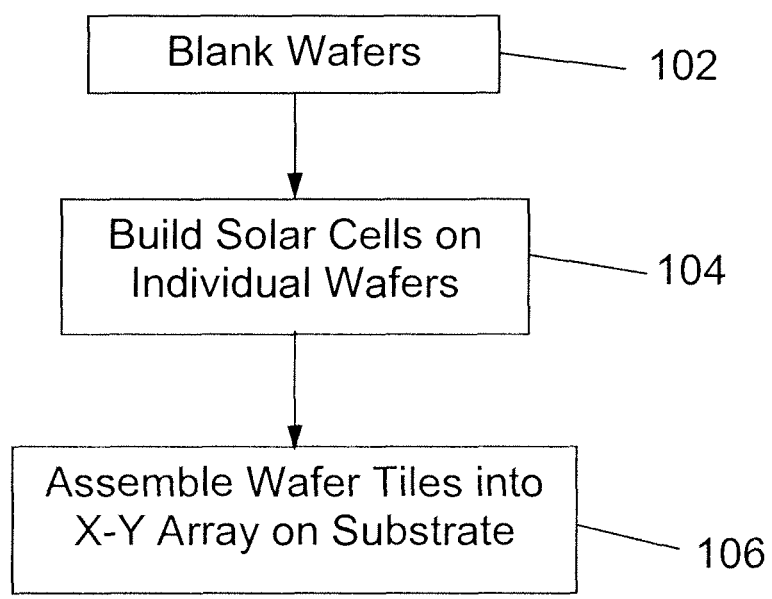
FIG. 1 is a flow chart of a prior art manufacturing process for solar panels.

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

Solar Panel

In one aspect of the invention, the solar panel includes an array of thin single crystal silicon solar cells, wherein the thin single crystal wafers are epitaxially grown and processed together as an array on a 'template'. In the array, multiple relatively thick single crystal silicon base or mother wafers are either handled singly or attached to a suitable carrier substrate or susceptor. The assembly of susceptor and array of mother wafers will be called an 'array template'. After completion of the cell fabrication steps, the entire solar cell array is permanently adhered to a suitable support sheet with an appropriate adhesive and separated as one unit from the array template. The array template may then be reused to fabricate another solar cell array. The array template of this invention may consist of a closely tiled array of circular, rectangular or square, single crystal silicon wafers formed on one of the following three types of substrates: (1) a wafer tile cut from a conventional thin silicon wafers; (2) a wafer tile cut from a thick, zone-refined, single-crystal silicon block; and (3) a wafer tile cut from a composite structure comprising the following two blocks laminated together of (a) a thick, zone-refined, single-crystal silicon block, and (b) a thick, non-device-quality, silicon block.

The assembly onto a support substrate of multiple rectangular or square epitaxial wafer tiles, hereinafter simply referred to as 'source wafer tiles', unlike the usual circular wafers, allows for the densest packing of cells in the panel. The machining loss of high quality silicon has no major impact on the overall cost of silicon, while the close-packed array pays great dividends because of the gain in cell density on the panel. As described below, independent of the thickness of the wafer tile, the preferred thickness for the final solar cell is in the preferred range of 10-50 µm, separated from the upper surface of the wafer tiles in the closely tiled array, as described in section below regarding separation.

Array Template

This section describes the formation of an array template, which is the first step in the large-substrate manufacturing process outlined above. Since the substrate of the template supports the wafers during epitaxial deposition, it also serves as the susceptor for the epitaxial growth process.

Figure 2:
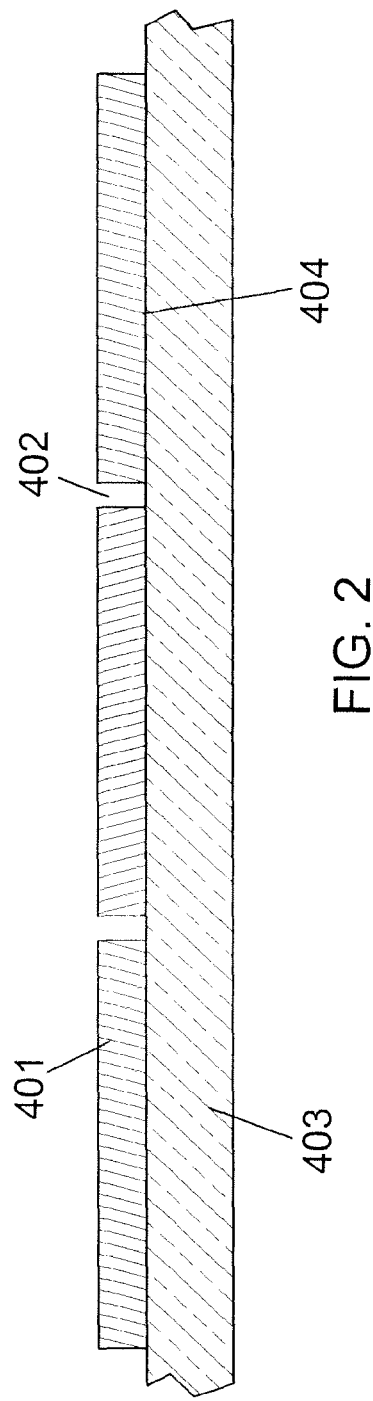
FIG. 2 is a schematic side cross-sectional view of mother wafers attached to a susceptor without windows.

FIG. 2 is a schematic side cross-sectional view of wafers 401 attached to a susceptor 403, which in this embodiment may be a flat sheet or generally planar plate without windows. For effective subsequent processing steps, it is important to minimize the width of gaps 402 between the wafer tiles 401. Typically, the wafers 401 are silicon and are doped to be conductive for reasons described below. The wafers 401 should be monocrystalline to allow the subsequent epitaxial growth of generally monocrystalline silicon. Excessively large gaps 402 may result in undesirable particle generation during subsequent processing steps. The lower surfaces of the wafer tiles 401 are bonded to a support substrate 403 to ensure that the upper surfaces of the wafer tiles are approximately co-planar. The co-planarity involves two requirements: (1) the thicknesses of wafer tiles 401 must be uniform, and (2) the thicknesses of a bond layer 504 in FIG. 4 between the back surfaces of the wafer tiles 401 and the top surface of the susceptor 403 must be uniform. The desire for co-planarity arises from the desire to reduce or eliminate deposition on the exposed edges of the wafer tiles at the gaps 402.

Figure 3:
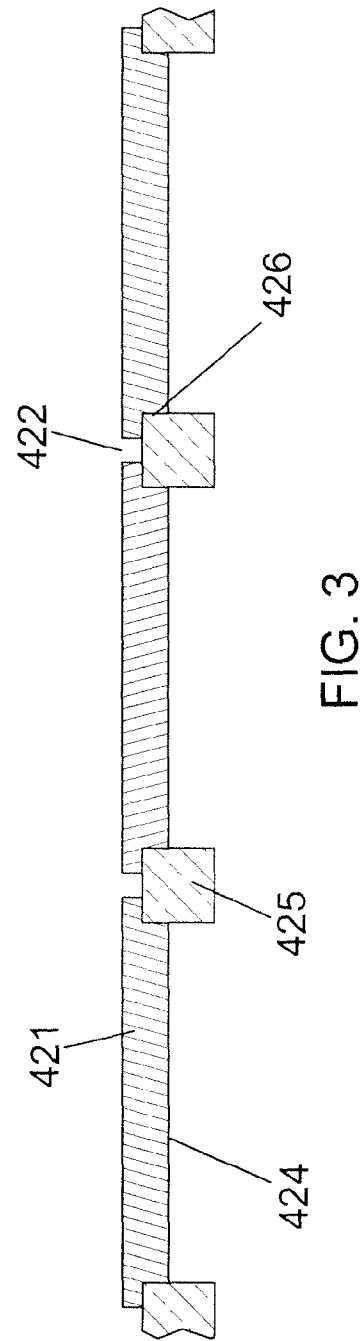
FIG. 3 is a schematic side cross-sectional view of mother wafers attached to a susceptor with windows.

To optimize the anodic etching process used to form the porous silicon layer (see FIGS. 5-7), it may be desirable to provide good electrical contact not only between the electrolytic etching solution and the front sides of the wafers but also between the etching solution or other electrolytic liquid and the backsides of the wafer tiles being etched. Thus, FIG. 3 shows a schematic side cross-sectional view of wafers 421 attached to a susceptor 425 with windows 424 between ribs 426 of the susceptor 425 providing good backside contact to the etching solution in addition to separate frontside contact to the etching solution. The same considerations with respect to the gaps 402 in FIG. 2 apply to gaps 422 in FIG. 3. In this embodiment, the backsides 424 of the wafers 421 are open to the etchant solution through the windows 424, which are of the same general shape and only slightly smaller the tiles 421. That is, the ribs 426 form a rectangular grid and the ribs 426 support and are sealed to the peripheries of the wafers 421.

Figure 4:
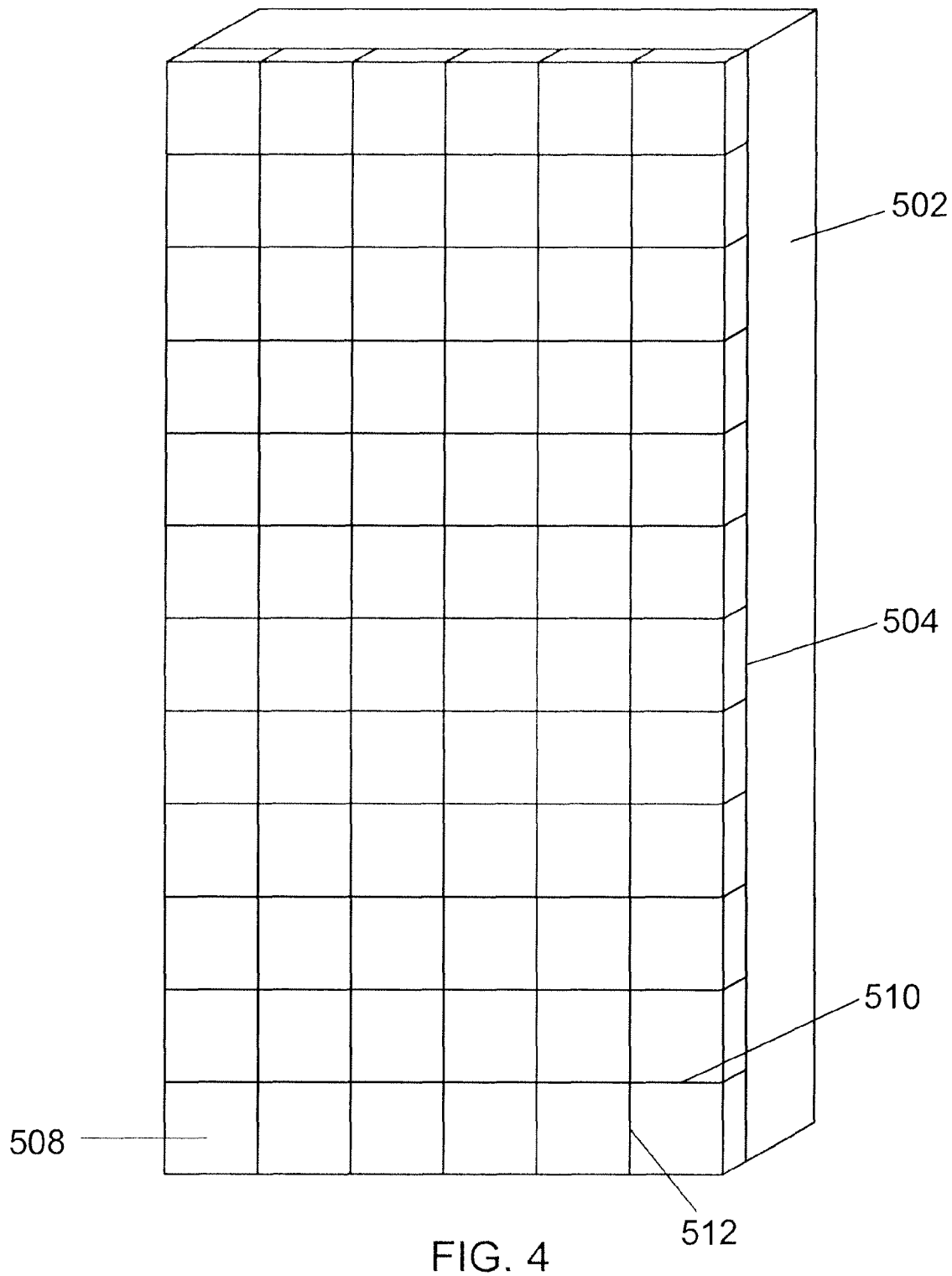
FIG. 4 is a schematic isometric view of wafers attached to a susceptor.

FIG. 4 is a schematic isometric view of wafers 508 attached in a two-dimensional array to a susceptor 502, more generally called a support. The horizontally extending gaps 510 and vertically extending gaps 512 between the wafers 508 should be minimized due to the considerations discussed above with reference to FIGS. 2 and 3. A large number (in the illustrated example, 12×6=72) of wafer tiles 608 are shown attached to the substrate 502.

The susceptor 502 must be fabricated from a material which is compatible with device processing conditions such as chemical vapor deposition, plasma etching, contact formation, and such. Appropriate materials for the susceptor 502 may be ceramic or metal. Examples of ceramics or otherwise robust materials are alumina, aluminum nitride, silicon carbide, silicon-impregnated silicon carbide, silicon, silicon nitride, boron nitride, boron carbide, etc. A planar susceptor needs to be electrically conductive to the anodizing current while a windowed susceptor, though preferably conductive, may be insulating. The wafer tiles 508 can be held to the surface 504 of the susceptor 502 by mechanical clamps, by machined dove tail joints, by gravity, or simply by a bond to the support by field assisted bonding well known in the art. The bonding is needed only once for an array template used in forming a large number of solar cell arrays. Such large area device fabrication is routinely done for large displays, and even for thin film solar panels.

Porous Silicon Layer Process

The next steps in the described process for manufacturing solar panels involve the formation of a porous silicon separation layer. The purpose of this layer is to enable the reuse of the silicon wafer tiles in the tiled array created in FIG. 4 as described above. This reuse is possible because the porous silicon release layer does not use up more than roughly 7 microns of the wafer thickness. Since the thickness of the mother wafer tiles is typically at least hundreds of microns (even for thin silicon wafers) and can be up to 10 mm or greater (for thick silicon blocks or laminated silicon wafers or blocks), it is possible to fabricate a substantial number of solar cell arrays from a single array of wafer tiles. In order to use only a thin slice of the full wafer tile thickness, it is necessary to build the solar cells on top of a porous silicon separation layer. K. V. Ravi in co-pending U.S. patent application Ser. Nos. 12/290,582 and 12/290,588, both filed Oct. 31, 2008, incorporated herein by reference, describes the fabrication processes for backside contact PV cells, and frontside/backside contact PV cells, respectively, and are incorporated by reference herein. The described processes involve the formation of a porous surface layer in the mother wafers and growth of an epitaxial layer over the porous layer, and at least partial development of the solar cell in the epitaxial layer while still attached to the array template. After the array of solar cells has been at least partially fabricated in the epitaxial layer, the tile array can be separated from the bulk silicon material of the source wafer tile array, leaving most of the bulk material remaining in the mother wafers to be used in the formation of additional arrays of solar cells. For subsequent uses of the source wafer tile array to form second, third, fourth, etc., solar cell arrays, the surface of the mother wafers would be the typically rough lower surface of the cleaved porous silicon layer formed in FIGS. 5-7, below.

We have discovered that a lapped surface on the silicon source wafer is especially suited for ease of peeling of the epitaxial layer. Although we are not bound by the theory, we believe that the residual surface damage in the lapped surface pre-disposes the porous layer formed thereon to be easily detached. Lapping produces a surface roughness intermediate that produced by grinding and polishing. Lapping involves rotating a planar surface of a disk, often metal and perhaps textured or grooved, against the surface with typically a lapping powder being disposed between the disk and the surface. It typically produces an RMS (root mean square) surface roughness of 50 to 100 nm. Grinding involves rotating the circular face of an abrasive grinding wheel against the work piece surface. It typically produces an RMS surface roughness of greater than 100 nm. Polishing is similar to lapping but uses a softer polishing powder and a typically softer non-metallic polishing pad to typically produce a surface roughness of less than 50 nm. The rougher ground silicon surface is rougher than a lapped surface and may enable even easier peeling, but the rougher ground surface may lead to too many defects in the epitaxial layer grown thereon. A polished silicon surface, on the other hand, may be nearly free of surface flaws, but we believe that the porous layer formed thereon will be relatively more difficult to detach.

Figure 5:
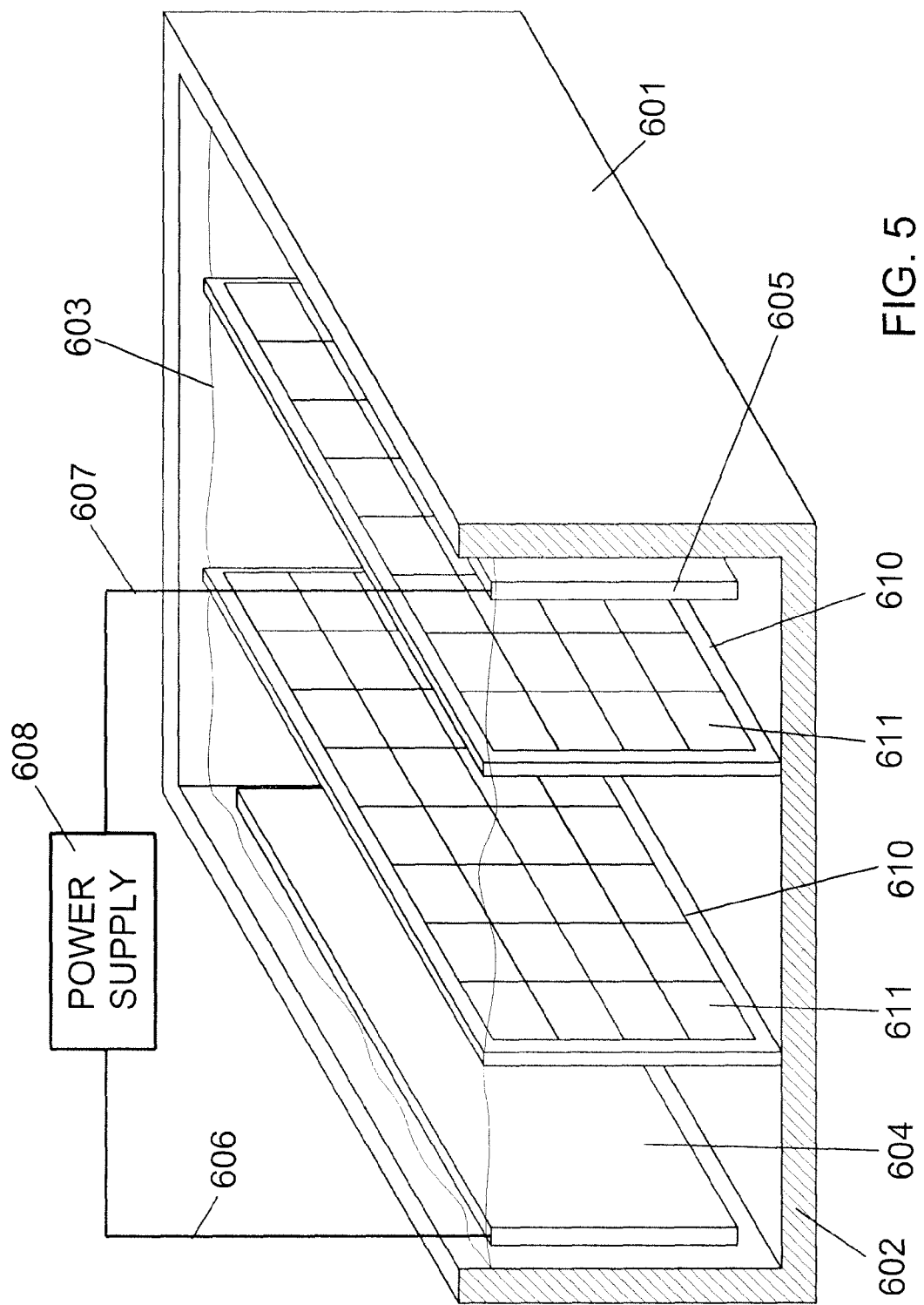
FIG. 5 is a schematic isometric view of an anodic etcher capable of simultaneously etching multiplicities of wafers attached in a vertical orientation to each of a plurality of susceptors.

A schematic isometric view of an anodic etcher capable of simultaneously etching multiplicities of wafers attached in a vertical orientation to each of a plurality of susceptors is shown in FIG. 5. The anodic etcher 601 contains within dielectric tank walls two electrodes 604, 605 preferably formed of platinum and electrically connected to a power supply 606 by respective wires 606, 607. One or more susceptors 610, each having a multiplicity of wafer tiles 611 affixed thereto, are removably immersed in the electro-etching solution 603, typically hydrofluoric acid (HF). If the windowed susceptor shown in FIG. 3 is used, then both the front and back sides of the wafer tiles 611 will be exposed to the electrolytic solution, but the wafer tiles 611 need to be sealed to the ribs 425 of the windowed susceptor 426 to electrically isolate the electrolytic solutions at the front and back. A conductive windowed susceptor is preferred for anodization although it presents some challenges. Alternatively, one or more holes through an otherwise planar susceptor for each wafer provides liquid contact to the wafers. Alternatively, the non-windowed susceptor shown in FIG. 2 may be used if the susceptor is electrically conductive and in good electrical contact with the source wafers affixed thereto.

Furthermore, if the edges of the susceptors 610 form a seal against the internal walls of the anodization tank 601 interrupting the electrical path of the electrolytic solution and the etching solution does not extend over the top of the susceptors 610, then the susceptors 610 and their attached wafer 611 will essentially form electrodes in a serial arrangement for the anodic etching process and not require actual electrical connections of the wafers or susceptors to the power supply 606. The liquid backside contact is advantageous in ensuring uniform etching across the surfaces of the wafers 611. With proper bias on the power supply 606, i.e., a positive bias on the fronts of the wafers relative to their backs, only the front surfaces of the wafers 611 will react with the HF solution 603 as is familiar to those skilled in the art. As mentioned above, a top surface of the electrolytic solution 603, typically hydrofluoric acid, is below the tops of the susceptors 610 to ensure that each susceptor 610 and attached wafers 611 form a separate electrode in the electro-etching circuit.

Etching a large array of silicon wafers to produce the needed porous layer structures requires uniform anodic current distribution across individual wafers, and between all wafers in the array. Further, the silicon wafers need to be conductive to the anodization current, for example, having an electrical conductivity in the range of 0.001 to 0.1 ohm-cm, 0.02 ohm-cm being a convenient value. Either p-type or n-type silicon wafers can be anodized. Discrete metal electrode contacts for either the anode or cathode do not yield the desired level of uniformity in etching, leading to non-uniformities even within single wafers. We have observed that using the electrolyte itself as the electrical contact to both sides of the wafers in a vertical etcher virtually eliminates these non-uniformities. Here, the same current density flows through all the wafers in the array. The volumes between each pair of susceptors or between a susceptor and an electrode are essentially like the individual cells in a serially connected battery. Such a scheme also allows for anodic etching of several panels in parallel in a vertical configuration as shown in FIGS. 3-5. This novel scheme produces uniform anodic etching on each wafer surface and the same etching uniformity across all wafers in a panel, an important feature enabling processing at the panel level. When the wafers are attached to the susceptor or support substrate, the support substrate needs to be in good electrical contact with the wafer, and should be a good electrical conductor itself. Alternatively, the susceptor may have openings or slots to allow for the electrolyte to directly contact the wafer back sides. These innovations enable very high throughputs in production.

Figure 6:
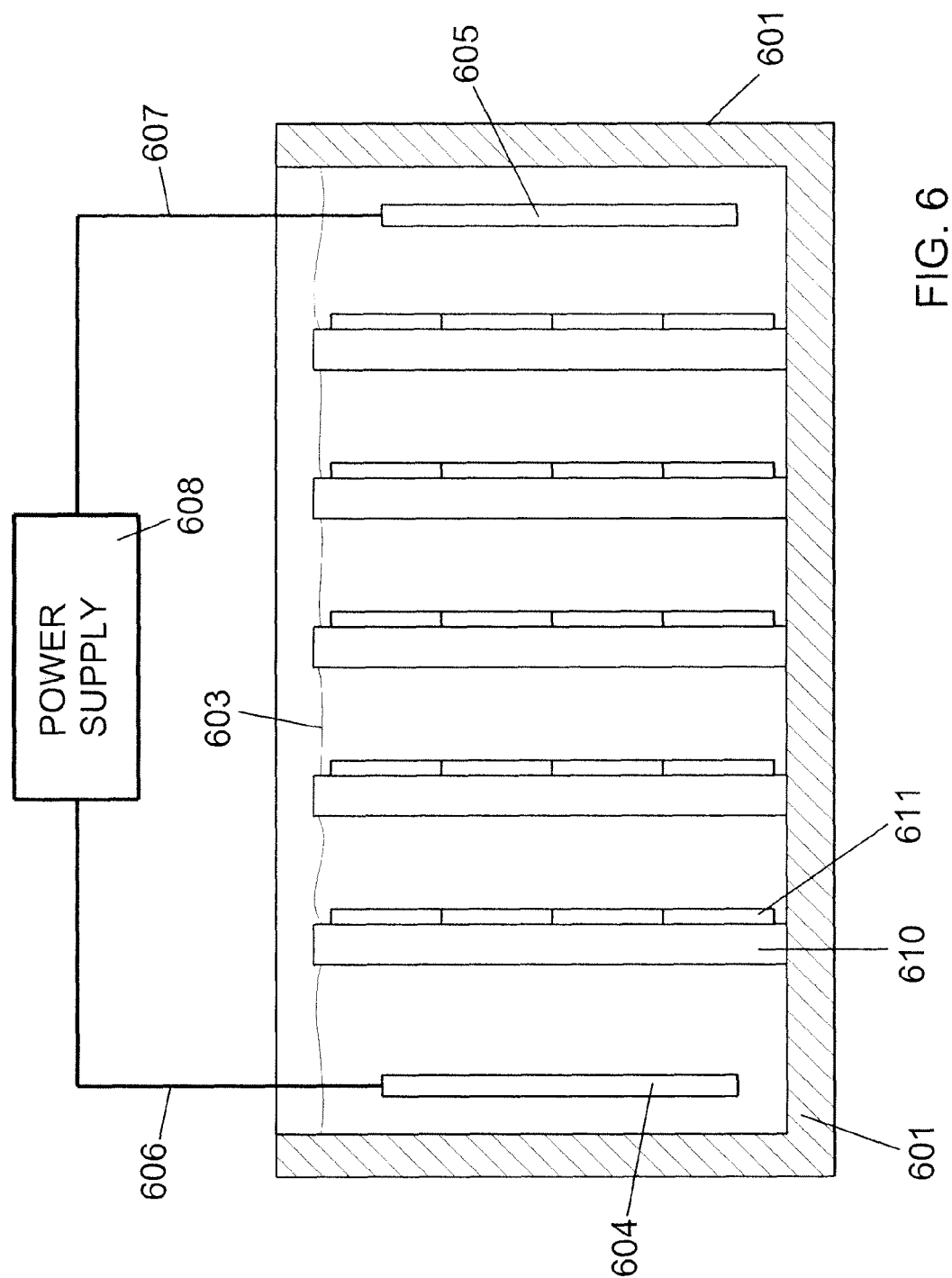
FIG. 6 is a schematic side cross-sectional view of the anodic etcher of FIG. 5.

An embodiment of an anodization tank shown in a schematic side cross-sectional view of FIG. 6 of the anodic etcher 601 of FIG. 5 can contain up to at least five susceptors 610, each having a multiplicity of wafers 611 affixed thereto. The manufacturing sequences described in FIGS. 20 and 21 would employ such an electro-etching arrangement.

Figure 7:
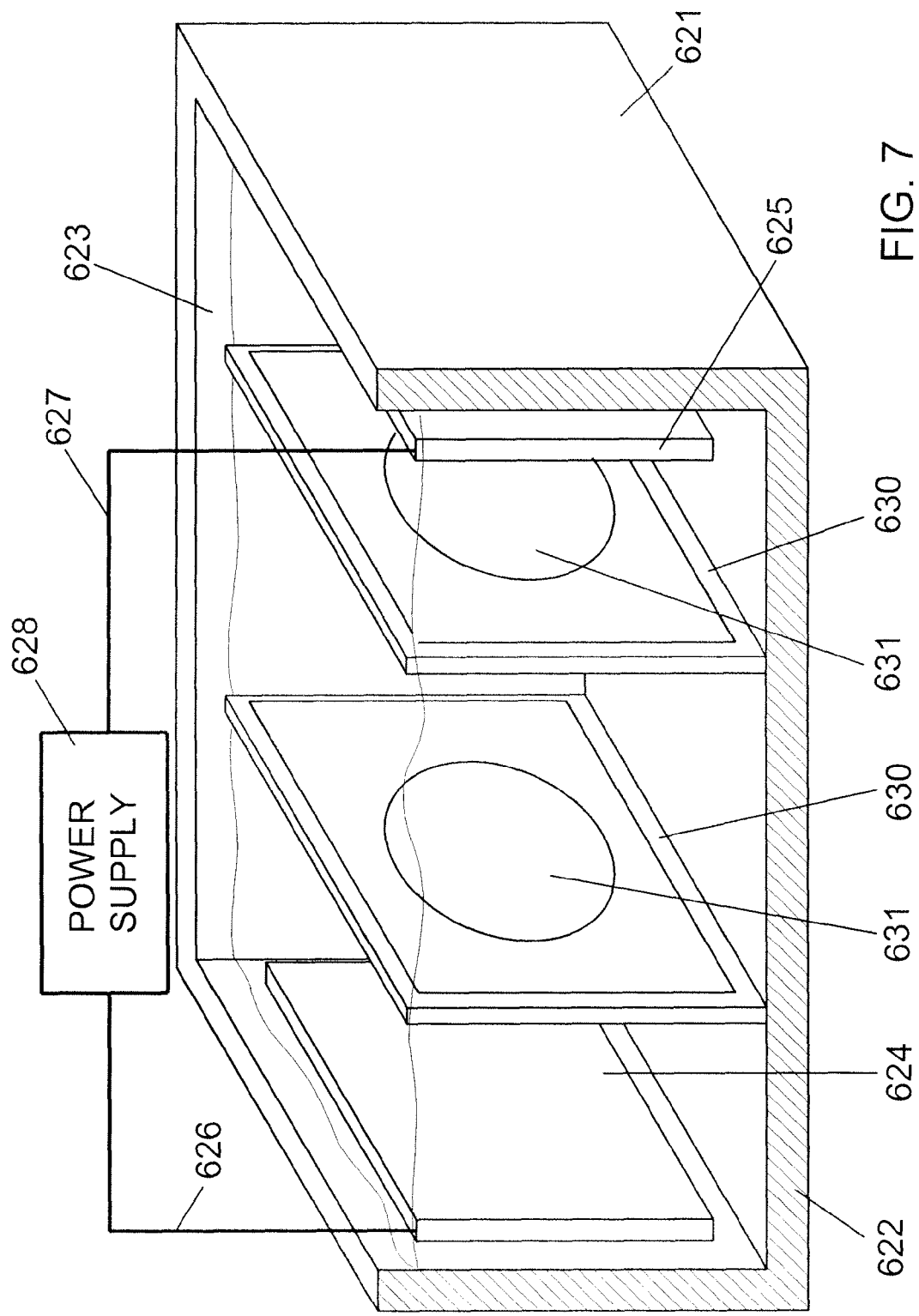
FIG. 7 is a schematic isometric view of an anodic etcher capable of simultaneously etching a number of wafers, each attached in a vertical orientation to a support frame.
Figure 22:
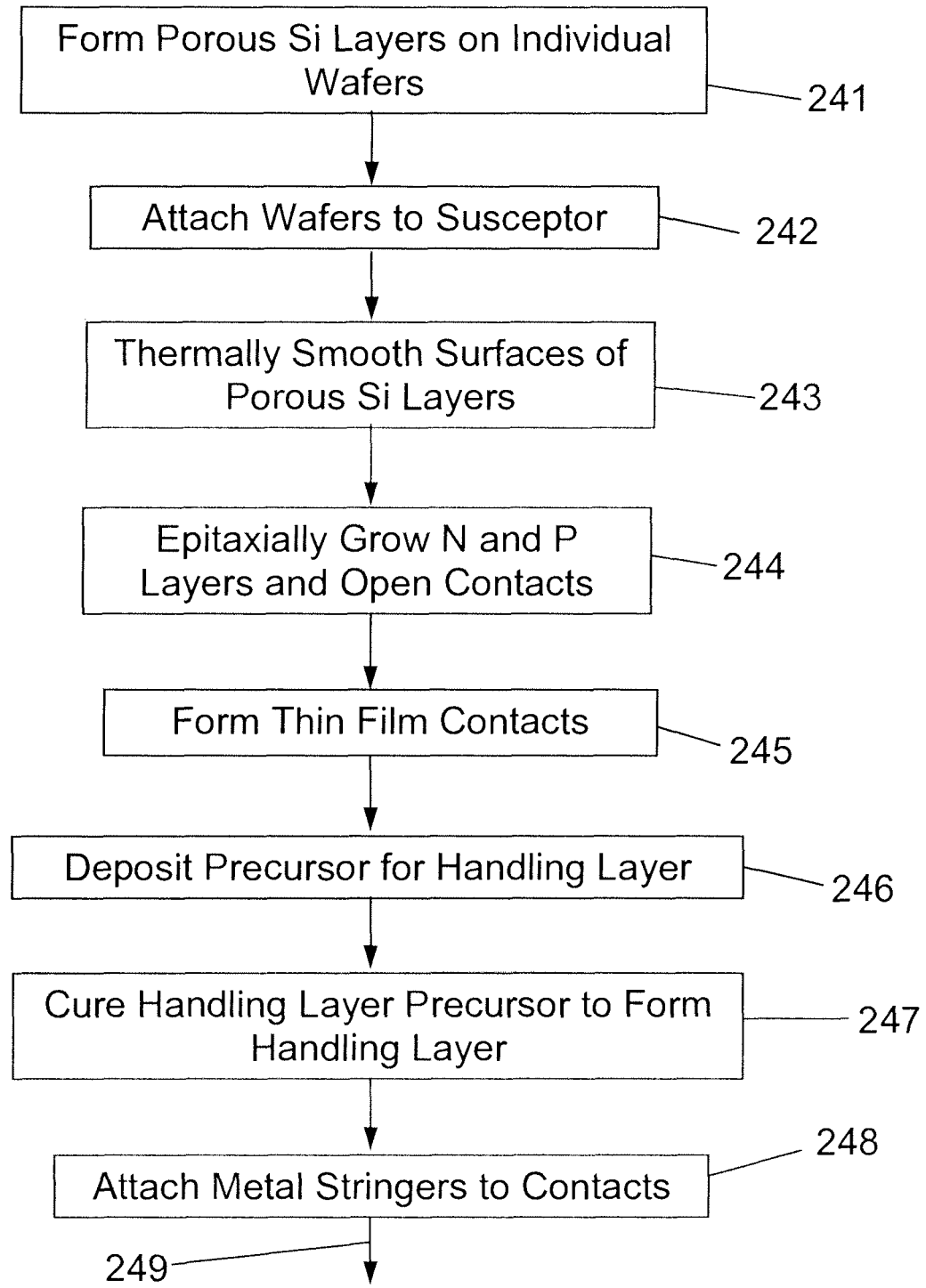
FIG. 22 is a flow chart of the first part of a manufacturing process for solar panels in a third embodiment of the present invention.
Figure 23:
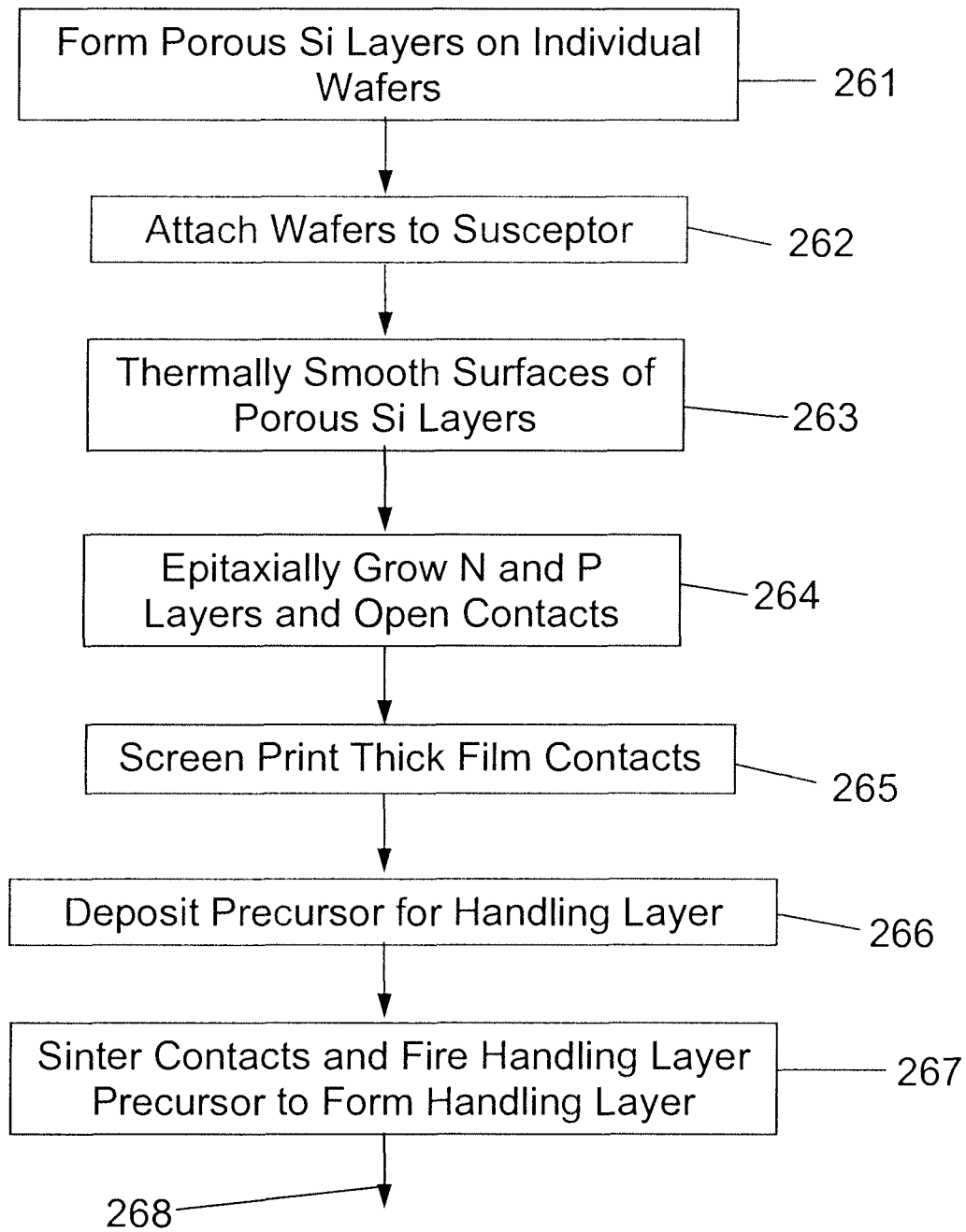
FIG. 23 is a flow chart of the first part of a manufacturing process for solar panels in a fourth embodiment of the present invention.

However, for the manufacturing sequences described in FIGS. 22 and 23, a different anodization arrangement may be employed. An anodic etcher 621 illustrated in the schematic sectioned isometric view of FIG. 7 is capable of simultaneously etching a number of wafers 631, each attached in a vertical orientation to a support frame 630. Note that in this case, although multiple wafers may be simultaneously etched, thereby improving etching throughput, these wafers are not yet detachably attached to a susceptor, and are, instead, attached to the support frames 630, which form seals against the internal walls of the etch chamber 621. Either round or square wafers 631 may be attached to the support frames 630 mounted within etch chamber 621, which can be much smaller than the etch chamber 601 of FIGS. 5 and 6. Electrodes 624, 625 are electrically connected to a power supply 628 though respective wires 626, 627. The top surface of the etch solution 623, typically hydrofluoric acid, filled into the anodization tank 621 should be below the tops of the support frames 630 and the support frames 630 should be sealed to the sidewalls of the anodization tank 621 to isolate the cells of the serial electro-etching apparatus to ensure that each wafer forms an electrode in the etching circuit.

It may be advantageous to vary the anodization process to form a low porosity film on the upper surfaces of wafers 611 or 631, and a higher porosity film below the low porosity film. Such a graded porosity has the advantage that the low porosity silicon layer may be easier to thermally smooth in the respective steps 203, 223, 243, and 263 in FIGS. 20-23) prior to epitaxial growth of the n-type and p-type layers in the PV cells. The electro-etching process for generating a high porosity film in the wafers has different etch parameters than the electro-etching process for generating a low porosity film, however the configuration of the electro-etching apparatus as shown in FIGS. 5-7 can be used for both cases and for some types of grading one electro-etching apparatus may serially anodize both sub-layers. The ability to modulate porosity by changing etch chemistry, etch current, or both has been an important innovation.

Thermal Smoothing

After the electro-etching processes illustrated in FIGS. 5 and 6 to produce the porous silicon surface layer, the wafer tile arrays, still attached to the susceptors 610, are removed from the anodization tank 601 for subsequent processing using various standard semiconductor processes, starting with thermal smoothing followed by epitaxial deposition of silicon in a reactor. In the case of the anodizaton tank 621 of FIG. 7, the wafers are typically remounted onto a susceptor carrying a closely packed array of solar wafer tiles including the mother wafers using the mounting methods described for susceptor 502 of FIG. 4. The windowed susceptor of FIG. 3 may be used in the epitaxial reactor described below if the wafers are sealed to the ribs; however, radiant heating of the wafers through the windowed susceptor presents challenges in accomplishing uniform heating. The planar susceptor of FIG. 2 is more easily used in a radiantly heated epitaxial reactor.

The exposed surface of the anodized porous silicon layer is advantageously smoothed to promote epitaxial growth of silicon on the porous layer. The smoothing may be performed as described in the afore cited Ser. No. 12/290,588 by annealing the mother wafer(s) in a hydrogen ambient at generally atmospheric pressure for a time of about 10 minutes and a temperature of 900 C or higher. Although the thermal smoothing can be done in conventional thermal processing oven, advantageously it is done when the mother wafers are mounted on susceptors, which are assembled into a wafer sleeve and thermally smoothed as a group, for example, using the radiantly heated epitaxial reactor described next.

Epitaxial Silicon Growth

The epitaxial reactor for depositing the silicon onto the conditioned surfaces of the source wafer template array has been described in detail by Sivaramakrishnan et al. in co-pending U.S. patent application Ser. No. 12/392,448, filed Feb. 26, 2008 and incorporated herein by reference. The epitaxial reactor has been designed to rapidly and simultaneously deposit silicon onto a large number of wafers by a thermal chemical vapor deposition (CVD) process using radiant lamps. As shown in the partially sectioned isometric view of FIG. 8, multiple wafers 720 are held on the interior surfaces of each of two susceptors 706 facing each other at close distance to confine the heat and the reacting gases close to the wafer surfaces. The assembly of two susceptors 706 and two end caps 701 forms a "wafer sleeve" with two open ends and having a relatively small interior volume. The two end caps 701 each have a tongue 702 which fits between the two susceptors 706, defining the spacing between the susceptors 706 at each susceptor edge.

The flow direction of the reactor gases flowing though the wafer sleeve between its open ends is reversed frequently in what is called "cross-flow processing" to avoid gas depletion at middle regions of the susceptor, thereby improving deposition thickness and resistivity uniformity. These features provide for excellent uniformity in temperature and reactive gas supply, ensuring highly uniform epitaxial silicon deposition. The reactor may be equipped with two or three reaction chambers in series, the first one to preheat the susceptor, the second for the deposition of the epitaxial silicon, and the last one to cool the susceptor. Dopant species can be bled into the reaction chamber, as necessary, to form as grown junctions. This reactor arrangement greatly enhances the throughput of the epitaxial reactor. Important advantages of the epitaxial reactor and process of this invention are: (1) a large-area vertical reactor with low volume to minimize gas cost and footprint; (2) a high-growth rate (2-10 μm/min) in the mass transport regime at temperatures exceeding 1000 C; (3) multiple wafer processing on two or more wafer susceptors that are processed simultaneously since the gases and incandescent heating lamp array is shared for two susceptors within the wafer sleeve; (4) lamp based heating for fast temperature cycling to enable a quick process sequence; and (5) efficient flow distribution for the silicon precursor trichlorosilane (TCS) with silicon conversion rates exceeding 50%.

In the case for processing the solar module of this invention, the substrates carrying the wafer arrays will constitute the susceptor. The gas flow is advantageously aligned with the shorter dimension of the solar array, again to minimize gas depletion effects in the center.

Figure 9:
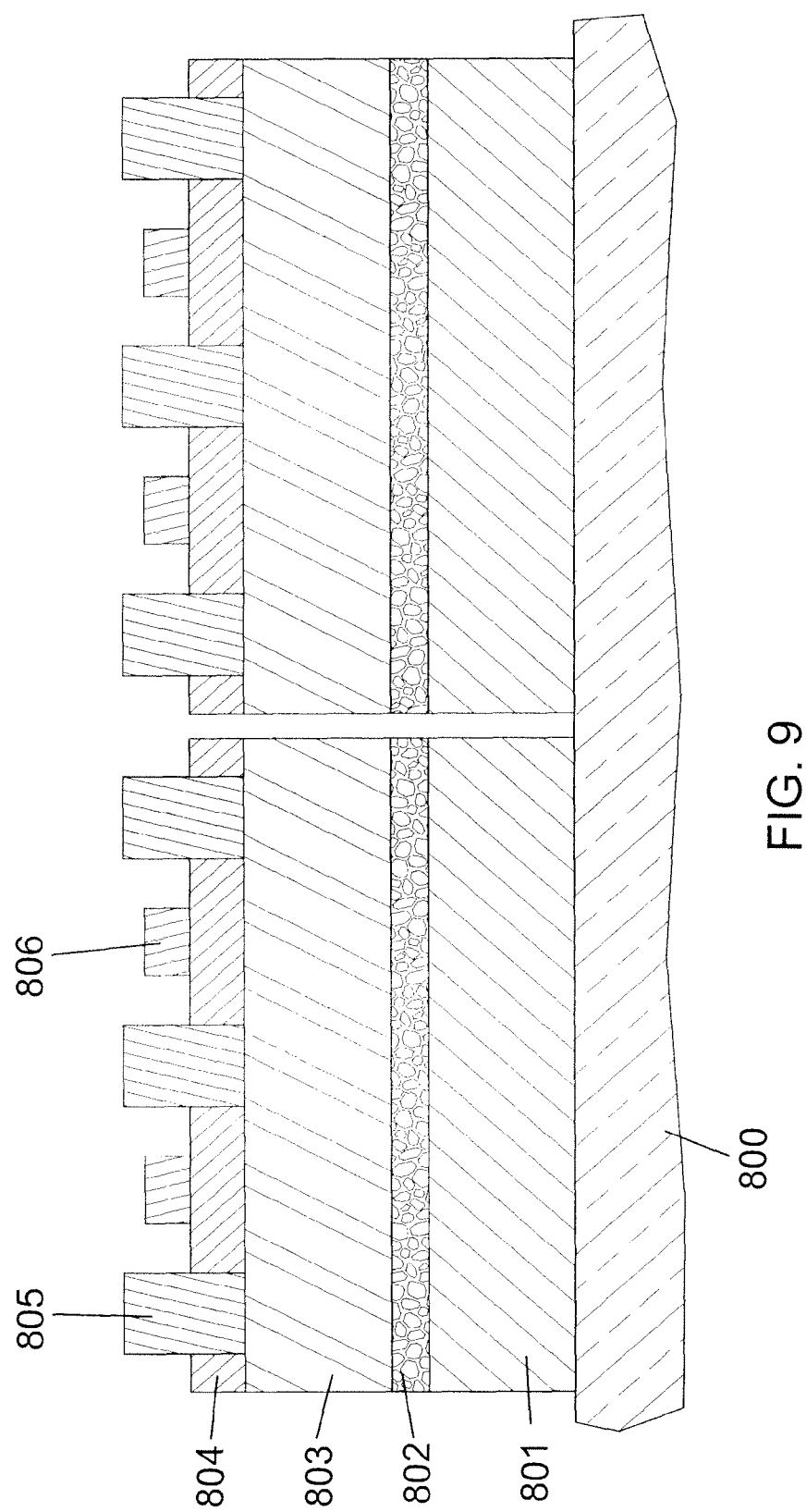
FIG. 9 is a schematic side cross-sectional view of two mother wafers attached to a susceptor with PV cell structures formed on the upper surfaces of each mother wafer.

FIG. 9 is a schematic side cross-sectional view of two mother or source wafers 801 attached to a susceptor 800 with PV cell structures epitaxially formed on the upper surfaces of each mother wafer 801 in the epitaxial reactor. Each PV cell includes at least one p-type layer 803 and at least one n-type layer epitaxially formed on top of a porous silicon layer 802 formed using the anodic etching process discussed in FIGS. 5-7. Note that if the anodic etching apparatus of FIGS. 5 and 6 is used, the porous silicon layer 802 will have been formed after attachment of the mother wafers 801 to the susceptor 800; but if the electro-etching apparatus of FIG. 7 is used, the porous silicon layer 802 will have been formed prior to attachment of the mother wafer 801 to the susceptor 800.

In either case, the growth process for the PV cells on the different mother wafers 801 proceeds in parallel using the vertical epitaxial reactor described above. After growth of the p-doped layers 803 of the PV cells, an n-doped layer 804 is epitaxially deposited. The order of the p-type and n-type layers can be reversed if desired.

Epitaxial silicon can be deposited with as-grown p-n junctions by adding suitable dopants during portions of the silicon deposition process, as shown in the two co-pending patent applications of K. V. Ravi (U.S. patent application Ser. Nos. 12/290,582 and 12/290,588) and the co-pending patent application of Sivaramakrishnan et al. (U.S. patent application Ser. No. 12/392,448). Such junctions may also be formed after epitaxial growth by well known dopant thermal diffusion methods. The cell fabrication steps, including the contact formation methods described here are for examples only.

Contacts and Surface Layers

The susceptor and attached mother wafers are then removed from the epitaxial reactor and further processed for the formation of contacts and surface layers and separation from the template array and final processing. Depending upon the type of cell structure, some of the contact processing may be performed after the cell array has been removed from the template array.

Formation and patterning of the contacts are described in more detail in U.S. patent application Ser. Nos. 12/290,582 and 12/290,588. The relatively large sizes and spacings of the contacts allows printing, for example, by screen printing, of either the patterned contact material or of a patterned resist layer for deposition of the contact material through the resist mask.

Several different cell types can be fabricated on the epitaxial layer. These include cells requiring double-sided contacts such as the conventional homo-junction cells and so-called double hetero junction (HIT) cells, or single-sided contacts such as integrated backside contact (IBC) cells. In the case of the double-sided cells, the contacts on one side of the cell are formed on cells of the array while still attached to the mother wafers on the susceptor while the contacts on the other opposite side are formed after the entire array has been glued to a glass layer and subsequently separated from the mother wafers. The encapsulants used to bond the array to the backing sheet will limit the processing temperature for the second side metal contact formation. The IBC cells are well suited for the solar array fabrication of this invention because all of the contact fingers can be fabricated on the cells prior to array detachment. In this case, the only remaining processes required to be performed on the front side of the array are cleaning, texturing, low temperature depositions of passivation and anti-reflection layers, after the solar array is separated from the mother wafers attached to the susceptor.

The contacts can be fabricated using deposited thin films, such as TiPdAg, AlTiWCu—CuSn patterned using shadow or resist masks or can be formed using screen printed silver-based pastes. The latter require firing at elevated temperatures to sinter the silver and to obtain good electrical contact and adhesion to the wafer. It is worthwhile to note here that the infrastructure already exists to fabricate metal interconnect patterns on large form factor substrates in the printed circuit board and flat panel display industries.

In the embodiment of the backside contact of FIG. 9, openings in the n-type layer 804 are made, enabling p-layer connections 805 to contact the p-type layer 803 without shorting the n-type layer 804. Also, n-layer connections 806 are made to the n-layer 804. Details of a process sequence for backside contact wafer fabrication are provided in U.S. patent application Ser. No. 12/290,588.

Another aspect of the invention includes some module fabrication steps to achieve simultaneous separation of the epitaxial solar array from the source wafer template array. Prior to separation from the wafer template, the tops and sides of the entire array are encapsulated in a semi-rigid, that is, somewhat flexible, glue layer such as ethylene vinyl acetate, EVA, commonly used in solar module encapsulation. The glue layer unites the cell array into a single somewhat flexible and peelable entity. The glue layer is then used for attaching a rigid module support layer, such as glass or Tedlar, either before or after array separation.

Figure 10:
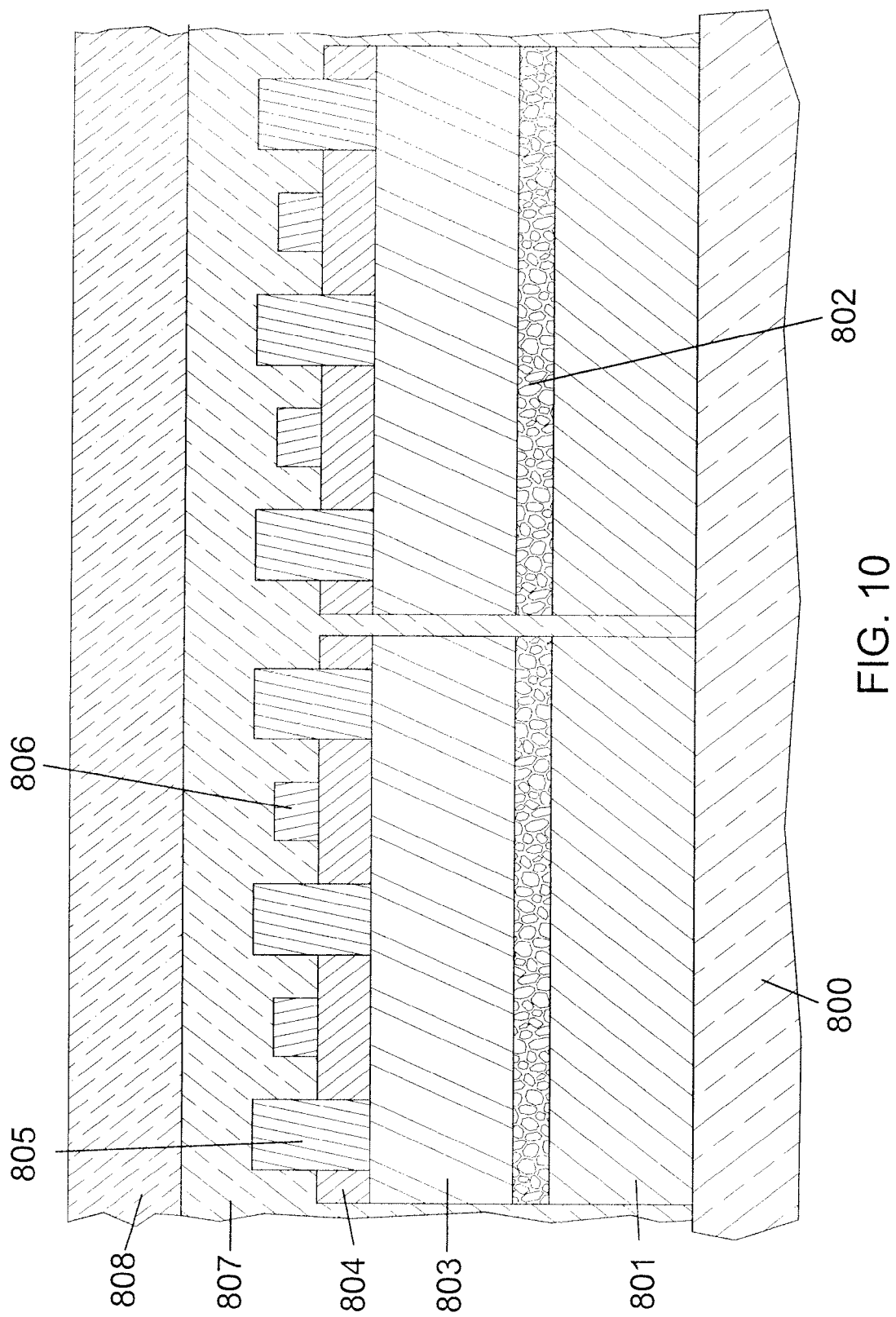
FIG. 10 is a schematic side cross-sectional view of the wafers and susceptor from FIG. 9 with a glue layer and glass layer attached to the upper surfaces of the PV cell structures which will become the backsides of the completed PV cells.

As shown in FIG. 10, a glue layer 807 and a module support layer 808 are added to the structure shown in FIG. 9. The glue layer 807 and module support layer 808 are array-level features for module support. Note that the glue layer 807 not only covers the PV cells and the PV cell contacts 805, 806, but may also flow down between the p-type and n-type layers 803, 804 of neighboring PV cells and between neighboring mother wafers 801, which are still attached to the susceptor 800. The illustrated top surface including the glue layer 806 and module support layer 808 will become the backside of the complete PV cells. The glue layer 807 flows around the p-n junction to hermetically encapsulate the solar cell. The module support layer 808, which may be formed of glass, is optional and is usually different from the final strengthening layer applied after defoliation. If it is used, it should be relatively flexible to permit defoliation by progressive peeling. In general, the glue layer 807 is less rigid than the soon to be described handle layer and than the support layer 808.

As noted earlier for this aspect of the invention, in order for the entire cell array to be successfully separated as one unit, the individual cells may be 'conditioned' to easily peel or separate from the porous silicon layer. This conditioning starts with proper surface preparation of the source wafers prior to anodization assuring a preferred structure for the porous layer stack, and the overall uniformity of this stack within wafers, wafer-to-wafer, and array-to-array. This conditioning may also involve edge grinding or laser removal of the epitaxial layer that wraps around the edge of the source wafers.

Another aid for easy array separation with the required high yields is to minimize the possibility of breakage of the thin epitaxial cells during the separation process. The polymeric glue encapsulation and the rigid or semi rigid substrate backing spanning the entire array may adequately assure this. Another way to assure that the individual cells do not break during separation involves forming a rigid 'handling layer' on the individual cells, which serves as a rigid backbone for the thin cells. A preferred low cost approach is to fabricate such a handling layer in situ from deposited or dispensed precursors on top of the epitaxial cells. If the cell contacts are made by thin film methods, this rigid handling layer is made from polymeric materials from precursors. Examples of suitable polymeric materials include epoxies, polyurethanes, cyanate resins, preferably filled with inert fillers such as fumed silica, cordierite inorganic glass powders or fibers. Asphalt and similar materials may also be suitable for forming the handling layer. The precursors, in the form of viscous solutions, are dispensed on top of the finished cells, and cured, as necessary to set and become rigid. When thick film silver pastes are used to form the contacts, the handling layer is formed by fusing a suitable glass, ceramic, or cermet handling layer onto the individual cells. Here again, a preferred approach is to deposit a slurry of the precursor powders on the epitaxial cells and sinter them at high temperatures to flow and adhere to the epitaxial cells. It is advantageous to deposit the powder precursors on top of the screen printed silver pattern and to sinter both together. (A more detailed discussion of ceramic handling layers is provided below.)

The material of the handling layer materials should be chosen to conformably coat and adhere well to the cell surface, including any metallization thereon and to have a coefficient of thermal expansion (CTE) close to that of silicon—a CTE greater than or equal to that of silicon over a temperature range from ambient temperatures to the highest temperature reached during the forming of the handling layer. Examples of suitable insulating materials useful for such in situ substrate fabrication include certain vitreous glasses (examples Pyrex, Corning glass 7070), glass and ceramic mixtures which together fire at the required temperatures, devitrifiable glasses which sinter and crystallize simultaneously upon firing (examples include certain lithium alumino-silicate or magnesium alumino-silicate glasses, and mullite, $3AlO_3 \cdot 2SiO_2$). Cermet compositions that can be used for this application are Si—SiC and Al—SiC. While the handling layer is intended to strengthen the epitaxial silicon cell, its attachment, or fabrication thereto, it also pre-disposes the cells for easy separation due to the small, but inevitable CTE mismatch stress between the handling layer and silicon. The cells provided with individual handles still need module encapsulation with semi-rigid EVA-type adhesives, to unite them into an array before or after array separation.

Figure 11:
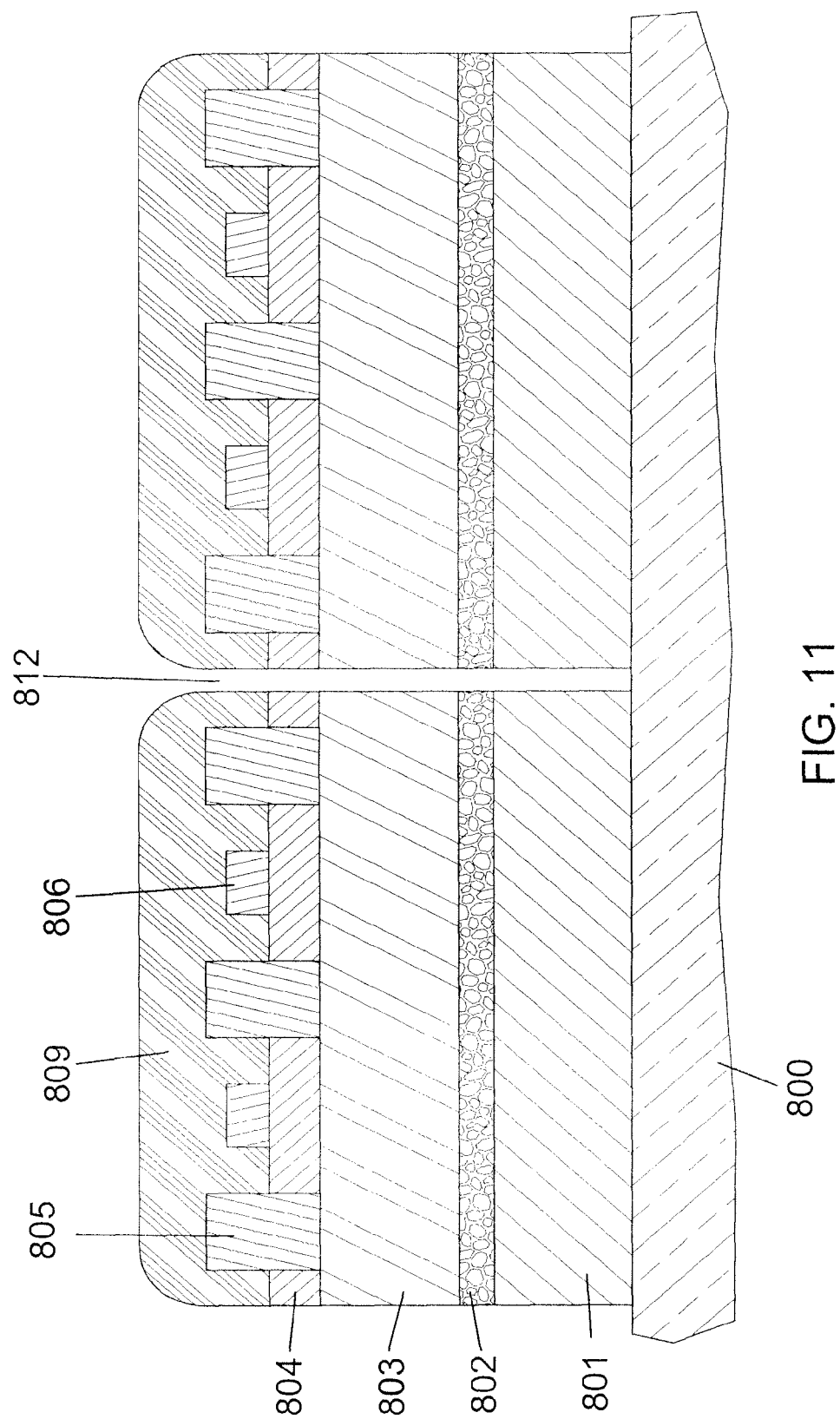
FIG. 11 is a schematic side cross-sectional view of the wafers and susceptor from FIG. 9 with a handling layer attached to the upper surfaces of the PV cell structures which will become the backsides of the completed PV cells.

An alternative process to that shown in FIG. 10 first deposits the precursor for a handling layer on the structure of FIG. 9, followed by heating to simultaneously sinter the contacts 805, 806 and to convert the handling layer precursor into a handling layer 809, illustrated in FIG. 11, separately covering each of the PV cells in the array. Due to surface tension and the deposition of the handling layer precursor away from the edges of the n-type layer 804, the handling layers 809 do not extend between neighboring PV cells but instead leave gaps 812 so that the rigid handling layer 809 does not prevent bending between cells during peeling. This difference should be considered because the stiffness of the handling layer, if it were to bridge the PV cells, would make exfoliation difficult as shown in FIGS. 14-19. The handling layer is a cell-level feature, which may be formed in situ on the epitaxial silicon to reinforce it and to dispose it towards easy peeling.

The individual cells can be tested prior to separation by using either a cell-size or an array-size probe head. It should be recognized that the testing at this stage is limited to measuring some cell electrical characteristics and not directly cell performance. With a database of these characteristics, defective cells may be identified and replaced with single cells from storage, prior to encapsulation. Full cell and array level testing can only be done after the array separation and surface finishing and cell completion steps on the peeled surface.

Figure 12:
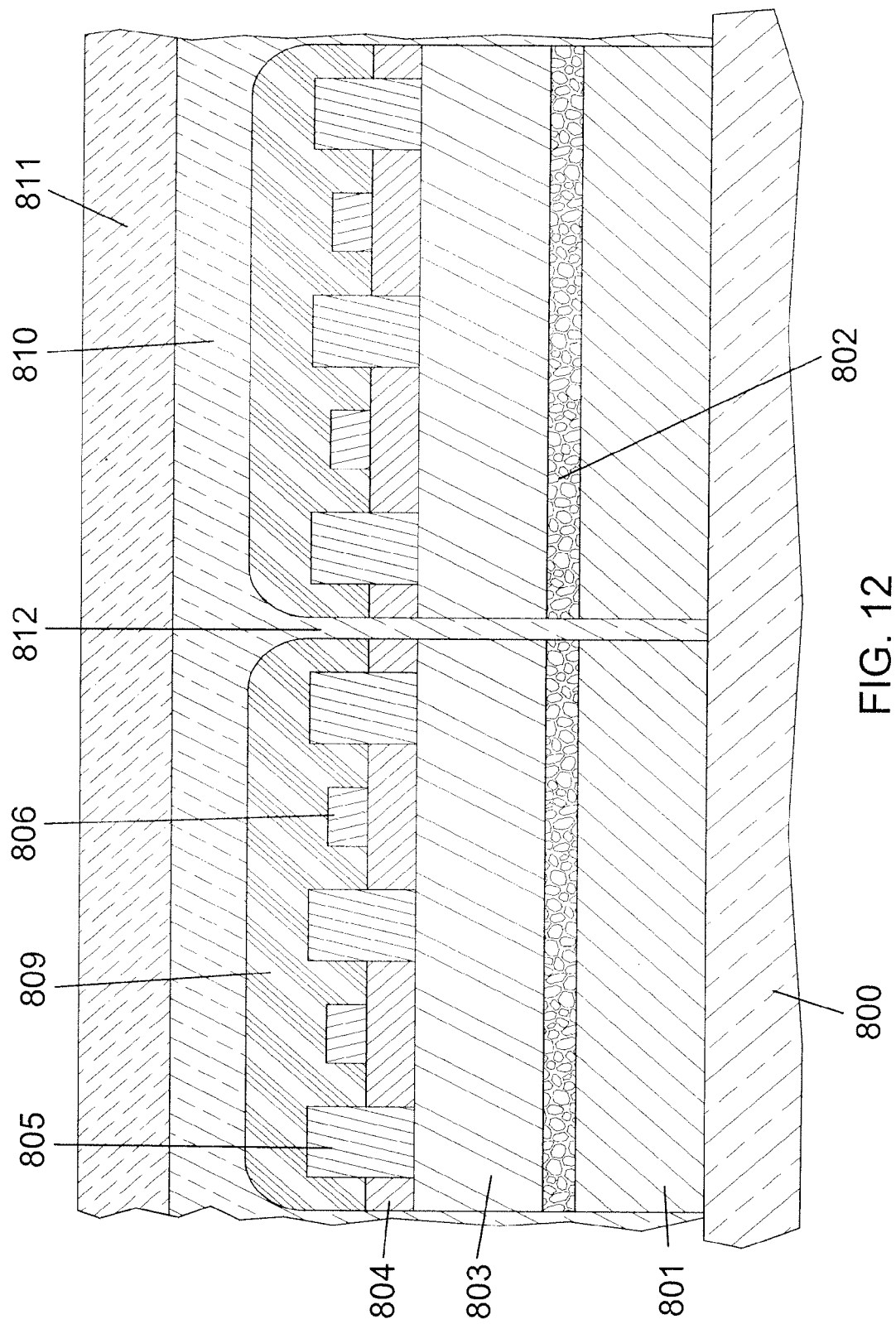
FIG. 12 is a schematic side cross-sectional view of the wafers and susceptor from FIG. 11 with a glue layer and glass layer attached to the upper surfaces of the handling layers which will become the backsides of the completed PV cells.

As shown in the schematic side cross-sectional view of FIG. 12, the glue layer 810 and the support layer 811 are attached to the upper surfaces of the handling layers 809, which will become the backsides of the completed PV cells. Again, as in FIG. 10, the glue layer 810 may flow down in the gap 812 between the handling layers 809 and then between the PV cells and mother wafers 801. If the glue layer 810 flows at least past the solar cell layer 803, it provides side encapsulation for the semiconductor layers and their junctions. The relative flexibility of the glue layer 810 does not prevent the bending between cell during peeling.

Figure 13:
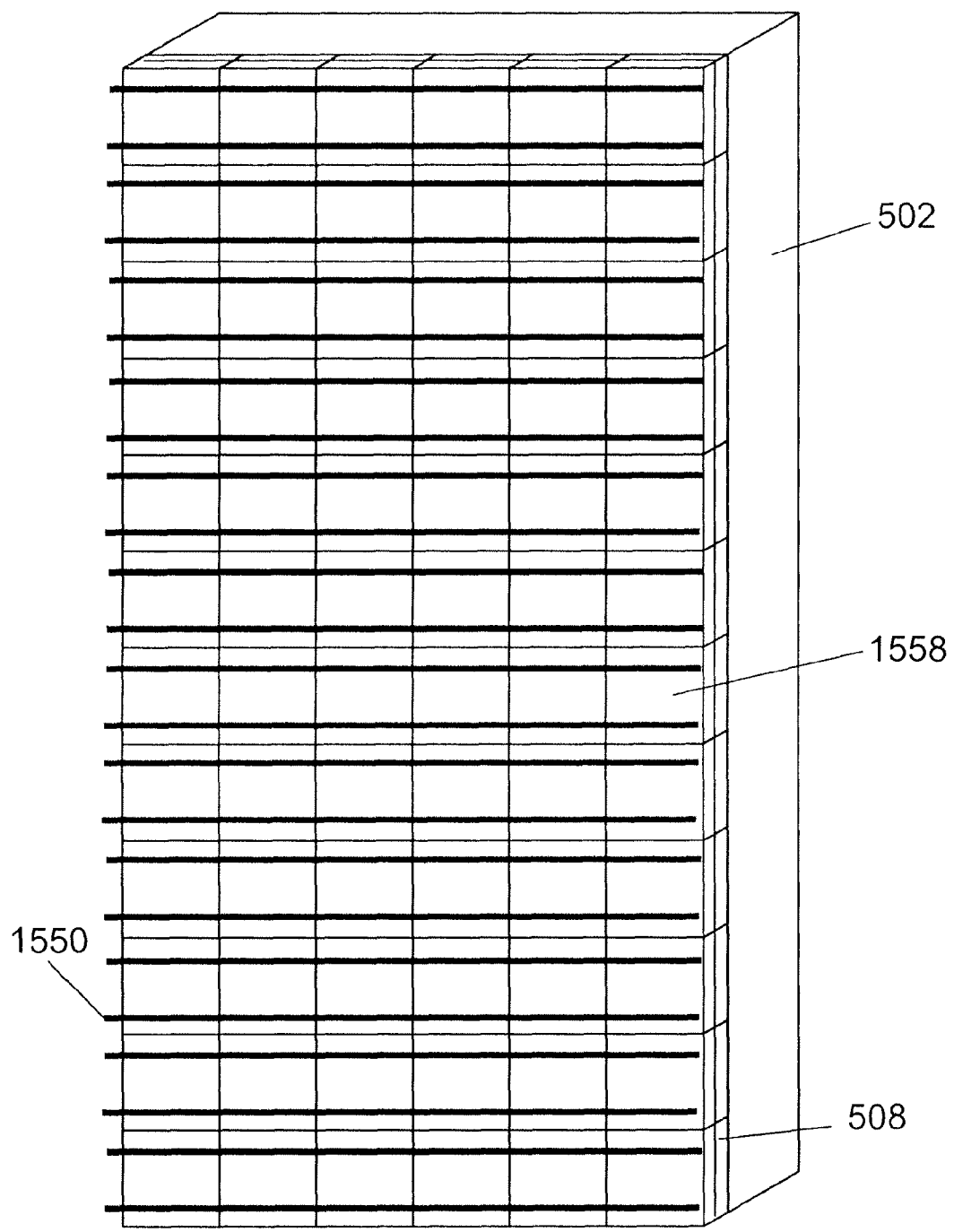
FIG. 13 is a schematic isometric view of a solar cell panel showing the metal connection strings.

As illustrated in FIG. 13, the cells in the array can be electrically connected to each other, i.e. strung together, in the required configuration by spot soldering a tin-coated copper strip 1550 to tabs (contacts) on the cells formed as part of the cell interconnections, prior to encapsulation. A large number (72 in this example) of PV cells 1558 may be been grown on top of the X-Y array of mother wafers 508 of FIG. 4.

Separation of the Epitaxial Silicon Cell Device Layer

For single cells, several techniques are described in the prior art for separating the epitaxial layer from the growth substrate when the separation layer is a porous silicon layer produced by the anodic etching method.

Japanese laid-open patent application 7-302889 describes a method bonding a second silicon wafer to the epitaxial layer, bonding plates to the silicon wafers, and then separating the plates by force from each other such that the epitaxial layer remains attached to the support substrate.

Japanese laid-open patent application 8-21345 is similar to the above but performs the separation after forming the p-n solar cell junction thereon while both the parent substrate and the support substrates are bonded to jigs with adhesive. The support substrates can be quartz or metal.

In U.S. Pat. No. 6,258,666, Mizutani et al. use a curved surface of a support substrate to peel the epitaxial film away from the growth substrate while the latter is secured on a support member by means of vacuum chuck, electrostatic chuck, or by mechanical clamps. A flexible polymer film, which could be self-adhering film or tape, is bonded to the epitaxial film, with an edge extending outwardly from the substrate serves to grip the film to initiate the peeling action. The edge of the film is then secured to drum-shaped, or blotter-shaped (semi-circle) support with a prescribed radius of curvature designed to peel the epitaxial film gently as the support member is rotated. Instead of using an adhesive tape, the holding and peeling of the semiconductor film can be, by vacuum suction, electrostatic suction, mechanical claws, and such.

Each of these methods is effective in separating the semiconductor film grown on a porous silicon layer of a source silicon substrate, but all have the shortcomings of needing secondary silicon, or other temporary support substrates, as well as other deficiencies not conducive to high productivity. Furthermore, these and other related methods are not easily scalable to perform the simultaneous peeling and separation of multiple epitaxial silicon layers from a pre-arranged array of source substrates carrying such films, which can enable enormous productivity in module fabrication, as will be detailed below.

Figure 14:
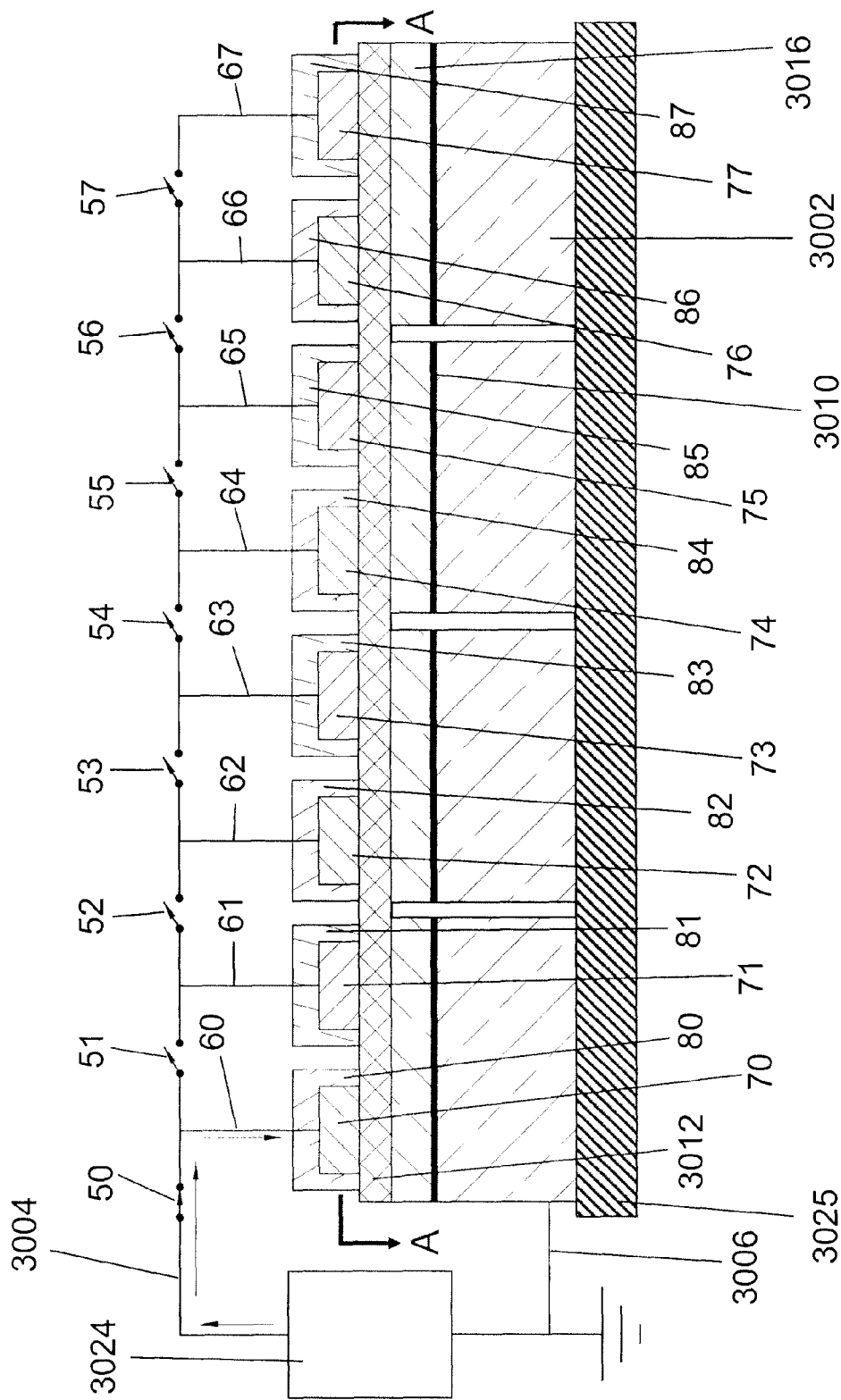
FIG. 14 is a side cross-sectional view of an array of wafer tiles covered by a flexible film and clamped to a segmented electrostatic chuck prior to separation of the highly porous silicon film. Cross-section A-A is illustrated.
Figure 15:
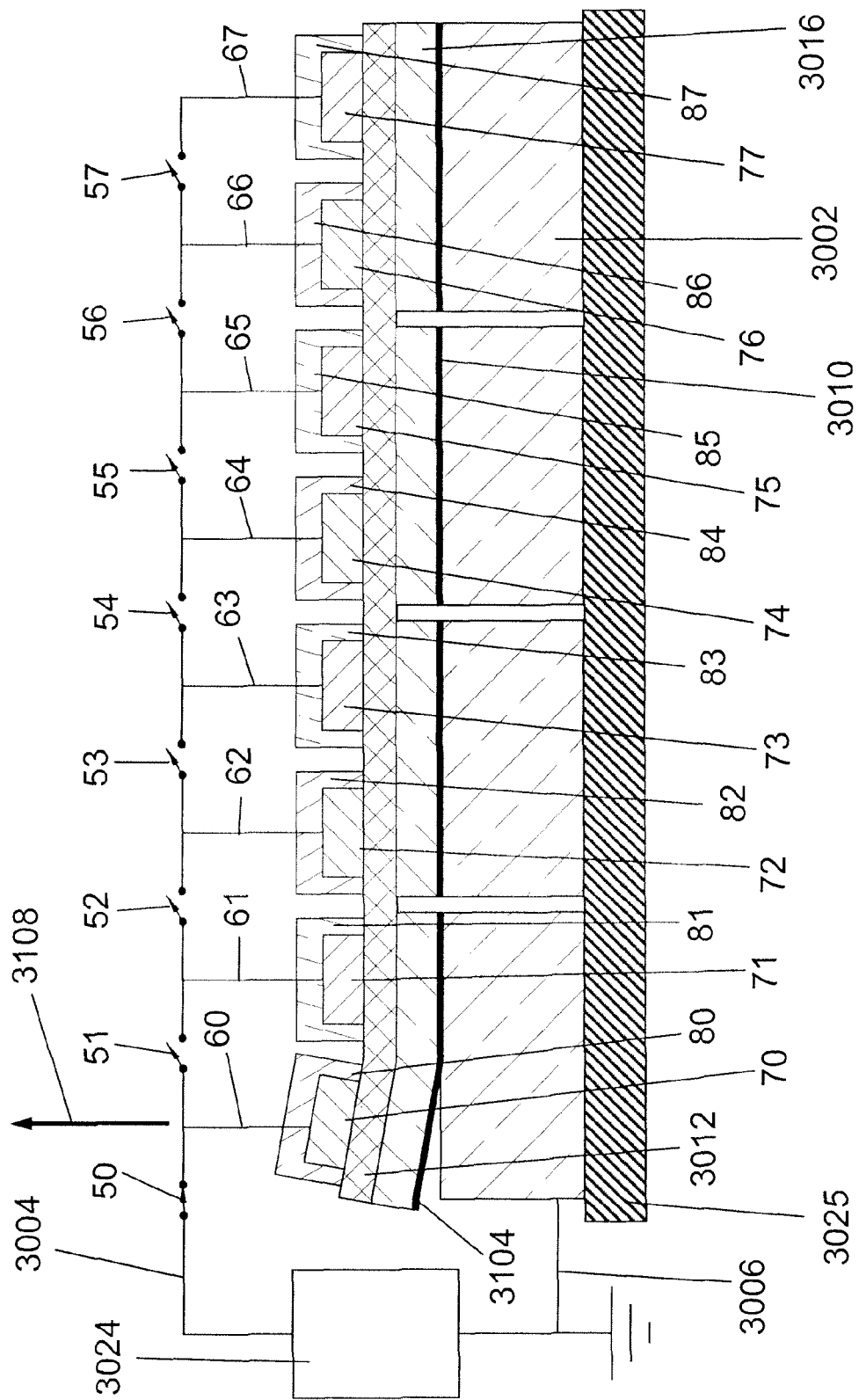
FIG. 15 is a side cross-sectional view of an array of wafer tiles covered by a flexible film and clamped to a segmented electrostatic chuck after the beginning of separation of the highly porous film etched in FIG. 7.
Figure 16:
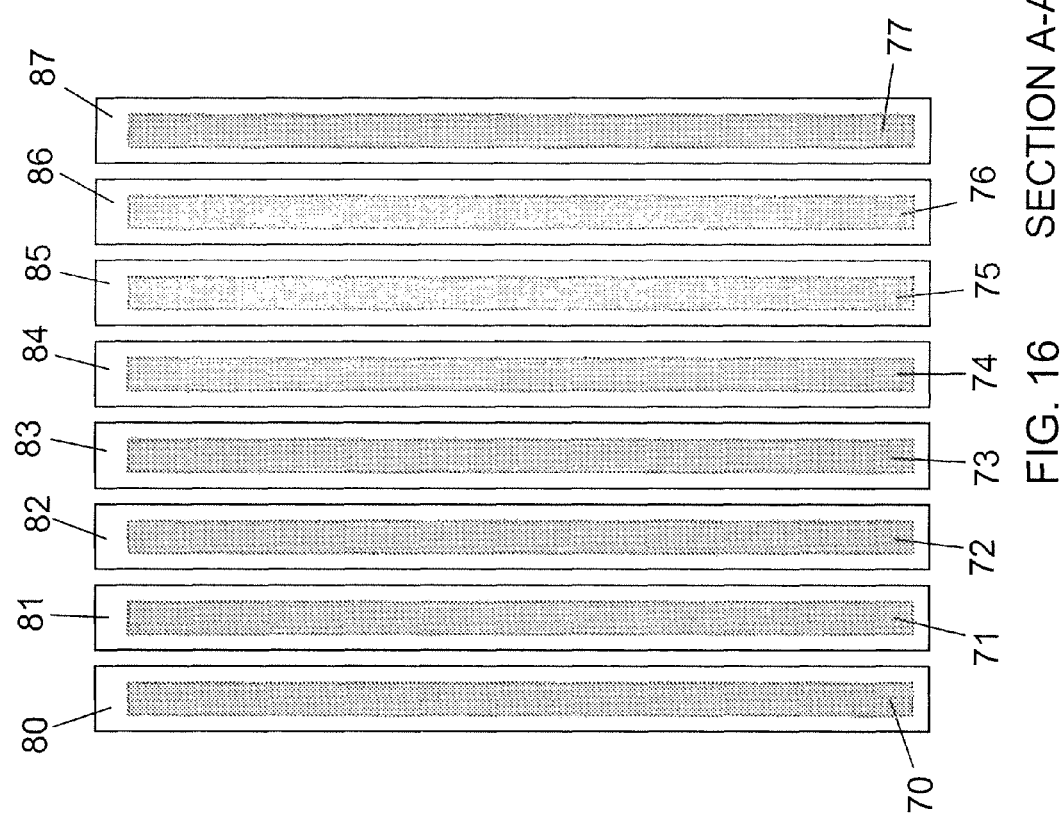
FIG. 16 is a top view through cross-section A-A of the electrostatic chuck in FIGS. 14 and 15.
Figure 17:
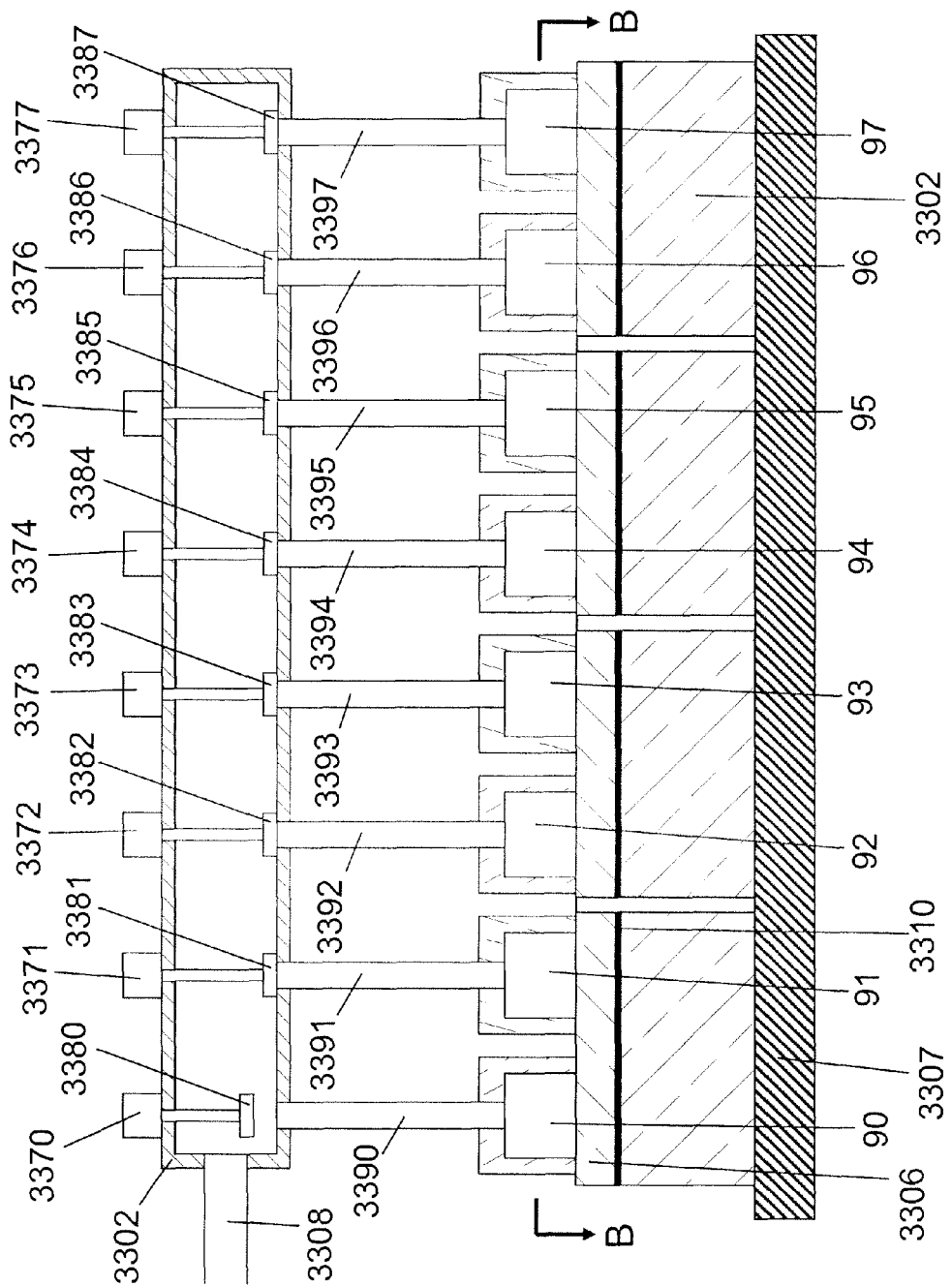
FIG. 17 is a side cross-sectional view of an array of wafer tiles not covered by a flexible film and clamped to a segmented vacuum chuck prior to the separation of the highly porous silicon film. Cross-section B-B is illustrated.
Figure 18:
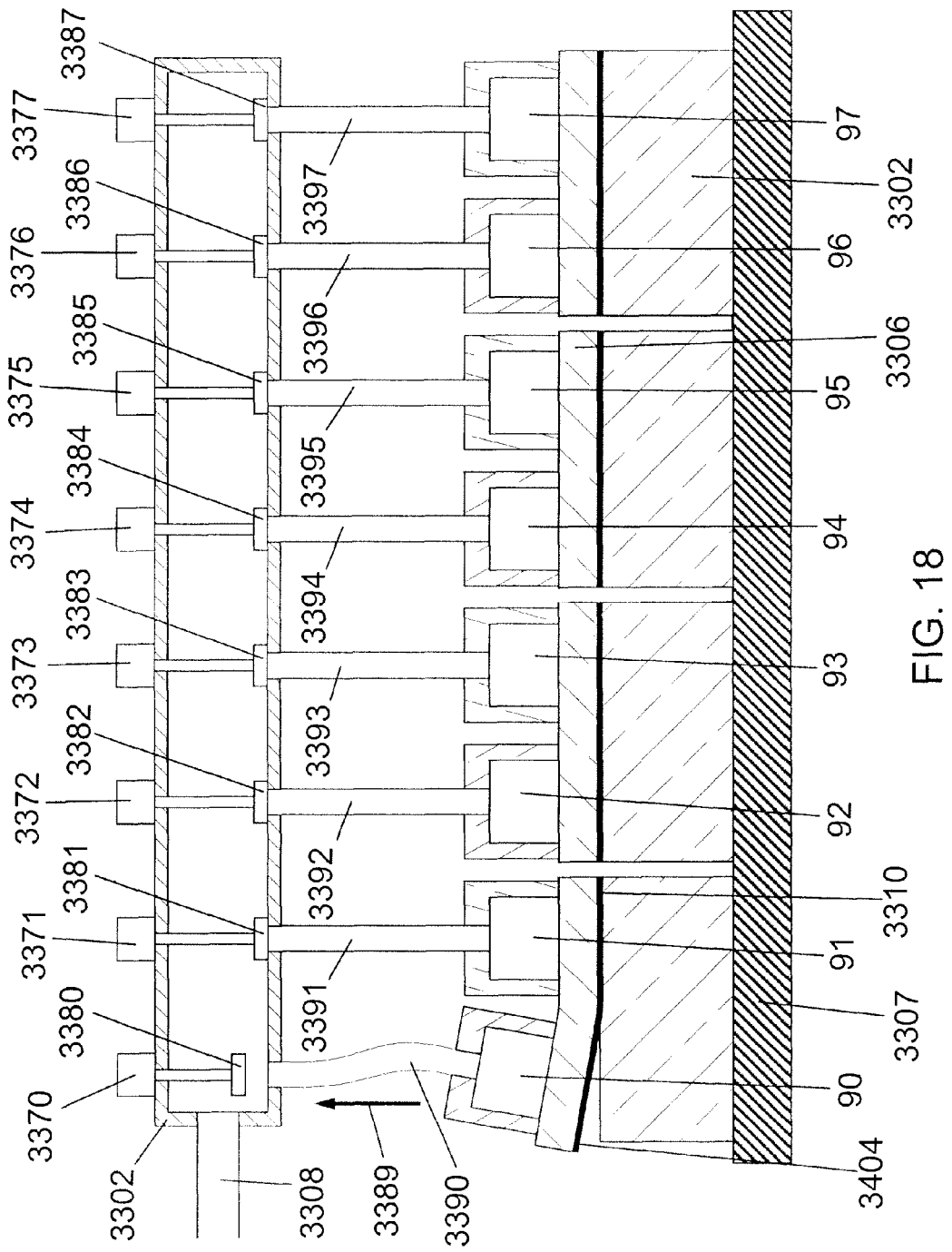
FIG. 18 is a side cross-sectional view of the array of wafer tiles not covered by a flexible film and clamped to a segmented vacuum chuck after the beginning of separation of the highly porous silicon film.

FIGS. 15 and 18 are schematic side cross-sectional views of the separation of the highly porous silicon layers anodically etched in either the anodization apparatus of FIGS. 5 and 6 or that of FIG. 7. The peeling process typically separates the porous silicon layer in each of the wafers into two layers: (1) a lower layer attached to the upper surface of the mother wafer; and (2) an upper layer attached to the PV cell structure. The surfaces of these two layers will both be physically and optically rough due to the separation process. This optical roughness can potentially increase the light collection efficiency of the solar cell since the upper layer attached to the PV cell structure forms the front surface of the final solar cell array. The separation process for the porous silicon film may be accomplished in a number of other ways, as illustrated in FIGS. 14-19 below.

Peeling by Electrostatic Clamping

In one embodiment of the separation process, an array of electrode strips, each smaller than the width of a wafer tile and electrically isolated from each other, are placed on a flexible polymer film bonded to the epitaxial silicon layer and acts as additionally as a dielectric layer. The flexible film may be the previously described glue layer. For progressive peeling, the potential is first applied between the outermost electrode, which is placed on the edge of the flexible film, and the grounded silicon source substrate. This localizes the electrostatic gripping to roughly the area covered by the electrode. As this electrode is lifted, it will apply an upward force on the epitaxial silicon layer directly underneath. When a sufficient upward force is applied, it will initiate peeling at the edge between the epitaxial layer and the source substrate. At this point, the next electrode in the array is activated and pulled up, to propagate the peel further. The peel having been already initiated at the edge, the force required to propagate the peel to this second region will be much less. This action is carried out across the entire array of electrode strips to complete the peeling of the epitaxial layer as the same actions are initiated on the electrode strip next to the electrode strips already peeled. To limit the upward pull of the electrodes, a mechanical stop can be placed on the electrode lift pins. To equalize the upward lift of all the electrodes, they can be tied to a tie bar made of a suitable dielectric such as a structural plastics or a ceramic such as alumina.

As illustrated in the cross-sectional side view of FIG. 14, an array of wafer tiles 3016 is encapsulated with a semi-rigid but somewhat flexible glue layer 3012 and clamped overhead to a segmented electrostatic chuck prior to separation of the highly porous silicon films 3010 formed in either the anodization tank of FIGS. 5 and 6 or that of FIG. 7. The segmented electrostatic chuck includes a plurality of clamping strips 70-77 enclosed and electrically isolated by respective dielectric films 80-87. The clamping strips 70-77 are juxtaposed to different ones of the wafer tiles 3016 across the semi-rigid glue layer 3012 and, as also shown along section line A-A in the top view of FIG. 16. Preferably, as shown in FIG. 14, multiple clamping strips are juxtaposed to each of the wafer tiles 3016 so that each tile is subjected to a gradual peeling including bending of the separate wafer tiles 3016. Peeling action may be initiated from the left in the illustration of FIG. 14, then progressively moving to the right.

An electrostatic clamping power supply 3024, preferably a DC power supply, is connected through a first electrical connection 3006 to either mother wafers 3002 or a substrate support 3025, which may be the previously described susceptor. The substrate support 3025 may be at ground potential as shown in the figure; however, another potential may be used for proper clamping operation. The other output of the power supply 3024 is connected through a second electrical connection 3004 to a series of switches 50-57 as shown, all but the switch 50 separating different ones of the electrostatic clamping strips 70-77. When switch 50 is closed as shown, the clamping voltage is applied to the first electrostatic clamping strip 70 through a first electrical connection 60. Similarly, when the switch 51 is also closed, the clamping voltage is applied to the second electrostatic clamping strip 71 through a second electrical connection 61. Similarly, the clamping voltage is sequentially applied to the remaining serially arranged electrostatic clamping strips 72-77 through electrical connections 62-67.

The electrostatic clamping strips 70-77 are applied to the top of the flexible film 3012 on top of multiple solar cells 3016. Porous separation layers 3010, which may be formed in either the anodization tank of FIGS. 5 and 6 or that of FIG. 7, separate the respective solar cells 3016 and the mother wafers 3002. Each of the electrostatic clamping strips 70-77 is attached to a mechanical actuator (not shown) capable of moving clamping strips 70-77 individually in a vertical up-down motion 3018 illustrated for the first clamping strip 70 in the side cross-sectional view of FIG. 15.

The figure shows the initiation of peeling of the solar cells 3016 from the substrates 3002 by separation (exfoliation) across the porous silicon layers 3010 for the portion of the solar cell 3016 underlying the first electrostatic clamping strip 70, which had been activated by the closing of by the closing of the first switch 50 At this point, the remaining electrostatic clamping strips 71-77 are not yet activated, that is, are not yet clamping the associated solar cell 3016 since the switches 51-57 remain open. Upwards arrow 3108 represents a vertical pulling motion by a mechanical actuator (not shown) attached to electrostatic clamping strip 70. Due to the electrostatic clamping action between the first clamping strip 70 and the leftmost solar cell(s) in the array of solar cells 3016, when the first clamping strip 70 is pulled up by the actuator, the leftmost solar cell(s) are also pulled up as shown by a separated (peeled or exfoliated) portion 3104 of the porous layer 3010 and the continuous flexible layer 3012 is bent between the attached and detached solar cells 3016. The remaining electrostatic clamping strips 71-77 are sequentially actuated in the sequence 71, 72, . . . 77 by the sequential closing of the switches 51-57 in the sequence 51, 52, . . . 57. Further mechanical actuators (not shown) respectively attached to the clamping strips 71-77 pull up on the other clamping strips 71-77 in the sequence 71, 72, . . . 77, thereby creating a peeling action from left to right in FIG. 15 to separate the array of solar cells 3016 from the mother wafers 3002.

It is possible to initially activate all of the clamping strips 70-77 in their down positions and then sequentially pull them up to perform the peeling operation across the solar cell array.

These actions of separating and lifting of the flexible dielectric film 3012 along with the epitaxial solar cell layer 3016 bonded thereto can be automated to make the operation scalable to large areas. The large-scale peeling advantageously allows for simultaneous peeling of a prearranged array of source wafers with their epitaxial films.

It is to be understood that the essential point of this aspect of the invention is the application of pulling force locally at an edge of the epitaxial film to grip and pull the edge of the film at its edge and thereafter to sequentially create similar forces and separations on adjacent areas of the film until the entire epitaxial layer is separated from the source wafer at the location of the separation layer. The idea transcends any specific means for creating these actions, such as specific electrode arrangements, the gripping means, or of the means for lifting the gripped film and such which results in a rolling motion across the array of solar cells.

Peeling by Vacuum Suction

In another embodiment, the entire peeling action may be accomplished by vacuum suction. The vacuum suction is applied locally through an array of vacuum 'strips' placed pressing on the film, starting from the outermost strips and working progressively across the others to the other side. The level of vacuum is designed to separate and lift the film from the source substrate. As this action is translated across the film, the separation proceeds in a predictable manner until the entire film is peeled and separated from the source wafer. Here again, the sequential activation of the vacuum strips in the array can be regulated by providing a feedback loop using fluidic devices and such, and thereby made to be reliable and reproducible for peeling epitaxial silicon layers from porous or other separation layers of mother wafers.

Figure 19:
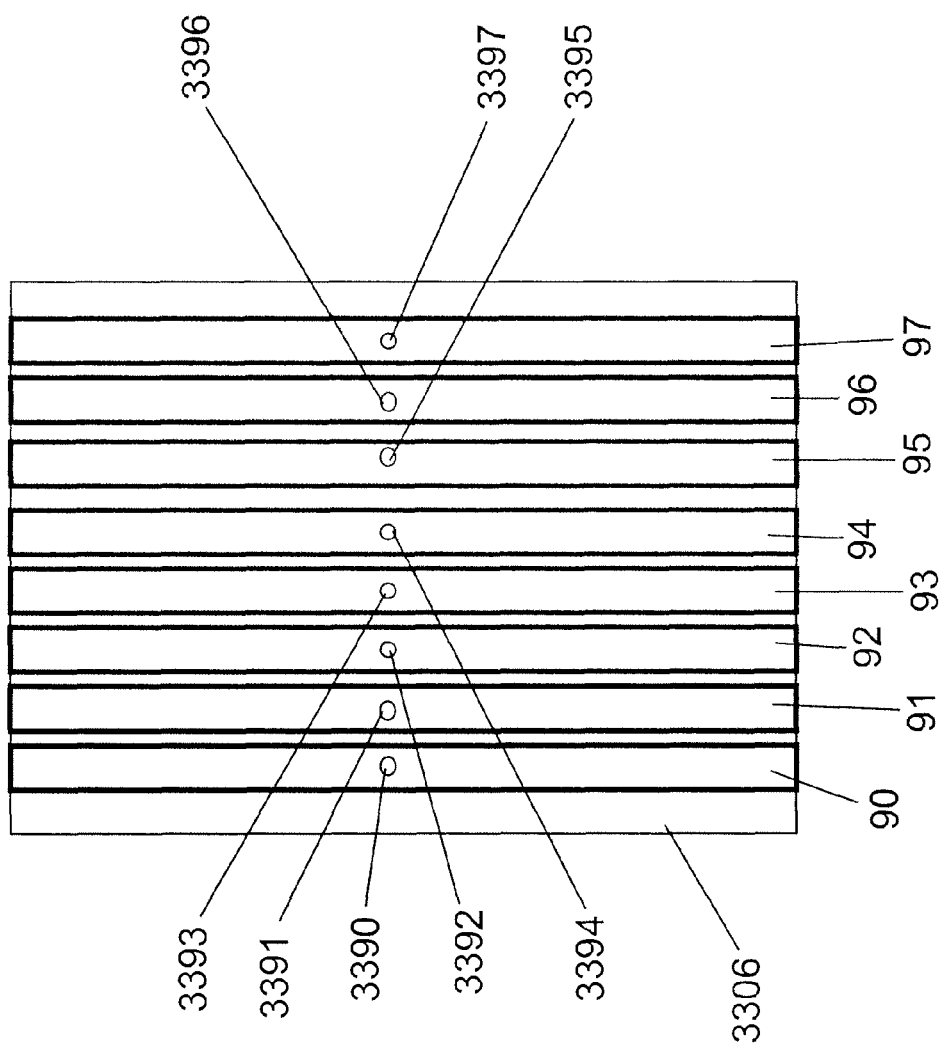
FIG. 19 is a top view through cross-section B-B of the vacuum chuck in FIGS. 17 and 18.

A progressive vacuum chucking system is illustrated in the side cross-sectional view of FIG. 17, in which an array of wafer tiles 3306 need not be covered by a flexible film but are directly clamped to a segmented vacuum chuck prior to separation of the highly porous film formed in either of previously described anodization tanks. Similarly to the progressive electrostatic peeling, in this embodiment, vacuum peeling action is initiated from the left, then moving to the right. A vacuum line 3308 connects a vacuum pump (not shown) to a manifold 3302, creating a vacuum within the manifold 3302. Multiple valve actuators 3370-3377 enable the opening and closing of respective valves 3380-3387. In FIG. 17, the first valve 3380 is shown open, and the remaining valves 3381-3387 are shown closed. Opening of the first valve 3380 causes a vacuum to be formed within a first vacuum clamping strip 90 forming the first segment of the segmented vacuum clamp. A first flexible hose connects the first vacuum clamping strip 90 to the first valve 3380 to selectively supply vacuum to it. The other valves 3381-3387 are similarly connected to the vacuum clamping strips 91-97 through respective flexible tubes 3391-3397. FIG. 19 is a top view through cross-section B-B of FIG. 17 of the eight vacuum clamping strips 90-97 and flexible tubes 3390-3397 in FIGS. 17 and 18.

The eight vacuum clamping strips 90-97 attach directly to the array of solar cells 3306 of FIG. 17. Porous separation layers 3310 separate the solar cells 3306 and mother wafers 3302 held on a support 3307. Each of the vacuum clamping strips 90-97 is activated by respective vacuum actuators 3370, 3371, . . . 3377 and is attached to one or more mechanical actuators (not shown) capable of moving clamping strips 90-97 individually in a vertical up-down motion, as shown in FIG. 18.

In an alternative embodiment, a semi-rigid glue layer may be positioned between the vacuum clamping strips 90-97 and the solar cells 3306, similar to the arrangement of FIGS. 14 and 15.

The side cross-sectional view of FIG. 18 illustrates the initiation of peeling of the solar cells 3306 (not covered by a semi-rigid glue layer in this illustration) from the support substrate 3302 by separation of a porous layer 3310. Upwards arrow 3389 represents a vertical pulling motion of a mechanical actuator (not shown) attached to the first vacuum clamping strip 90. Due to the vacuum clamping action between the first vacuum clamping strip 90 and the leftmost solar cell(s) in solar cell array 3306, when the first vacuum strip 90 is pulled up by the actuator, the leftmost solar cell(s) are also pulled up as shown by separation (peeling) 3404. The remaining vacuum clamping strips 91-97 are actuated in the sequence 91, 92, . . . 97 by the sequential opening of other valves 3381-3387 by the respective vacuum actuators 3371-3377 in the sequence 3381, 3382, . . . 3387. Mechanical actuators (not shown) attached to clamping strips 91-97 pull up on strips 91-97 in the sequence 91, 92, . . . 97, thereby creating a peeling action from left to right in the figure to separate the array of solar cells 3306 from the support substrate 3302.

Manufacturing Sequences

Figure 24:
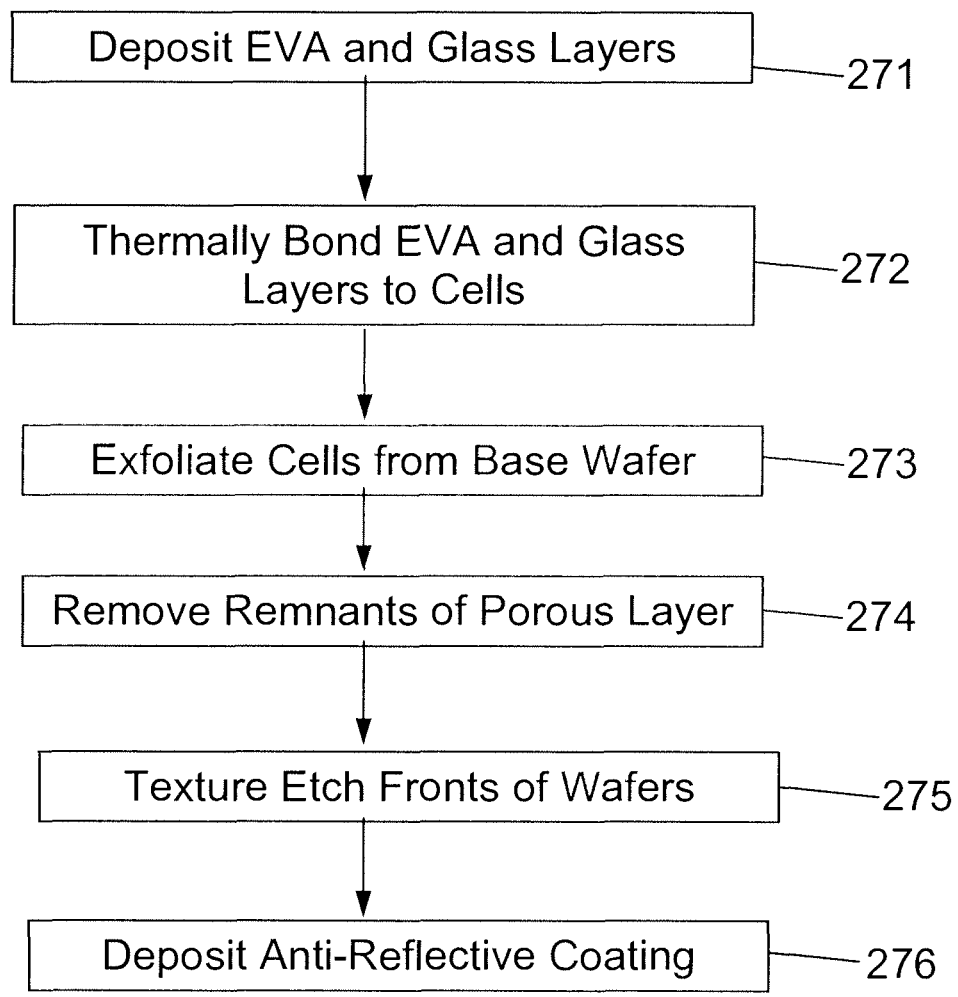
FIG. 24 is a flow chart of the final part of a manufacturing process for solar panels using PV cells with backside contacts only.
Figure 25:
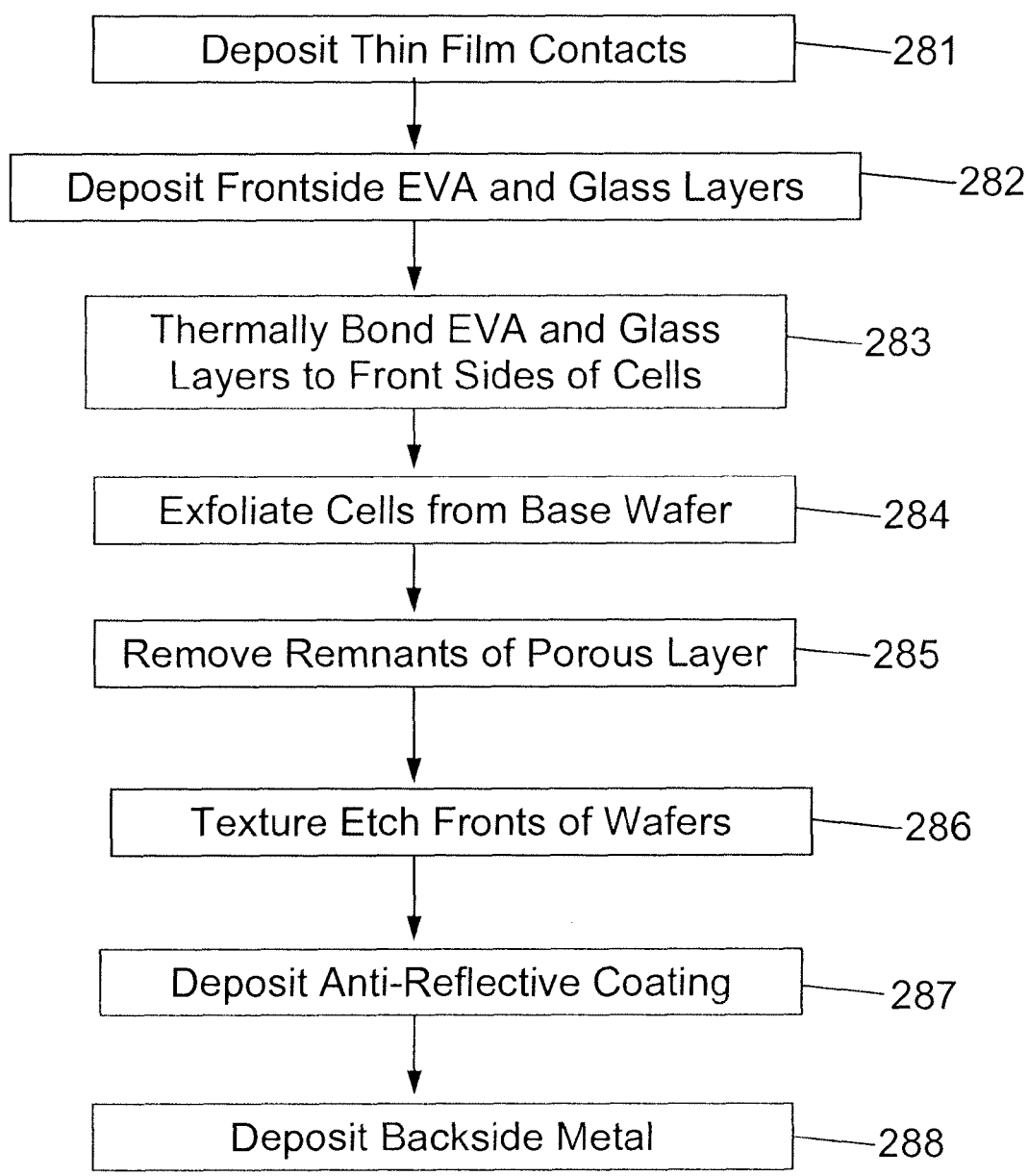
FIG. 25 is a flow chart of the final part of a manufacturing process for solar panels using PV cells with frontside and backside contacts.

Several alternative processing sequences can be used in the manufacture of solar cell assembly of the present invention. Four alternative sequences are illustrated in FIGS. 20-23 for the first part of the overall manufacturing process and two alternative sequences are illustrated in FIGS. 24 and 25 for the last part of the manufacturing process. Any of the sequences described in FIGS. 20-23 may be used with either of the sequences in FIGS. 24 and 25.

Figure 8:
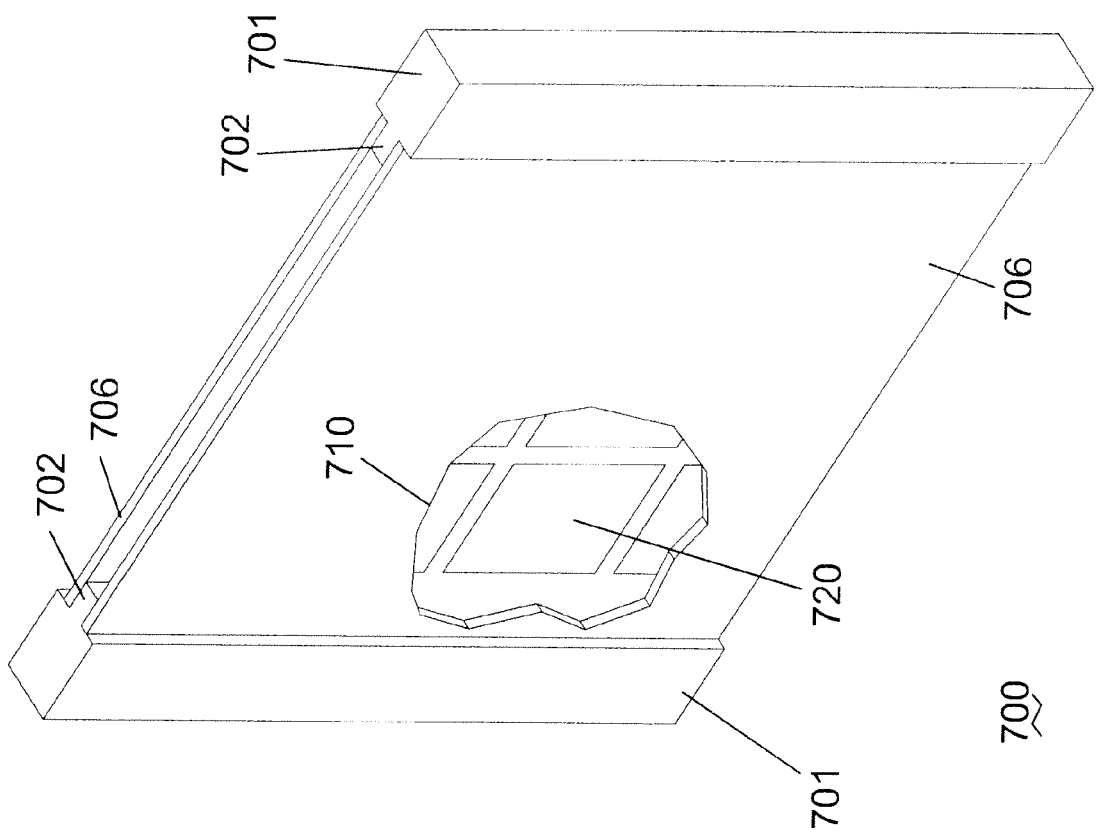
FIG. 8 is a schematic isometric view of a wafer sleeve comprising two susceptors, each with a multiplicity of wafers attached thereto.
Figure 20:
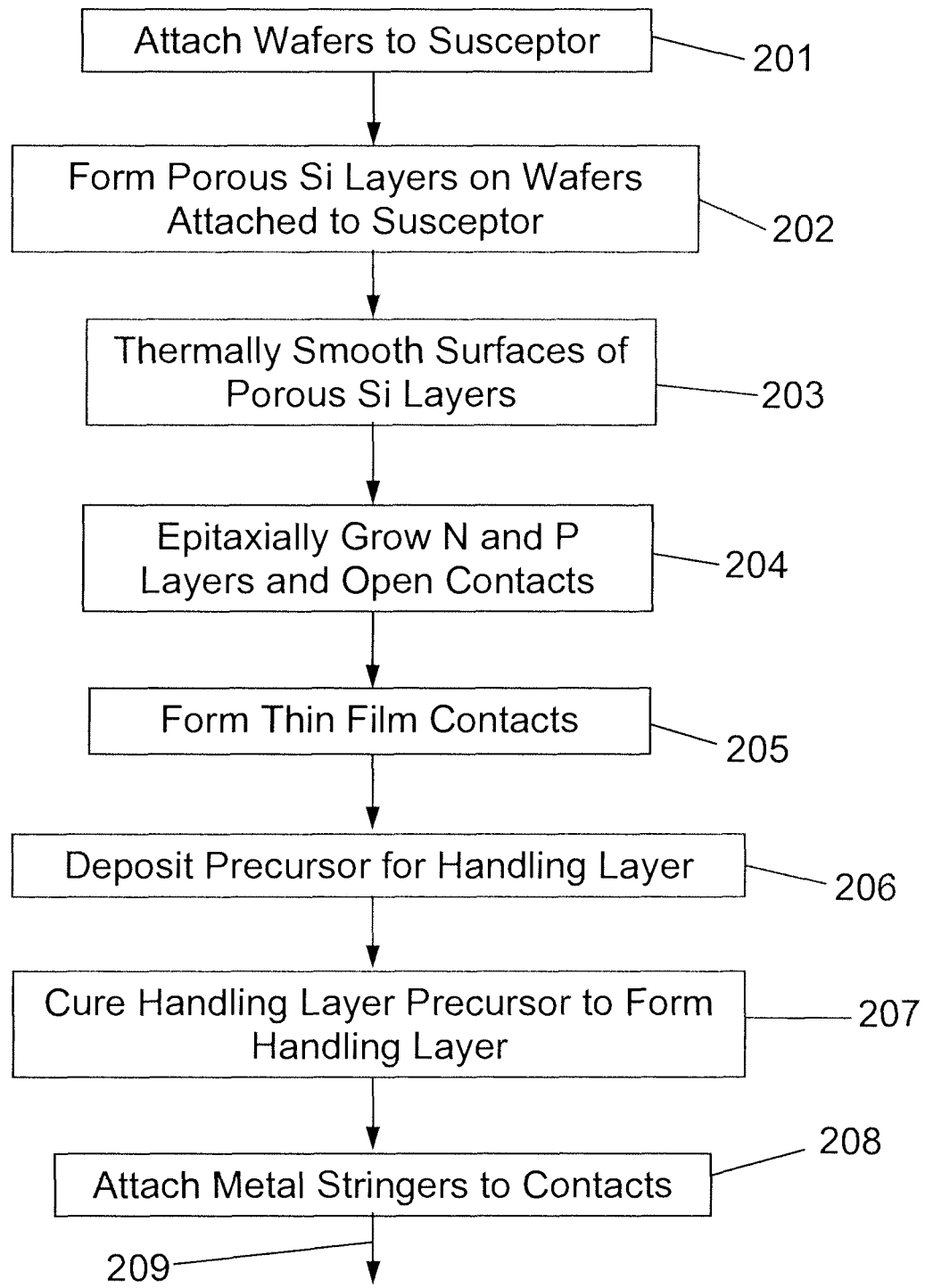
FIG. 20 is a flow chart of the first part of a manufacturing process for solar panels in a first embodiment of the present invention.

Embodiment 1: Attachment of the Wafers Prior to Formation of the Porous Layer, with the Use of Thin Film Contacts The flow chart of FIG. 20 illustrates a first embodiment of the first part of a manufacturing process for solar panels. In this process, in step 201, a number of mother wafers are attached to a susceptor, as described in FIGS. 2-4 above. The number of mother wafers may correspond to the full number of PV wafers in a solar panel or a fraction of the full number. Next, in step 202, porous silicon layers are formed on the surfaces of all the mother wafers using an anodization system such as that shown in FIGS. 5 and 6. One or more susceptors are then mounted into a wafer sleeve as shown in FIG. 8, which is designed to interface with an epitaxial reactor such as that described in U.S. patent application Ser. No. 12/392, 448.

In step 203, the wafer sleeve comprising one or more susceptors loaded with mother wafers is heated to thermally smooth the surfaces of the porous silicon layers. This thermal smoothing process provides a sufficiently smooth and crystalline surface on which to grow the n-type and p-type layers comprising the PV cells. In the first part of step 204, epitaxial deposition processes fabricate the PV cells on top of the smoothed porous silicon layer.

After the wafer sleeve is cooled and removed from the epitaxial reactor or diffusion furnace, the wafer sleeve is disassembled to enable, in the second part of step 204, contact holes to be formed to the n-type and p-type layers of the cells. In step 205, thin film contacts are then formed on the surfaces of all the wafers attached to the respective susceptor.

Then, in step 206, the precursor for the handling layer is deposited on the wafer surfaces on the sides which correspond to what will be the back sides of the completed PV cells. Next, in step 207, the handling layer is formed by heating the handling layer precursor material deposited in step 206. In a variation on this processing sequence, the handling layer precursor of step 206 may be omitted. In step 208, metal stringers are then soldered or otherwise attached electrically to the contacts on the wafers as shown for the structure in FIG. 13.

Arrow 209 indicates that the solar panel fabrication process continues with the process of either FIG. 24 or 25, depending on the type of PV cells used (see below).

Figure 21:
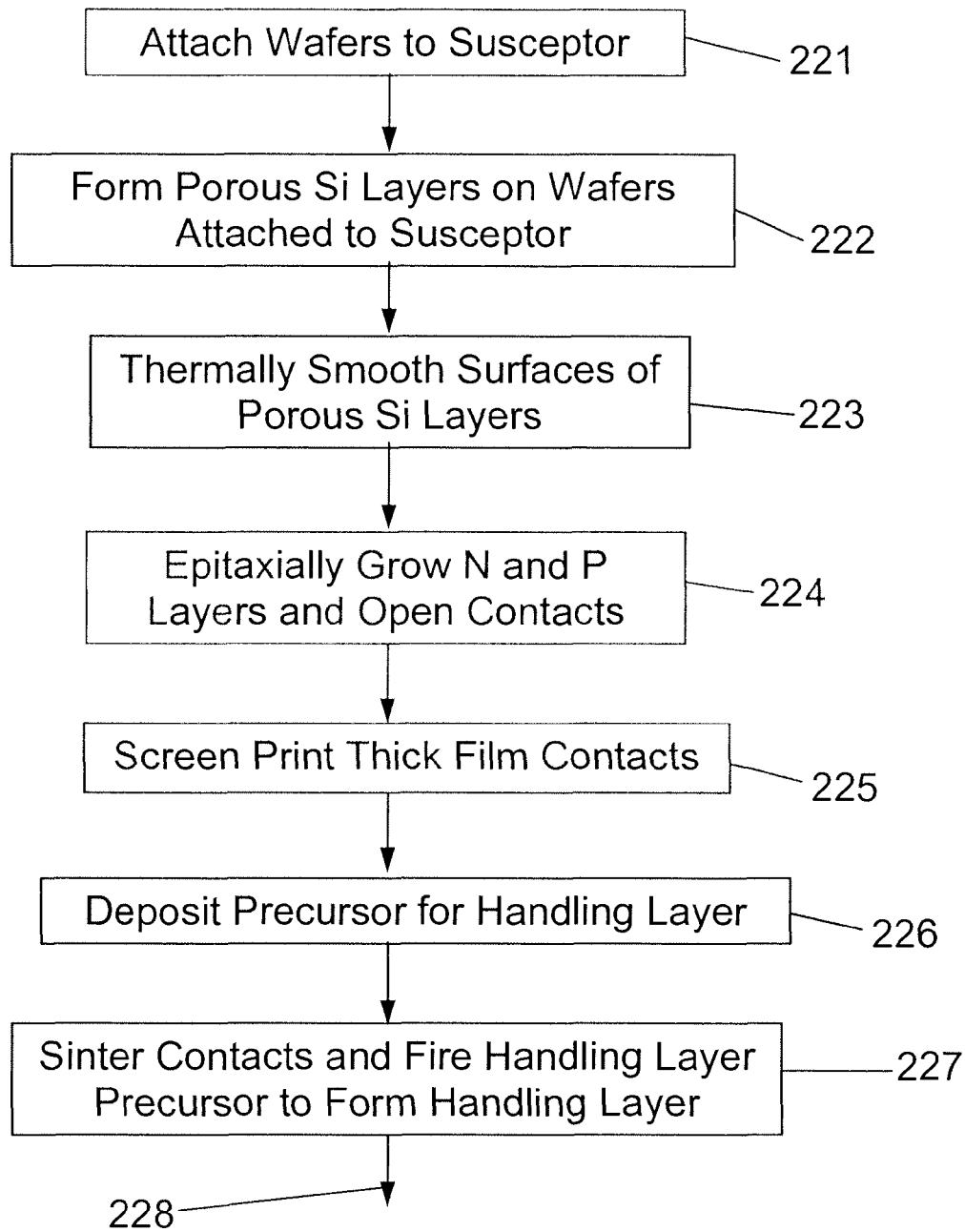
FIG. 21 is a flow chart of the first part of a manufacturing process for solar panels in a second embodiment of the present invention.

Embodiment 2: Attachment of the Wafers Prior to Formation of the Porous Layer with the Use of Thick Film Contacts The flow chart of FIG. 21 illustrates a second embodiment of the first part of a manufacturing process for solar panels. In this process, in step 221, a number of mother wafers are attached to a susceptor, as described above for FIGS. 2-4. The number of mother wafers may correspond to the full number of PV wafers in a solar panel or a fraction of the full number. Next, in step 222, porous silicon layers are formed on the surfaces of all the mother wafers using an anodization system such as that shown in FIGS. 5 and 6. One or more susceptors are then assembled into a wafer sleeve as shown in FIG. 8, which is designed to interface with an epitaxial reactor such as that described in U.S. patent application Ser. No. 12/392, 448.

In step 223, the wafer sleeve comprising one or more susceptors loaded with mother wafers is then heated to thermally smooth the surfaces of the porous silicon layers. This thermal smoothing process provides a sufficiently smooth and crystalline surface on which to grow the n-type and p-type layers comprising the PV cells. In step 224, epitaxial deposition processes are used to fabricate the PV cells on top of the smoothed porous silicon layer and contact holes are formed to the n-type and p-type layers of the cells.

After the wafer sleeve is cooled and removed from the epitaxial reactor or diffusion furnace, the wafer sleeve is disassembled to enable in step 225 thick film contacts to be screen printed on the surfaces of all the wafers attached to the susceptors. In the process of FIG. 21, the screen printing process deposits thick film contacts not requiring the later attachment of metal stringers.

In step 226, the precursor for the handling layer is deposited on the wafer surfaces, on the sides which correspond to what will be the back sides of the completed PV cells. Next, in step 227, the handling layer is formed by heating the handling layer precursor material. Simultaneously, the metal contacts to the wafers are sintered to make good ohmic contact. In a variation on this processing sequence, the handling layer precursor may be omitted, in which case step 227 corresponds solely to the sintering of the metal contacts.

Arrow 228 indicates that the solar panel fabrication process continues with the process of either FIG. 24 or 25, depending on the type of PV cells used.

Embodiment 3: Attachment of the Wafers after the Formation of Porous Layers on Each Wafer with the Use of Thin Film Contacts The flow chart of FIG. 21 illustrates a third embodiment of the first part of a manufacturing process for solar panels. In this process, in step 241, porous silicon layers are first formatted on the surfaces of each individual mother wafer using an anodization system such as that shown in FIG. 7. Next, a number of mother wafers are attached to a susceptor in step 242, as described above for FIGS. 2-4. The number of mother wafers may correspond to the full number of PV wafers in a solar panel or a fraction of the full number. One or more susceptors are then assembled into a wafer sleeve as shown in FIG. 8, which is designed to operate in an epitaxial reactor. The wafer sleeve comprising one or more susceptors loaded with mother wafers is then heated in step 243 to thermally smooth the surfaces of the porous silicon layers. This thermal smoothing process provides a sufficiently smooth and crystalline surface on which to grow the n-type and p-type layers forming the PV cells. In step 244, epitaxial deposition processes are used to fabricate the PV cells on top of the smoothed porous silicon layer, and contact holes are formed to the n-type and p-type layers of the cells.

After the wafer sleeve is cooled and removed from the epitaxial reactor or diffusion furnace, the wafer sleeve is disassembled to enable, in step 245, thin film contacts to be formed on the surfaces of all the wafers attached to the respective susceptors.

Prior to attachment of the stringers, in step 246, the precursor for the handling layer is deposited on the wafer surfaces, on sides which correspond to what will be the back sides of the completed PV cells. Next, in step 247, the handling layer is formed by heating the handling layer precursor material. In a variation on this processing sequence, the handling layer precursor may be omitted. In step 248, metal stringers are then soldered or otherwise attached electrically to the contacts on the wafers as shown in FIG. 13.

Arrow 249 indicates that the solar panel fabrication process continues with the process of either FIG. 24 or 25, depending on the type of PV cells used.

Embodiment 4: Attachment of the Wafers after the Formation of Porous Layers on Each Wafer, with the Use of Thick Film Contacts The flow chart of FIG. 23 illustrates a fourth embodiment of the first part of a manufacturing process for solar panels. In this process, in step 261, porous silicon layers are first formed on the surfaces of each individual mother wafer using an anodization system such as that shown in FIG. 7. Next in step 262, a number of mother wafers are attached to a susceptor, as described above for FIGS. 2-4. The number of mother wafers may correspond to the full number of PV wafers in a solar panel or a fraction of the full number. One or more susceptors are then assembled into a wafer sleeve as shown in FIG. 8, which is designed to operate with an epitaxial reactor such as that previously described.

In step 263, the wafer sleeve comprising one or more susceptors loaded with mother wafers is then heated to thermally smooth the surfaces of the porous silicon layers. This thermal smoothing process provides a sufficiently smooth and crystalline surface on which to grow the n-type and p-type layers forming the PV cells. In step 264, epitaxial deposition processes are used to fabricate the PV cells on top of the smoothed porous silicon layer and contact holes are formed to the n-type and p-type layers of the cells.

After the wafer sleeve is cooled and removed from the epitaxial reactor, the wafer sleeve is disassembled to enable, in step 265, thick film contacts to be screen printed 265 on the surfaces of all the wafers attached to the susceptors. In the process of FIG. 23, the screen printing process deposits thick film contacts not requiring the later attachment of metal stringers.

In step 266, the precursor for the handling layer is deposited on the wafer surfaces, on sides which correspond to what will be the back sides of the completed PV cells. Next, in step 267, the handling layer is formed by heating the handling layer precursor material. Simultaneously, the metal contacts to the wafers are sintered to make good ohmic contact. In a variation on this processing sequence, the handling layer precursor of step 266 may be omitted, in which case step 267 corresponds solely to the sintering of the metal contacts.

Arrow 268 indicates that the solar panel fabrication process continues with the process of either FIG. 24 or 25, depending on the type of PV cells used.

Completion of Solar Panel Using Backside Contact PV Cells

After the completion of the first part of the manufacturing processes of FIG. 20, 21, 22 or 23, one of two processes may be used for the second part depending on the type of partial cell completed in the first part.

The flow chart of FIG. 24 illustrates a first embodiment for the second part of the manufacturing processing for completing a solar panel in the case where backside contact PV cells were fabricated in the first part of the manufacturing process. The array of wafers containing the PV cell structures on their upper surfaces are still attached to the susceptor at this point. In step 271, a glue layer, such as EVA, is laid across the full array of wafers with a glass layer on top of it. If a handling layer was formed in one of the manufacturing sequences illustrated in FIGS. 21-23, then the EVA layer is on top of the handling layer, and in step 272, the EVA bonds the glass layer to the top surface of the handling layer as shown in FIG. 12. In the alternative case where the handling layer was not formed on top of the wafers, in step 272, the EVA bonds the glass layer to the top surface of the PV cells as shown in FIG. 10.

Next, in step 273, the susceptor mounting the mother wafers and PV cells and the EVA and glass layers is placed in an exfoliation system such as those illustrated in FIGS. 14-19. The exfoliation process leaves a portion of the porous silicon layer remaining on the top surfaces of the PV cells which are attached to the EVA and glass layer. This remnant porous layer is removed in step 274 by conventional etch processes as is familiar to those skilled in the art. To enhance the light collection efficiency of the solar panel, in step 275, the front sides of the wafers are texture etched to form a surface which, when combined with the anti-reflective coating deposited in step 276, minimizes the reflection of light and thus improves the light collection efficiency for the solar panel.

Completion of Solar Panel Using Frontside and Backside Contact PV Cells

The flow chart of FIG. 24 illustrates a second embodiment for the second part of the manufacturing process for completing a solar panel in the case where both emitter and collector contacts were fabricated in the first part of the manufacturing process. At this point, the array of wafers containing the PV cell structures on their upper surfaces is still attached to the susceptor. In step 281, thin film contacts are deposited on the exposed front sides of the PV cells in the solar panel being fabricated. Next, in step 283, a frontside EVA layer and glass layer are laid across the panel and then thermally bonded to the front sides of the PV cells.

Next, in step 284, the susceptor containing the mother wafers and PV cells and the EVA and glass layers on top is placed in an exfoliation system such as those illustrated in FIGS. 14-19. The exfoliation process leaves a portion of the porous silicon layer remaining on the top surfaces of the PV cells, which are attached to the EVA and glass layer. In step 285, this remnant porous layer is removed by conventional etch processes familiar to those skilled in the art. To enhance the light collection efficiency of the solar panel, in step 286, the front sides of the wafers are texture etched to form a surface which, when combined with the anti-reflective coating deposited in step 287 minimizes the reflection of light and thus improves the light collection efficiency for the solar panel.

Finally, in step 288, backside metal is deposited to form the contacts to the backsides of the PV cells in the array. In step 289, strengthening layers are then deposited on the solar panel.

Module Configuration and Packaging

The support substrate attached with polymer adhesive film in the proceeding descriptions serves merely to provide mechanical support and environmental protection to the solar cell.

In one preferred embodiment, for the IBC cell type, the contacts to the cell are first made at discrete pad or via locations, by thin or thick film means, and the bus bars or fingers are made on a polymeric film or board, prior to bonding to the epitaxial silicon layer with EVA-type of glue. These bus bars are joined electrically to the appropriate pads on the cell during the lamination process. Forming the interconnection patterns on the flexible polymer film or substrate, or on a large glass plate, allows for it to be made offline, enabling significant reductions in the processing time on the source wafers, so that they can be made available for the next epitaxial film growth faster. Also, defective conductor patterns on the film can be repaired or sorted out, prior to placing them on the much more expensive epitaxial layers. The metallization for the interconnections can be made from sputtered metals such as tin coated chromium-copper, titanium-tungsten-copper, tin-coated copper, such as used in the printed wiring board industry. The material for joining of the cell to the bus bars has to be carefully chosen to enable good reliable ohmic contacts when cold pressed on to the contact pads or vias in the epitaxial layer. Examples of such metallization include silver or gold powders or flakes mixed with a polymeric material. The polymeric material used in the conductor pastes can be the same as the glue material used to attach the interconnection film or substrate to the epitaxial layer.

One great advantage of fabricating the contact and interconnection layers on the flexible film is that it can carry the interconnections, not just for a single epitaxial wafer, but for an entire solar panel consisting of several such epitaxial silicon wafers, placed in a pre-arranged array configuration. In combination with the peeling methods described above, which can be scaled to peel the films simultaneously from an array of source wafers, this invention may provide an unprecedented increase in productivity.

Glass/Ceramic Handling Layers

As described above, the handling layer is formed on the thin solar cells prior to separation of the solar cells from the silicon substrate. The handling layer provides a rigid backbone for the thin solar cells, protecting the thin solar cells during separation from the mother wafer and subsequent handling. An example of a handling layer 809 is shown in FIG. 11, where the thin solar cell is still attached to the silicon mother wafer 801. The handling layer is integral with the thin solar cell—it is formed on the thin solar cell and as such does not require an adhesive layer (such as a glass, metal or polymer) to attach to the thin solar cell.

The term glass/ceramic handling layer is used herein to refer to handling layers comprising glass, glass-bonded ceramic or glass-ceramic. Glass/ceramic handling layers are generally opaque and consequently will be on the back surface of the thin solar cell—the side facing away from the sun. Glass/ceramic handling layers allow for back contacts, as described in detail below, where the contacts and handling layer are both formed on the same back side of the thin solar cell. Furthermore, a glass/ceramic handling layer on the back side of a thin solar cell may be combined with electrical contacts on both sides of the solar cell.

The glass/ceramic handling layer may be fabricated on a silicon solar cell by an in-situ process involving applying powders of glass, ceramics, or mixtures thereof on the surface of the cell, and sintering at elevated temperatures, the glass softening enough to slump or flow on the solar cell surface to wet and bond to it. The powders may be applied using a variety of techniques, such as paste dispensing and application of green tape, which are described in more detail below. The general requirements for the glass/ceramic materials used for the handling layer are:

a) the coefficient of thermal expansion, CTE, is preferably equal to, or slightly (no more than 25%) higher than that of silicon, although a CTE upto 5% less than that of silicon may be tolerated (see below);
  b) sinters well at temperatures below the melting point of silicon, and preferably in the temperature range of 700° C.-1000° C.;
  c) non-reactive with silicon at the sintering temperatures;
  d) contains no deleterious impurities that can diffuse into and degrade the solar cell performance;
  e) mechanically strong to minimize thickness, resist bowing and resist fracture due to differential thermal contraction during formation. The strength of glass-ceramic materials is greater than 200 MPa;

f) able to withstanding handling, thermal excursions and chemical exposure involved in solar cell fabrication;

g) when integral back contacts are used, the handling layer is required to be an insulator;

h) when using silver paste to fabricate electrical contacts, the handling layer is preferably cofireable with the silver paste in the temperature range of 850° C.-950° C.; and i) very low cost for solar cell application.

Although matched CTEs of the handling layer and the silicon solar cell are preferred, a handling layer with a slightly higher CTE is acceptable if it is made thick enough to avoid warping. If the CTE of the handling layer is too high (say>25% above that of silicon), the ceramic may fracture from the resulting high tensile stress. When the CTE of the handling layer is higher than that of the silicon the solar cell will warp. It is advantageous to use just the minimum handling layer thickness needed to obtain an unwarped wafer, to minimize material costs, and to make a bonded silicon solar cell fit in the same cell fabrication tools and equipment that are used for cells of conventional thickness.

Furthermore, it is desirable that the handling layer not induce tensile stress in the silicon that exceeds its breaking strength, as measured at its modulus of rupture. For this reason it may be desired to keep the silicon in compression, and to deal with camber by increasing the thickness of the handling layer, as described above. The rupture strength of silicon varies widely with crystallographic orientation. The wafer is lowest in strength in 110 directions and highest in 111 directions. Wafers cut parallel to the (111) planes can withstand the largest tensile stress induced by the handling layer. The stress induced in the silicon, for a given thicknesses of the handling layer and silicon, is proportional to the difference in CTE of the two, $\Delta\acute{\alpha}$, and $\Delta T$, the temperature at which the two are bonded together. If $\Delta T$ is low, which would be the case if the glass component of the handling has a low set point, it follows that the stress induced, tensile or compressive in silicon, will be low. If the stress is tensile in silicon, and does not exceed the rupture strength of the silicon, it is still safe to use the handling layer even with its CTE<CTE of silicon. A combination of (a) thinner handling layer, (b) low $\Delta T$ for the glass component of the handling layer, and (c) wafers cut parallel to (111) planes, should allow the use of handling layers with CTE about 5% lower than that of silicon.

More details of the glass/ceramic materials—glasses, glass-bonded ceramic and glass-ceramic—are provided below.

Glass handling layers may be formed from certain non-devitrifying glass powders, which upon heating to temperatures above the softening point, $T_s$, densify by coalescence, while also wetting and bonding to oxidized silicon surfaces. These glasses are typically reflowed at temperature in the range of 50-150° C. above their glass softening points. Some examples of suitable glasses include certain borosilicate glasses with CTE close to that of silicon, such as Corning's Pyrex™, Corning-7070, or Schott's Borofloat™. However, these glasses have lower strength than may be desired and glasses such as soda-lime silica glasses generally have a CTE that is too large for matching with the silicon solar cell.

The term glass-bonded ceramic refers to materials in which a glassy phase wets and bonds ceramic particles to form a dense body. To produce the dense glass-bonded ceramic, the ceramic content is typically 40% by volume. Glass-bonded ceramic materials are used in producing low temperature co-fired ceramic (LTCC) substrates which are widely used in the semiconductor industry for chip packaging. However, glass-bonded ceramic materials generally have significantly higher CTEs than silicon. Some examples of glass-bonded ceramic materials include:

a) alumina (~40 volume %)+glass such as soda-lime silica, Corning's Pyrex™ Corning-7070 and lead-borosilicates;

b) mullite, which is 2 parts $Al_2O_3$ combined with 3 parts $SiO_2$, (~40 Volume %)+glass such as soda-lime silica, Corning's Pyrex™, Corning-7070 and lead-borosilicates;

c) cordierite (~40 volume %)+glass such as soda-lime silica, Corning's Pyrex™ Corning-7070 and lead-borosilicates; and d) silicon carbide+lithium-aluminosilicate glass (with low coefficient of thermal expansion).

Silicon carbide may also be used as a low CTE filler in these glass composites.

The term glass-ceramic refers to glasses of certain ternary oxide compositions that, when heated to elevated temperatures, sinter and crystallize to yield dense ceramic structures. Powders of these glass compositions form predominantly low expansion crystalline phases, such as cordierite, beta-euryptite, spodumene, and celsian. The conversion to crystalline state is nearly complete, yielding glass-ceramics having a CTE in the range of 3.0-3.5 ppm/° C. These glasses typically sinter in the temperature range from 750° C.~1000° C., allowing for co-sintering with thick film silver conductor inks used in solar cells. For these reasons, glass-ceramics with desired CTE, refractoriness, and high strength are the preferred materials for fabricating handling layers. Some examples of glasses for forming desirable glass-ceramics include: MgO—$Al_2O_3$—$SiO_2$ glasses with composition ranges given in Table 1 of U.S. Pat. No. 4,301,324 to Kumar et al., incorporated in its entirety herein; $Li_2O$—$Al_2O_3$—$SiO_2$ glasses such as those given in Table 2 of U.S. Pat. No. 4,301,324; and $Al_2O_3$—$SiO_2$—$B_2O_3$ glasses such as those provided in Table 3.

The CTE and the thickness of the handling layer are chosen so that the handling layer, which is formed on the silicon solar device, induces a compressive stress in the silicon, while avoiding excessive tensile stress in the handling layer, over the temperature range from the set point (highest processing temperature of the handling layer on the silicon solar cell) to ambient temperatures. In this regard, the MgO—$Al_2O_3$—$SiO_2$ glass-ceramic system is a good candidate since it covers a wide range of possible CTEs by varying the MgO content of the glass. See Kumar et al., International Journal for Hybrid Microelectronics, Vol. 14, No. 4, December 1991. Glasses of the MgO—$Al_2O_3$—$SiO_2$ system with MgO content in the range of 20%—25% were tested, and among them the compositions that gave rise to the lowest curvature when attached to thin, epitaxial silicon solar cells of about 50 microns in thickness, were selected. The applicable compositions were further narrowed down to glasses with the three main ingredients constituting 95% by weight, in the following ranges (in wt. %): MgO-20-25, $Al_2O_3$-18-24, and $SiO_2$ 50-55, with the remaining 5 wt. % consisting of one or more additives $TiO_2$, $ZrO_2$, $B_2O_3$, and $P_2O_5$, which modify the sintering and nucleation characteristics of the glass powders. Some exemplary compositions are shown in Table 1, where the compositions are given as weight percentages.

TABLE 1

Exemplary Compositions of Glass-Ceramics for the Handling Layer

| | Wt. % | | | | | |
|---|---|---|---|---|---|---|
| | MgO | $Al_2O_3$ | $SiO_2$ | $B_2O_3$ | $ZrO_2$ | $P_2O_5$ |
| Sample 1 | 22 | 22 | 52.5 | 2 | 0.5 | 1 |
| Sample 2 | 20 | 21 | 55 | 2 | 0 | 2 |
| Sample 3 | 24 | 19 | 52 | 5 | 0 | 0 |
| Sample 4 | 24.2 | 21.2 | 50.6 | 2 | 0 | 2 |
| Sample 5 | 22 | 22 | 52.5 | 0.5 | 1.5 | 1.5 |

Although glass-ceramic materials may be preferred for fabrication of handling layers, fabrication of handling layers using glasses and glass-bonded ceramics still have advantages over the prior art.

Before describing the details of deposition and processing of glass/ceramic materials on the silicon solar cells, conditioning of the silicon surface is described. The glass/ceramic materials will not adhere to bare silicon. However, a thin boundary layer of silicon oxide, silicon nitride or alumina—at least 20 nm thick, to survive the sintering process, and typically 30 to 100 nm thick—is grown on the silicon surface. (The thickness of a silicon oxide boundary layer after sintering is typically 10 nm or greater.) The preferred method for growing the silicon oxide is thermal oxidation in wet oxygen, the preferred method for growing the nitride is PECVD, and the preferred method for growing alumina of atomic layer deposition (ALD). These methods are preferred based on a consideration of strong adhesion to the silicon, good insulating properties and compatibility with semiconductor processing. Note that it is important for the boundary layer to survive the formation of the handling layer, since the boundary layer can act to passivate the silicon surface which is necessary for increasing the quantum yield of the solar cell. Furthermore, the boundary layer may act as a diffusion barrier for impurities from the handling layer.

More details of the glass/ceramic deposition methods on the silicon solar cells are provided below. Note that at this stage of the process the silicon solar cell structures are still attached to the mother wafer and may require significant further processing before they are functional as solar cells. For ease of deposition, glass/ceramic powders are often mixed with binders, solvents, dispersants and/or plasticizers and are used in the following forms: green (unfired) tape; pastes or slurries; or suspensions in solvents or other fluids. The deposition methods include:

(a) for green tape, tape attachment using standard techniques known to those skilled in the art;
(b) for slurries and pastes, direct casting of slurry on the cell and direct deposition of paste on the cell, with preferred methods of screen printing, stencil printing and nozzle deposition;
(c) injection molding of ceramic powder;
(d) centrifugal sedimentation;
(e) electrophoretic deposition; and
(f) plasma-spraying (simultaneous deposition and sintering).

Of these methods, deposition from a nozzle is preferred. Inks/pastes of the glass/ceramic powders very similar to those used for screen printing work well for nozzle dispensing. The paste is squeezed through an x-y programmable nozzle and dispensed on the solar cell surface in the desired pattern. Nozzle dispensing works well for depositing handling layers which include openings. The non-contact nature of nozzle dispensing is advantageous due to the fragility of the thin epitaxial silicon solar cells. Furthermore, the nozzle dispenser's x-y movement is programmable, and easily changed to accommodate design changes. Multiple nozzles may be used to advantage for speeding up the process.

Figure 26:
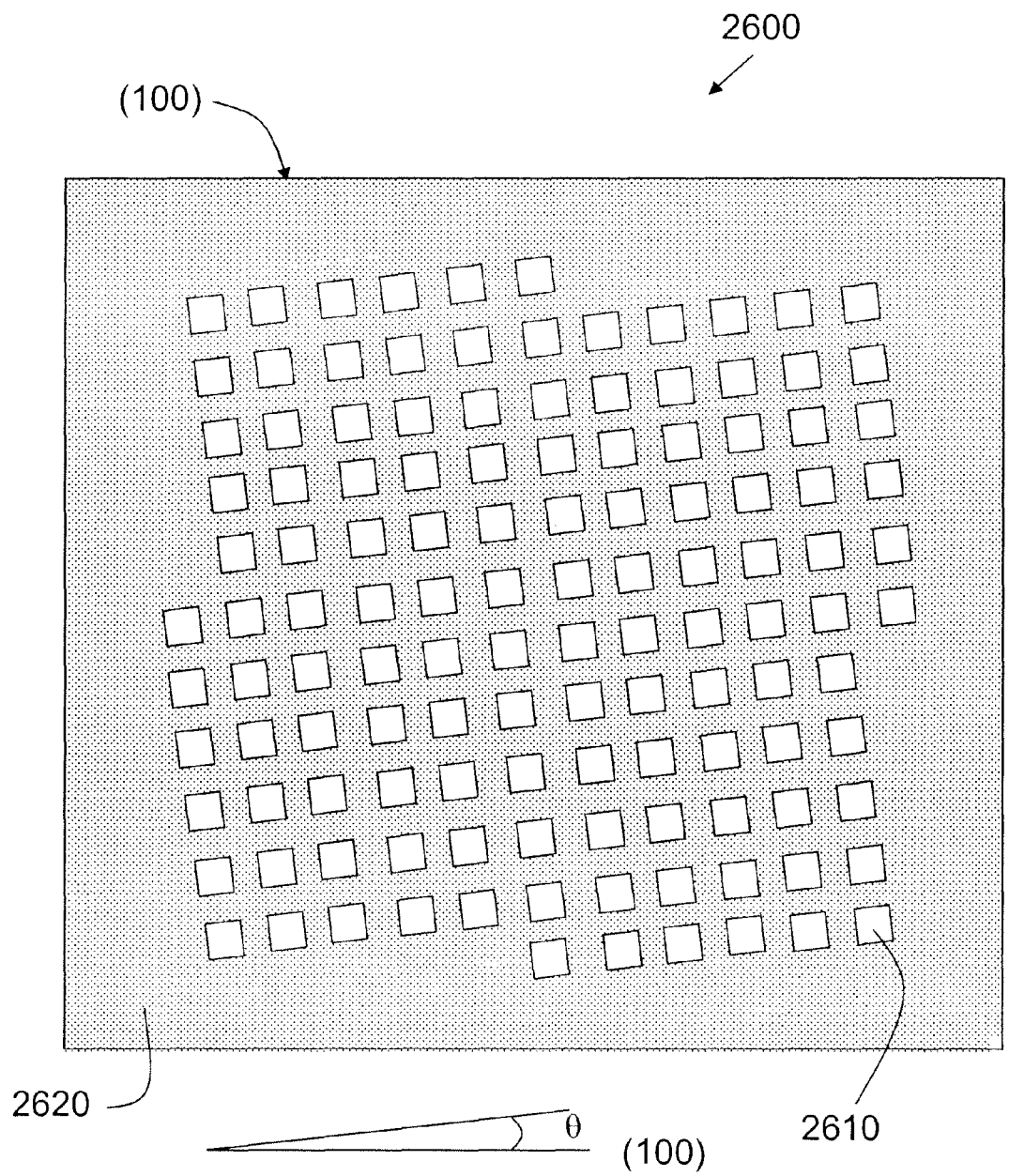
FIG. 26 is top view representation of a solar cell with a waffle-shaped handling layer with square apertures.

Handling layers may be formed as uniform layers, or may be formed into specific structures, such as waffle-shaped handling layers with arrays of openings. FIG. 26 shows a schematic top view of a waffle-shaped handling layer 2600 formed on an epitaxial silicon solar cell, where the handling layer has an array of roughly square openings. For ease of illustration, FIG. 26 is not drawn to scale, but representative dimensions are provided. FIG. 26 shows openings 2610 in the handling layer, which are sized and separated to allow ease of making electrical contact to the backside of the silicon solar cell, while maintaining a mechanically strong handling layer. (Note that not all of the openings are necessarily used for making electrical contact to the solar cell.) Openings 2610 typically have widths in the range of 500 microns to 2 mm, and the center-to-center spacing of openings is typically twice the width of the openings or greater. The handling layer has a border 2620 around the edge of the silicon solar cell, the border 2620 having a typical width of 1 mm. Nozzle dispensing works well for depositing waffle-shaped handling layers. The waffle-shaped handling layer may conveniently be formed by depositing a first set of parallel ridges on the surface of the silicon solar cell, followed by a second set of ridges perpendicular to the first set.

The waffle structure of the handling layer 2600 may be misaligned by a small arbitrary angle, θ, with respect to the underlying cleavage planes of the single crystal epitaxial silicon layers of the solar cell. A misalignment, in the range of 1 to 40 degrees and more typically in the range of 3 to 10 degrees, from the dominant cleavage planes is effective in reducing breakages of the solar cells. The edges of the mother silicon wafer will commonly be defined by (100) crystallographic planes. Consequently the edges of the epitaxial silicon solar cell layers will also be defined by (100) planes, as shown in FIG. 26. The misalignment of the array of openings in the waffle-shaped handling layer and the (100) planes of the underlying epitaxial silicon is defined by the angle θ.

Although a misalignment of the waffle structure of the handling layer to the underlying cleavage planes of the solar cell is preferred, waffle structures are fabricated which are aligned with the cleavage planes for convenience. The probability of a solar cell failure due to cleaving of the silicon in the openings in the waffle structure decreases with the size of the openings. As the size of the openings becomes smaller than roughly 200 to 500 microns the misalignment of the waffle structure with the silicon cleavage planes becomes less important.

Figure 27:
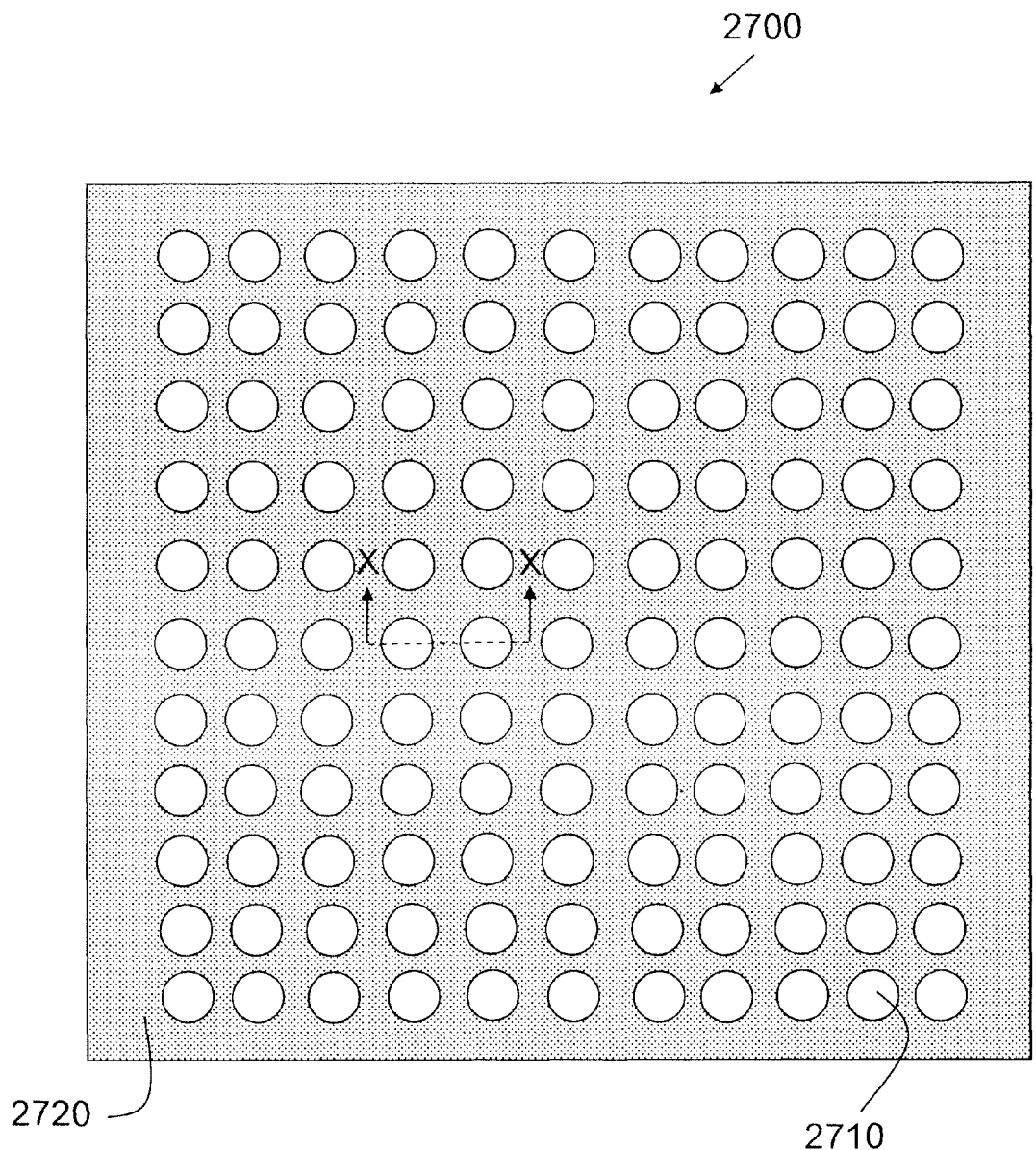
FIG. 27 is a top view representation of a solar cell with a waffle-shaped handling layer with circular apertures.

FIG. 27 shows a schematic top view of a waffle-shaped handling layer 2700 formed on an epitaxial silicon solar cell, where the handling layer has an array of roughly circular openings. For ease of illustration, FIG. 27 is not drawn to scale, but representative dimensions are provided. FIG. 27 shows openings 2710 in the handling layer, which are sized and separated to allow ease of making electrical contact to the backside of the silicon solar cell, while maintaining a mechanically strong handling layer. Openings 2710 typically have widths in the range of 500 microns to 2 mm, and the center-to-center spacing of openings is typically twice the width of the openings or greater. The handling layer has a border 2720 around the edge of the silicon solar cell, the border 2720 having a typical width of 1 mm. Nozzle dispensing works well for depositing waffle-shaped handling layers. With circular apertures in the waffle-shaped handling layer, the waffle structure may be misaligned with respect to the cleavage planes of the solar cell as described above, although misalignment appears not to provide as much of an advantage as it does for the handling layer with square apertures.

After depositing the glass/ceramic powders on the surface of the silicon solar cell, this deposited layer is consolidated and adhered to the solar cell by a high temperature firing or sintering process. Typical process steps include:
- (1) evaporation of solvent from the slurry/paste/tape—typically done at a temperature between room temperature and 200° C.;
- (2) carbonization and burning-off binders, typically done at a temperature between 200° C. and 500° C.; and
- (3) consolidation of the glass/ceramic material and adhesion of the material to the solar cell; this step includes the following changes: coalescence of glass/ceramic powders, followed by nucleation and crystallization of the material to form a dense handling layer.

These steps may be carried out in batch furnaces, belt furnaces or rapid thermal processing (RTP) furnaces, for example. The thickness of the fired handling layer is ordinarily in the range of 5 to 1000 microns and more typically in the range of 250 to 500 microns.

Furthermore, openings may be desired in the handling layer for making electrical contacts to the silicon solar cell or opening windows to allow further processing of the silicon solar cell. (An example of the latter is opening windows in the handling layer to allow the formation of distributed p-n junctions.) Openings may be formed prior to deposition of the handling layer material onto the solar cell surface, during the deposition of the handling layer, after deposition but before firing of the handling layer, or after firing. Some examples of suitable methods include:
- (a) pre-punching or laser-drilling holes in green tape prior to depositing the green tape on the solar cell surface;
- (b) for directly cast slurry or paste, openings may be formed by the casting process itself or by laser ablation of the dried slurry or paste layer;
- (c) slurries and pastes may be injection molded, in the form of layers with openings, directly onto the cell surface;
- (d) after firing, openings may be laser drilled; and
- (e) after firing, openings may be grit blasted.

Figure 28:
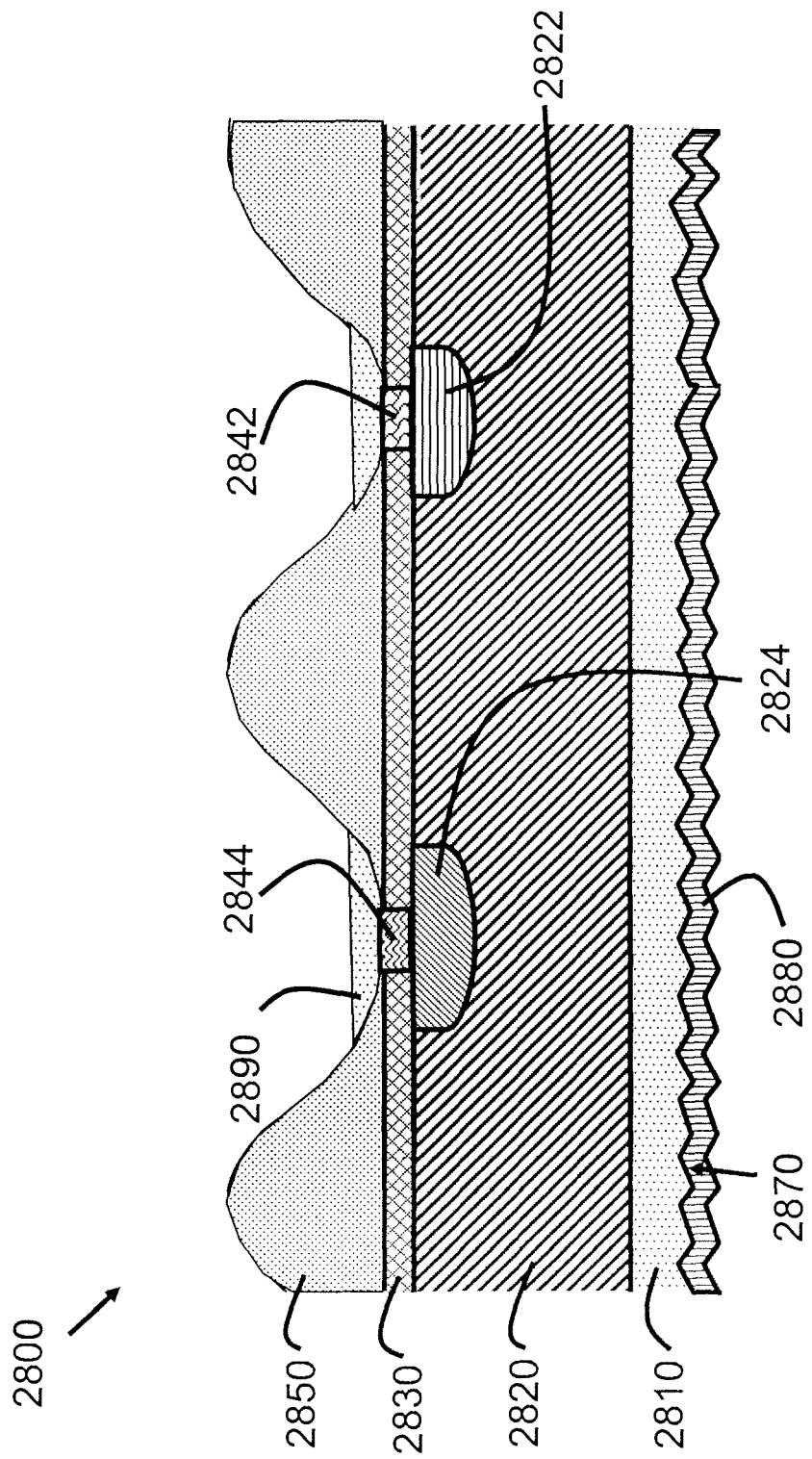
FIG. 28 is a cross-section, along X-X of the solar cell of FIG. 27.

FIG. 28 shows a cross-section 2800 along X-X in FIG. 27 of a waffle-shaped handling layer formed on a solar cell, with the addition of electrical contacts 2890. The waffle-shaped handling layer 2850 has been formed on a stack of thin continuous epitaxial solar cell layers. The stack comprises: a highly-doped silicon layer 2810 and a doped silicon absorber layer 2820. The thickness of the stack is ordinarily in the range of 1 to 100 microns and typically in the range of 25 to 50 microns. Between the handling layer 2850 and the stack is a boundary layer 2830. The thickness of the boundary layer is generally greater than 10 nanometers. The openings in the waffle-shaped handling layer 2850 coincide with electrical contacts 2842 and 2844 to the stack. Electrode fingers 2890 are formed over the handling layer 2850 to make electrical connection to the electrical contacts. The electrode fingers 2890 run perpendicular to the plane of the cross-section. An anti-reflection coating (ARC) 2880 is formed on the textured surface 2870 of the stack. Note that FIG. 28 is an example of an integrated back contact solar cell, in which collector 2822 and emitter 2824 regions of the solar cell are separately contacted by contacts 2842 and 2844, respectively.

Examples of process flows for forming thin epitaxial silicon solar cells with handling layers are provided below, for both an integrated back contact (IBC) cell and a two sided contact cell. These examples are intended to be illustrative and represent only some of the many processes that can be used. Those skilled in the art will appreciate after reading this disclosure and following the teachings and principles of the present invention that many variations of these processes are within the scope of the present invention.

Figure 29:
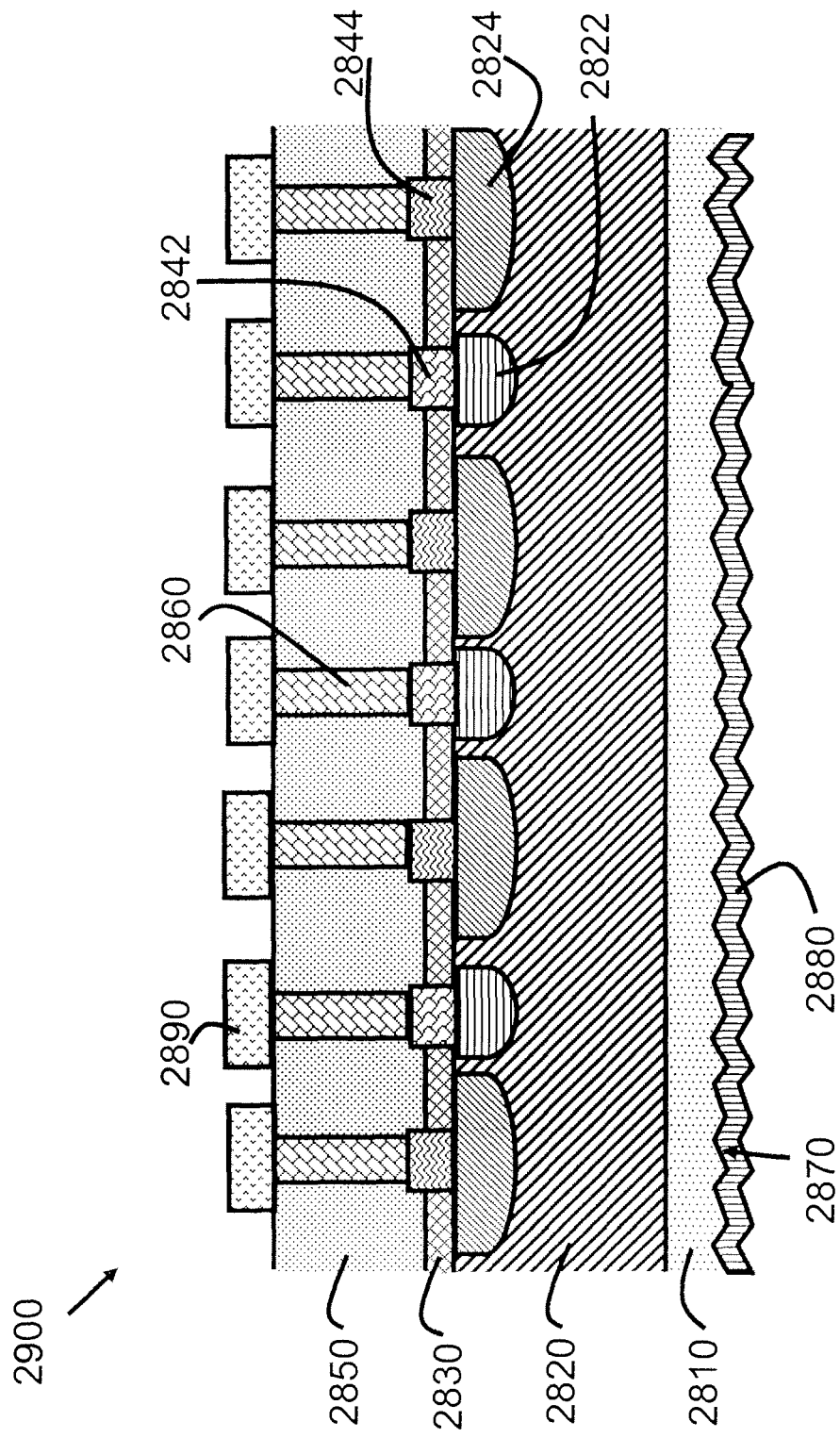
FIG. 29 is a cross-sectional representation of a solar cell with a handling layer and back side contacts.

FIG. 29 shows an integrated back contact (IBC) solar cell with a handling layer according to some embodiments of the present invention. A process flow for the IBC solar cell of FIG. 29 includes:
- (1) form a porous silicon layer on the surface of the mother silicon wafer;
- (2) thermally smooth the porous silicon layer in $H_2$ gas at approximately 1000° C.;
- (3) deposit a highly doped epitaxial silicon layer 2810, such as a p+ layer, over the porous layer;
- (4) deposit an epitaxial silicon absorber layer 2820, such as a p-doped layer;
- (5) form a boundary layer 2830 on the silicon surface, for example by controlled oxidation to form a layer generally greater than 20 nanometers thick and typically in the range of 30 to 100 nm thick—a similar thickness of silicon nitride ($SiN_x$) or alumina may also be used;
- (6) open windows in the boundary layer to define the emitter regions using laser or wet etching through a resist mask;
- (7) diffuse phosphorous into the epitaxial silicon to create emitter regions 2822;
- (8) open windows in the boundary layer, through a resist mask, to define collector regions;
- (9) diffuse boron into the epitaxial silicon to form collector regions 2824;
- (10) screen print Ag—Al paste to pattern collector contacts 2842 and dry the paste pattern;
- (11) screen print Ag paste to pattern emitter contacts 2844 and dry the paste pattern;
- (12) deposit glass-ceramic slurry on the printed electrodes (with openings at electrode locations);
- (13) co-fire the glass-ceramic slurry and the Ag—Al and Ag pastes to form the handling layer 2850 and the cell contacts 2842 and 2844;
- (14) exfoliate the epi-handling layer composite from the mother wafer and send the mother wafer for forming more solar cells;
- (15) etch front side (opposite side to handling layer) of silicon solar cell to form a textured surface 2870;
- (16) deposit an ARC (anti-reflection coating) 2880 on the textured surface 2870; and
- (17) deposit thin film aluminum, aluminum-vanadium alloy, or chromium-copper alloy electrode fingers 2890 through a shadow mask; this deposition may also fill the openings in the handling layer 2850—forming metal portions 2860. (Note that the fingers 2890 run perpendicular to the plane of the figure.)

Note that the handling layer shown in FIG. 29 is an example of a handling layer with a uniform thickness, formed from green tape, for example, in contrast to the waffle shaped handling layer of FIGS. 26-28. Furthermore, openings in the handling layer for making electrical contact through the handling layer to the emitter and collector contacts may be formed using any of the techniques described above. Further note that the emitter and collector regions may be formed by alternative processes, such as epitaxially forming a n+ layer on the absorber layer 2820, followed by etching through the n+ layer where collector areas are needed and then diffusing boron into these areas. (Here the remaining n+ layer is used to form emitter areas.)

Figure 30:
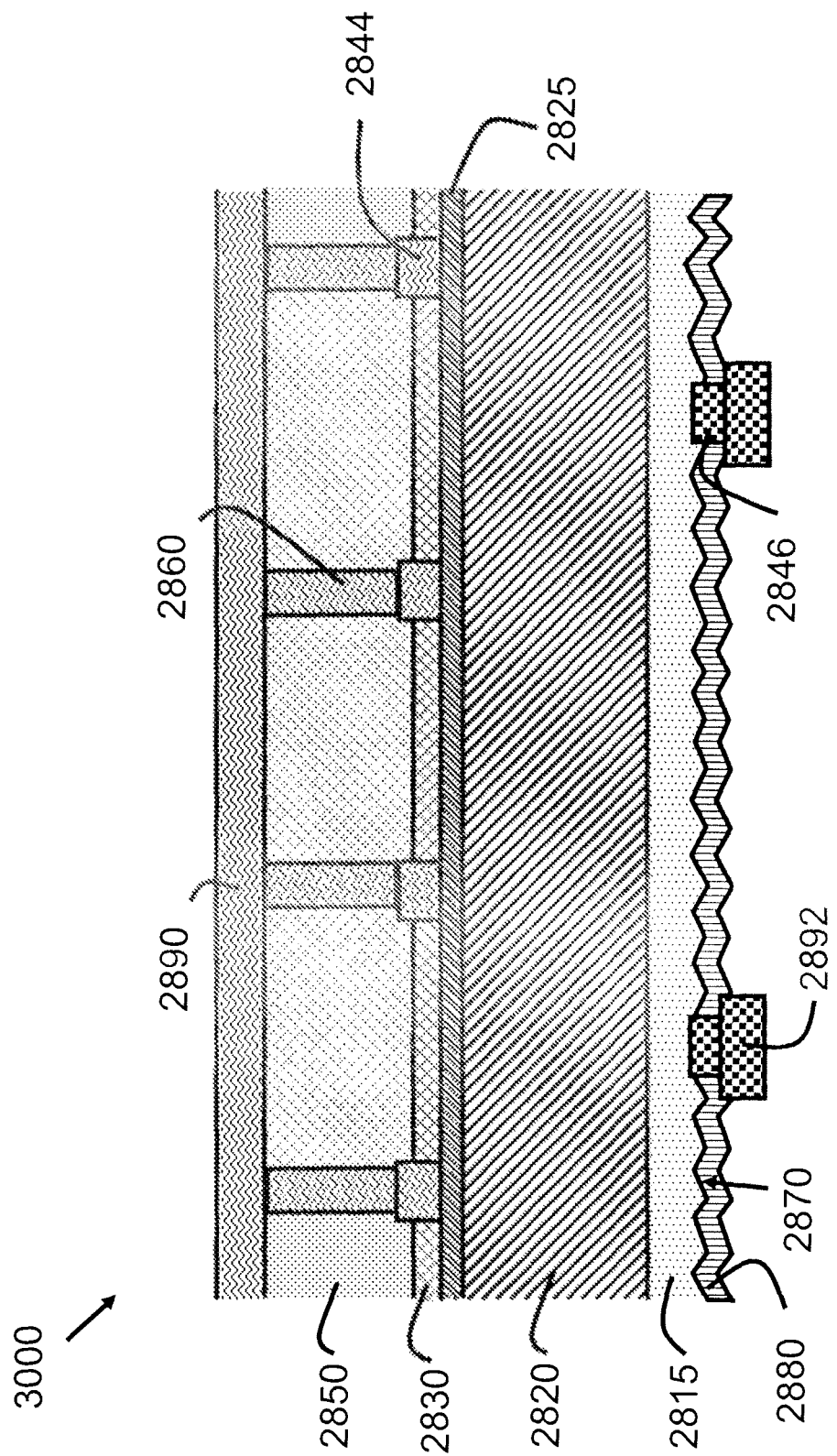
FIG. 30 is a cross-sectional representation of a solar cell with a handling layer and contacts on both sides.

FIG. 30 shows a two-sided contact solar cell with a handling layer according to some embodiments of the present invention. A process flow for the two-sided contact solar cell includes:
(1) form a porous silicon layer on the surface of the mother silicon wafer;
(2) thermally smooth the porous silicon layer in $H_2$ gas at approximately 1000° C.;
(3) deposit an epitaxial silicon absorber layer 2820, such as a p-doped layer, over the porous layer;
(4) deposit a highly doped epitaxial silicon layer 2825, such as a p+ layer, over the absorber layer;
(5) form a boundary layer 2830 on the silicon surface, for example by controlled oxidation to form a layer in the range of 30 to 100 nm thick—a similar thickness of silicon nitride ($SiN_x$) or alumina may also be used;
(6) form a handling layer 2850 with distributed openings to the surface of the epitaxial silicon—in this example the surface of the highly doped epitaxial silicon layer;
(7) separate the epitaxial silicon, with integrated handling layer, from the mother wafer, and send the mother wafer for forming more solar cells;
(8) front side processing, including the steps of;
   a. clean the front side surface;
   b. etch the surface to form a textured surface 2870;
   c. forming a phosphorus doped region 2815, which provides a semiconductor p-n junction;
   d. front side passivation (oxide or CVD nitride—the nitride also acts as an ARC 2880); and
(9) metallization steps include:
   a. screen print front side with Ag paste and dry;
   b. screen print back side with Ag—Al paste, including filling the contact holes in the handling layer and forming finger electrodes; and
   c. co-fire the front and back metallizations to form front side contacts 2846, backside contacts 2844, including contact holes filled with metal portions 2860, front side finger electrodes 2892 and backside finger electrodes 2890.

Note that openings in the boundary layer where it is exposed by the openings in the handling layer may be formed during the front side clean process. Although, if necessary a separate etch may be used for this purpose. The above process may be modified, as will be apparent to those skilled in the art, to form a solar cell with layers with reversed polarities.

Figure 31:
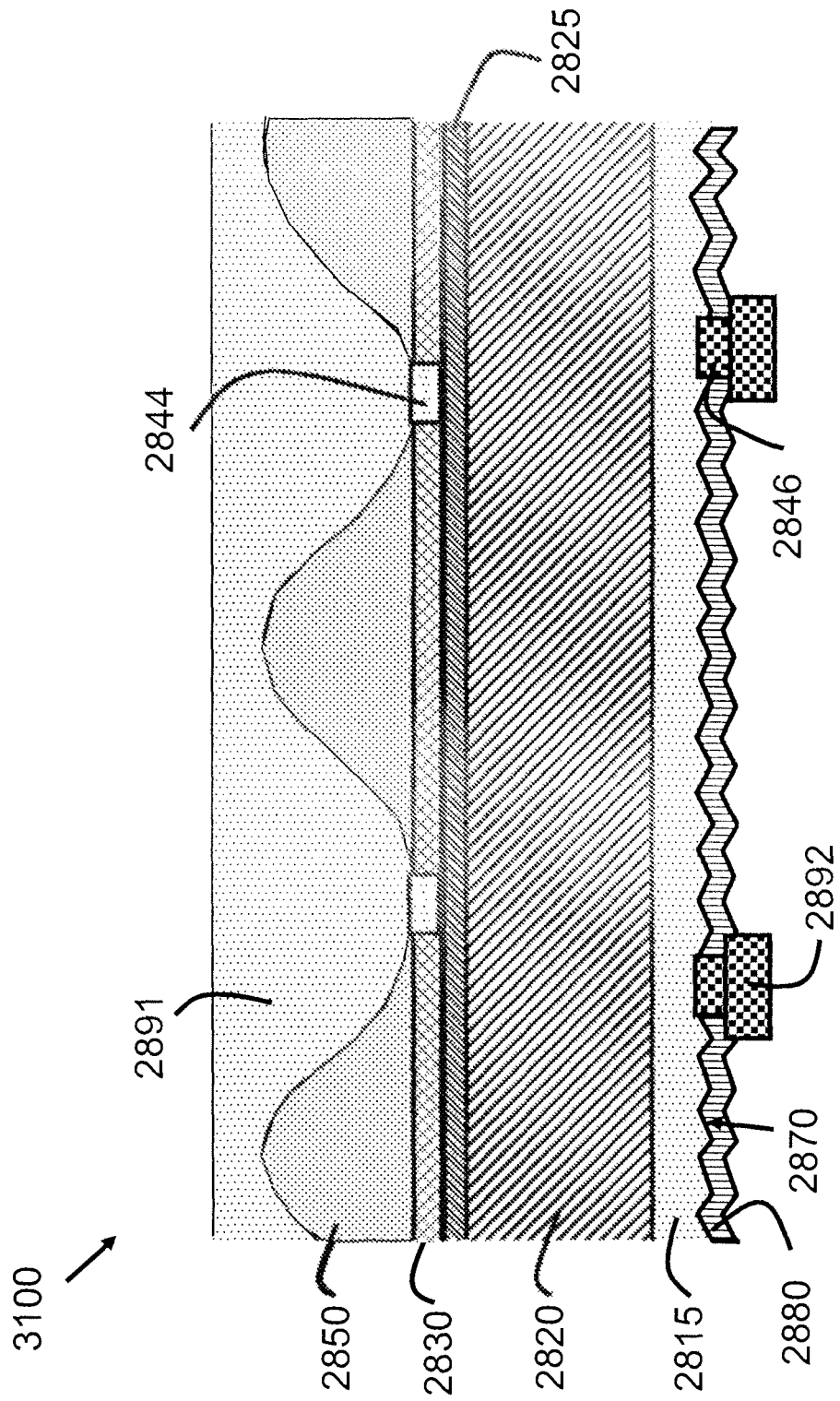
FIG. 31 is a cross-sectional representation of another embodiment of a solar cell with a handling layer and contacts on both sides.

FIG. 31 shows another embodiment of a two-sided contact solar cell with a handling layer. The process flow for the structure of FIG. 30 may be followed, except as noted as follows. The handling layer 2850 is a waffle-shaped handling layer, as described above. Furthermore, the backside metallization is a single step deposition of aluminum or aluminum alloy, forming backside contacts 2844 and a common backside electrode 2891.

Although the solar cells of FIG. 29-31 are described as having p-type absorber layers 2820, solar cells may alternatively be formed with n-type absorber layers.

Although the solar cells described herein are single crystal silicon solar cells, the teaching and principles of the present invention may be applicable to solar cells comprising polycrystalline, microcrystalline or amorphous silicon. For example, the absorber layer 2820 may alternatively be formed of microcrystalline or amorphous silicon. Furthermore, a polycrystalline mother wafer may be used to grow a solar cell with polycrystalline silicon epitaxial layers.

Although the solar cells described herein are silicon-based solar cells, the teaching and principles of the present invention are also applicable to solar cells comprising layers of gallium arsenide, indium gallium arsenide, gallium phosphide, gallium nitride, germanium, silicon germanium and/or silicon carbide. Furthermore, the teaching and principles of the present invention are also applicable to so-called tandem solar cells, such as epitaxially grown GaN on an epitaxial silicon layer.

Impurity gettering steps, as are well known to those skilled in the art, may also be incorporated into the process flows of the present invention to remove impurities from the epitaxial layers.

As described above, many of the glass/ceramic materials form opaque handling layers and thus are formed on the backside of the solar cell—the side away from the sun. The wavelength range of interest for silicon solar cells is 300 nm to 1400 nm. Some of the handling layer materials efficiently reflect light over this wavelength range. See, for example, Park et al., Journal of Ceramic Processing Research, Vol. 3, No. 3, pp 153-158 (2002), which reports that cordierite glass-ceramic material reflects nearly 90% of light in this range of interest. Consequently, handling layers may be used to reflect back into the solar cell most of the light which makes it through the solar cell without being absorbed. Thus handling layers may improve the light conversion efficiency of the thin film solar cells. This may provide a significant advantage for thin film silicon solar cells with glass-ceramic handling layers over cells backed by glass, since glass backed cells typical lose 50% of the incident light through the cell and glass.

Although the present invention has been particularly described with reference to certain embodiments thereof, it should be readily apparent to those of ordinary skill in the art that changes and modifications in the form and details may be made without departing from the spirit and scope of the invention.

What is claimed is:

1. A method of fabricating a solar cell comprising:
   forming a stack of thin continuous epitaxial solar cell layers on a silicon wafer;
   forming a handling layer on said stack, wherein said handling layer includes electrical contacts to said stack and wherein said handling layer has a waffle-shaped structure with an array of circular apertures;
   forming a common electrode over said handling layer connecting to back side electrical contacts of said solar cell, wherein said array of circular apertures coincide with said back side electrical contacts of said solar cell; and
   separating said stack from said silicon wafer, wherein said stack remains attached to said handling layer.

2. The method as in claim 1, wherein said stack has a thickness in the range of 1 to 100 microns.

3. The method as in claim 2, wherein said stack has a thickness in the range of 25 to 50 microns.

4. The method as in claim 1, wherein said stack comprises a p-type layer.

5. The method as in claim 1, wherein said stack comprises a n-type layer.

6. The method as in claim 1, wherein said silicon wafer includes a porous silicon surface layer and said separating includes applying a separating force to fracture said porous silicon layer.

7. The method as in claim 1, wherein said silicon wafer is selected from the group consisting of a polycrystalline silicon wafer and a single crystal silicon wafer.

8. The method as in claim 1, wherein said thin continuous epitaxial solar cell layers include a layer selected from the group consisting of a silicon-germanium layer, a silicon carbide layer, a gallium nitride layer and a silicon layer.

9. The method as in claim 1, wherein said handling layer comprises a material selected from the group consisting of glass, glass-bonded ceramic and glass-ceramic.

10. The method as in claim 9, wherein said handling layer comprises cordierite glass-ceramic.

11. The method as in claim 9, wherein said handling layer has a thickness in the range of 5 to 1000 microns.

12. The method as in claim 9, wherein said handling layer has a thickness in the range of 250 to 500 microns.

13. The method as in claim 1, wherein said handling layer has a coefficient of thermal expansion greater than or equal to the coefficient of thermal expansion of said stack over a temperature range from ambient temperatures to a maximum temperature, said maximum temperature being the highest temperature reached during said forming said handling layer.

14. The method as in claim 1, wherein said handling layer has a coefficient of thermal expansion in the range from 5% less than to 25% greater than the coefficient of thermal expansion of said stack over a temperature range from ambient temperatures to a maximum temperature, said maximum temperature being the highest temperature reached during said forming said handling layer.

15. The method as in claim 1, wherein said forming said handling layer includes:
depositing a powder; and
sintering said powder.

16. The method as in claim 15, wherein said powder comprises ceramic powder and glass powder.

17. The method as in claim 15, wherein said powder is a powder paste.

18. The method as in claim 15, wherein said depositing is nozzle dispensing.

19. The method as in claim 18, wherein said nozzle dispensing is dispensing from multiple nozzles simultaneously.

20. The method as in claim 15, wherein said powder is green tape.

21. The method as in claim 20, wherein said green tape has preformed openings.

22. The method as in claim 21, further comprising, before said sintering, filling said preformed openings with a metal paste.

23. The method as in claim 15, wherein said sintering is firing in a temperature controlled furnace.

24. The method as in claim 15, further comprising, after said sintering, forming vias in said handling layer.

25. The method as in claim 24, wherein said forming said vias includes laser drilling.

26. The method as in claim 24, further comprising, after forming said vias, filling said vias with electrically conductive material.

27. The method as in claim 1, further comprising, before said forming said handling layer on said stack, forming a boundary layer on said stack.

28. The method as in claim 27, wherein the interface between said handling layer and said boundary layer reflects visible light passing through said stack back into said stack.

29. The method as in claim 27, wherein said boundary layer is selected from the group consisting of a silicon oxide layer, a silicon nitride layer and an alumina layer.

30. The method as in claim 29, wherein said boundary layer has a thickness greater than 20 nanometers.

31. The method as in claim 29, wherein said boundary layer has a thickness in the range of 30 to 100 nanometers.

32. The method as in claim 1, further comprising, after said separating:
etching the surface of said stack opposite to said handling layer to form a textured surface; and
forming an antireflection coating over said textured surface.

33. The method as in claim 1, further comprising, before said forming said handling layer on said stack, forming electrical contacts on the surface of said stack.

34. The method as in claim 1, wherein said handling layer reflects back into said stack visible light passing through said stack towards said handling layer.

35. The method as in claim 1, wherein said handling layer has a waffle-shaped structure with a first set of parallel ridges and a second set of parallel ridges, said first set of parallel ridges being perpendicular to said second set of parallel ridges.

36. The method as in claim 35, wherein said handling layer is formed by a process including depositing a paste by nozzle dispensing to form said first set of parallel ridges on the surface of said stack, followed by depositing said second set of parallel ridges on the surface of said stack, said second set of parallel ridges being perpendicular to said first set of parallel ridges.

37. The method as in claim 35, wherein said silicon wafer is a single crystal silicon wafer and said stack of thin continuous epitaxial solar cell layers is a stack of single crystal solar cell layers.

38. The method as in claim 1, wherein said forming said common electrode includes depositing aluminum over said handling layer.

39. A method of fabricating a solar cell comprising:
forming a stack of thin continuous epitaxial solar cell layers on a silicon wafer, wherein said silicon wafer is a single crystal silicon wafer and said stack of thin continuous epitaxial solar cell layers is a stack of single crystal epitaxial silicon solar cell layers;
forming a handling layer on said stack, wherein said handling layer includes electrical contacts to said stack and said handling layer has a waffle-shaped structure with a first set of parallel ridges and a second set of parallel ridges, said first set of parallel ridges being perpendicular to said second set of parallel ridges, and wherein at least one of said first and second sets of parallel ridges are aligned at a small angle to a cleavage plane of said stack of single crystal epitaxial silicon solar cell layers; and
separating said stack from said silicon wafer, wherein said stack remains attached to said handling layer.

40. The method as in claim 39, wherein said cleavage plane is the 100 family of planes.

41. The method as in claim 39, wherein said small angle is in the range between 3 and 10 degrees.

42. The method as in claim 39, wherein said handling layer includes an array of roughly square apertures.

43. The method as in claim 42, wherein the square apertures are between 500 microns and 2 millimeters on a side.

44. The method as in claim 43, wherein the spacing of said square apertures in said array is greater than or equal to twice the width of said square apertures.

45. The method as in claim 39, wherein said silicon wafer includes a porous silicon surface layer and said separating includes applying a separating force to fracture said porous silicon layer.

46. The method as in claim 39, wherein said handling layer comprises a material selected from the group consisting of glass, glass-bonded ceramic and glass-ceramic.

47. The method as in claim 39, wherein said handling layer has a coefficient of thermal expansion in the range from 5% less than to 25% greater than the coefficient of thermal expansion of said stack over a temperature range from ambient temperatures to a maximum temperature, said maximum temperature being the highest temperature reached during said forming said handling layer.

48. The method as in claim 39, wherein said forming said handling layer includes nozzle dispensing a powder paste and sintering said powder paste.

49. The method as in claim 39, further comprising, before said forming said handling layer on said stack, forming a boundary layer on said stack.

50. The method as in claim 49, wherein said boundary layer is selected from the group consisting of a silicon oxide layer, a silicon nitride layer and an alumina layer.

51. A method of fabricating a solar cell comprising:
   forming a stack of thin continuous epitaxial solar cell layers on a silicon wafer;
   forming a handling layer on said stack, wherein said handling layer includes electrical contacts to said stack and wherein said handling layer has a waffle-shaped structure with an array of circular apertures;
   forming first parallel electrode fingers over said handling layer connecting to first electrical contacts for collector regions of said solar cell;
   forming second parallel electrode fingers over said handling layer connecting to second electrical contacts for emitter regions of said solar cell; and
   separating said stack from said silicon wafer, wherein said stack remains attached to said handling layer;
   wherein said first parallel electrode fingers and said second parallel electrode fingers are parallel to each other, and wherein a first portion of said array of circular apertures coincide with said first electrical contacts for collector regions of said solar cell, and a second portion of said array of circular apertures coincide with second electrical contacts for emitter regions of said solar cell.

52. The method as in claim 51, wherein said silicon wafer includes a porous silicon surface layer and said separating includes applying a separating force to fracture said porous silicon layer.

53. The method as in claim 51, wherein said handling layer comprises a material selected from the group consisting of glass, glass-bonded ceramic and glass-ceramic.

54. The method as in claim 51, wherein said handling layer has a coefficient of thermal expansion in the range from 5% less than to 25% greater than the coefficient of thermal expansion of said stack over a temperature range from ambient temperatures to a maximum temperature, said maximum temperature being the highest temperature reached during said forming said handling layer.

55. The method as in claim 51, wherein said forming said handling layer includes nozzle dispensing a powder paste and sintering said powder paste.

56. The method as in claim 51, further comprising, before said forming said handling layer on said stack, forming a boundary layer on said stack.

57. The method as in claim 56, wherein said boundary layer is selected from the group consisting of a silicon oxide layer, a silicon nitride layer and an alumina layer.

* * * * *